(12) United States Patent
Nagel et al.

(10) Patent No.: US 10,483,460 B2
(45) Date of Patent: Nov. 19, 2019

(54) METHOD OF MANUFACTURING A MAGNETORESISTIVE STACK/ STRUCTURE USING PLURALITY OF ENCAPSULATION LAYERS

(71) Applicant: Everspin Technologies, Inc., Chandler, AZ (US)

(72) Inventors: Kerry Joseph Nagel, Scottsdale, AZ (US); Wenchin Lin, Chandler, AZ (US); Sarin A. Deshpande, Chandler, AZ (US); Jijun Sun, Chandler, AZ (US); Sanjeev Aggarwal, Scottsdale, AZ (US); Chaitanya Mudivarthi, Sunnyvale, CA (US)

(73) Assignee: Everspin Technologies, Inc., Chandler, AZ (US)

( * ) Notice: Subject to any disclaimer, the term of this patent is extended or adjusted under 35 U.S.C. 154(b) by 165 days.

(21) Appl. No.: 15/337,123

(22) Filed: Oct. 28, 2016

(65) Prior Publication Data
US 2017/0125663 A1    May 4, 2017

Related U.S. Application Data

(60) Provisional application No. 62/249,196, filed on Oct. 31, 2015.

(51) Int. Cl.
*H01L 43/12*     (2006.01)
*G11C 11/16*    (2006.01)
*H01L 43/08*     (2006.01)

(52) U.S. Cl.
CPC ............ *H01L 43/12* (2013.01); *G11C 11/161* (2013.01); *H01L 43/08* (2013.01); *G11C 2211/5615* (2013.01)

(58) Field of Classification Search
CPC ....... H01L 43/02; H01L 27/228; H01L 43/12; H01L 43/08; H01L 43/10
See application file for complete search history.

(56) References Cited

U.S. PATENT DOCUMENTS

| 6,806,546 | B2 | 10/2004 | Liu et al. |
| 6,897,532 | B1 | 5/2005 | Schwarz et al. |
| 6,985,384 | B2 | 1/2006 | Costrini et al. |

(Continued)

*Primary Examiner* — Charles D Garber
*Assistant Examiner* — S M Sohel Imtiaz
(74) *Attorney, Agent, or Firm* — Bookoff McAndrews, PLLC

(57) ABSTRACT

A method of manufacturing a magnetoresistive stack/structure comprising etching through a second magnetic region to (i) provide sidewalls of the second magnetic region and (ii) expose a surface of a dielectric layer; depositing a first encapsulation layer on the sidewalls of the second magnetic region and over the dielectric layer; etching the first encapsulation layer which is disposed over the exposed surface of the dielectric layer. The method further includes (a) depositing a second encapsulation layer: (i) on the first encapsulation layer disposed on the sidewalls of the second magnetic region and (ii) over the exposed surface of the dielectric layer and (b) depositing a third encapsulation layer: (i) on the second encapsulation layer which is on the first encapsulation layer and the exposed surface of the dielectric layer. The method also includes etching the remaining layers of the stack/structure (via one or more etch processes).

20 Claims, 83 Drawing Sheets

(56) References Cited

U.S. PATENT DOCUMENTS

| | | | |
|---|---|---|---|
| 7,122,854 B2 | 10/2006 | Fukuzumi | |
| 7,936,027 B2 | 5/2011 | Xiao et al. | |
| 8,236,578 B2 | 8/2012 | Mather et al. | |
| 8,685,756 B2 | 4/2014 | Aggarwal et al. | |
| 8,686,484 B2 | 4/2014 | Whig et al. | |
| 8,709,956 B2 | 4/2014 | Satoh et al. | |
| 8,747,680 B1 * | 6/2014 | Deshpande | G11B 5/84 216/22 |
| 9,093,640 B2 | 7/2015 | Aggarwal et al. | |
| 9,269,894 B2 | 2/2016 | Mudivarthi et al. | |
| 9,590,171 B2 * | 3/2017 | Lee | H01L 43/02 |
| 2001/0040778 A1 * | 11/2001 | Abraham | B82Y 10/00 360/324.2 |
| 2004/0063223 A1 * | 4/2004 | Costrini | H01L 43/12 438/3 |
| 2004/0150922 A1 | 8/2004 | Kagami et al. | |
| 2008/0023740 A1 * | 1/2008 | Horng | B82Y 25/00 257/295 |
| 2008/0265347 A1 | 10/2008 | Iwayama et al. | |
| 2010/0053823 A1 | 3/2010 | Iwayama et al. | |
| 2010/0140726 A1 * | 6/2010 | Apalkov | B82Y 25/00 257/421 |
| 2010/0311243 A1 | 12/2010 | Mao | |
| 2011/0233697 A1 * | 9/2011 | Kajiyama | H01L 27/228 257/421 |
| 2011/0235217 A1 | 9/2011 | Chen et al. | |
| 2014/0021426 A1 * | 1/2014 | Lee | H01L 43/02 257/1 |
| 2014/0084398 A1 * | 3/2014 | Oguz | H01L 43/12 257/421 |
| 2014/0220707 A1 * | 8/2014 | Aggarwal | H01L 43/12 438/3 |
| 2014/0227801 A1 | 8/2014 | Hsu et al. | |
| 2014/0315329 A1 * | 10/2014 | Deshpande | G11B 5/84 438/3 |
| 2016/0027999 A1 * | 1/2016 | Pinarbasi | H01L 43/02 438/3 |
| 2016/0190432 A1 * | 6/2016 | Shum | H01L 43/02 257/427 |
| 2016/0225981 A1 | 8/2016 | Deshpande et al. | |

* cited by examiner

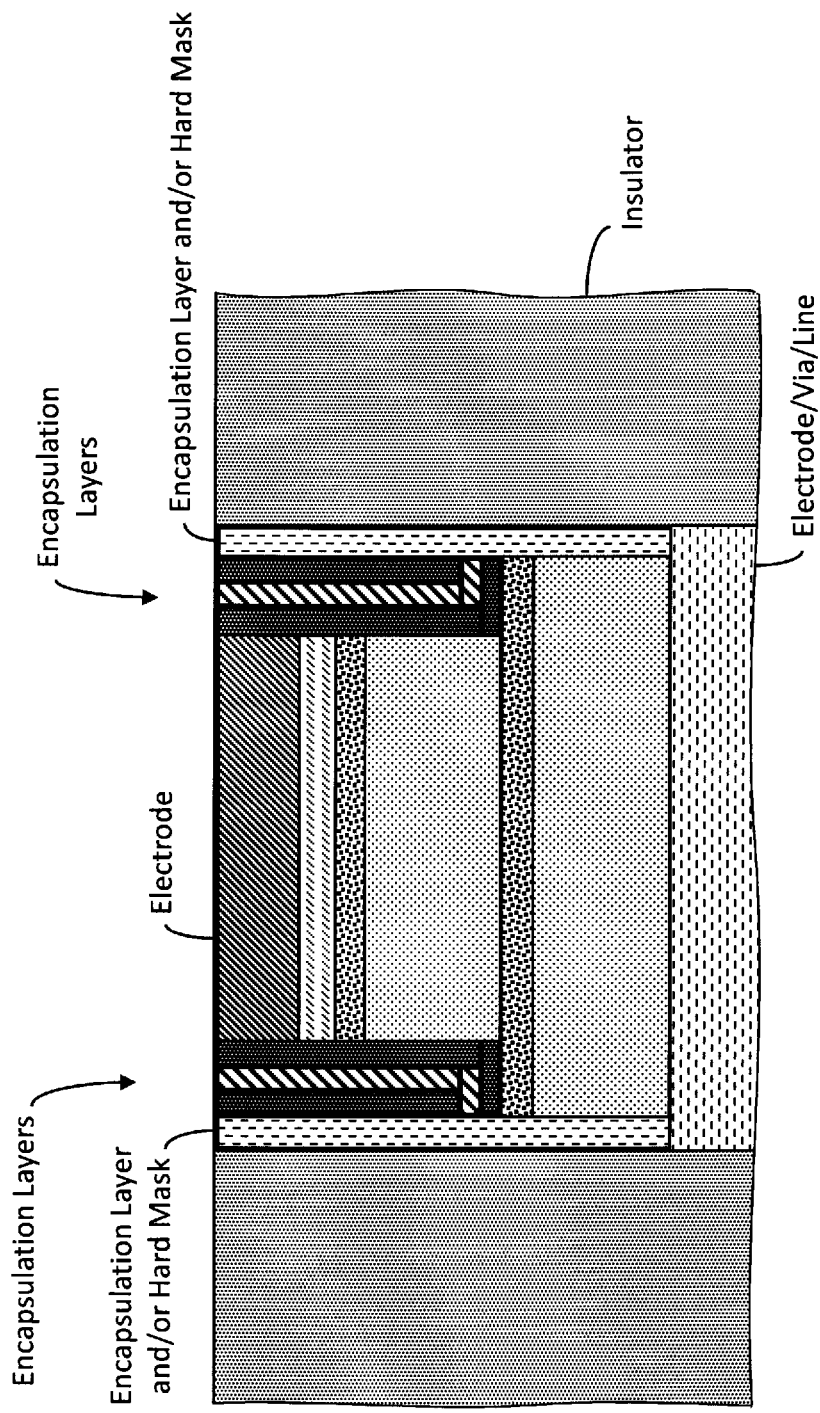

METHOD OF MANUFACTURING A MAGNETORESISTIVE STACK/ STRUCTURE USING PLURALITY OF ENCAPSULATION LAYERS

RELATED APPLICATIONS

This non-provisional application claims priority to U.S. Provisional App. No. 62/249,196, entitled "Magnetoresistive Device and Method of Manufacturing Same", filed Oct. 31, 2015; such provisional application is incorporated herein by reference in its entirety.

INTRODUCTION

There are many inventions described and illustrated herein, as well as many aspects and embodiments of those inventions. In one aspect, the present inventions relate to a magnetoresistive device (for example, a magnetoresistive sensor/transducer device or a magnetoresistive memory device) and a method of manufacturing such device wherein a plurality of encapsulation layers protect one or more magnetic tunnel junctions (MTJs) of a MTJ stack/structure against undesirable contamination and/or unwanted/excessive oxidation of one or more MTJs of the stack/structure. In this way, such layers and methods of manufacture may also improve the reliability and/or thermal endurance of the MTJ stack/structure by reducing unwanted/excessive contamination (for example, contamination of the MTJ). In one embodiment, for example, after partially forming an MTJ stack/structure, the methods of manufacturing deposit a plurality of encapsulation layers (i.e., two, three or more layers) on the partially formed stack/structure and thereafter etch additional layers, including a dielectric layer, to further form the MTJ stack/structure. In one embodiment, the method includes successively depositing three or more encapsulation layers prior to, for example, etching a dielectric layer to form a magnetic tunnel barrier or MTJ of the MTJ stack/structure.

The plurality of encapsulation layers of the encapsulation structure may include conductor materials (for example, metals or metal alloys), semi-conductor materials and/or insulator materials. In one embodiment, the encapsulation layers may be deposited as a conductor (for example, a metal) and thereafter at least partially transformed to an insulator (for example, via oxidation or nitridation). The conductivity (or lack thereof) of each of the plurality of encapsulation layers of the encapsulation structure may vary between encapsulation layers as well as within each layer. For example, the material of the first encapsulation layer may be less insulative than the material of the second encapsulation layer (i.e., the electrical conductivity of the material of the second encapsulation layer may be less than the electrical conductivity of the material of the first encapsulation layer (or portions thereof)); and the material of the second encapsulation layer may be more insulative than the material of the third encapsulation layer (which may be an insulator or a conductor).

For example, in one embodiment, the amount of oxidation/nitridation or the oxidation/nitridation dose of the plurality of encapsulation layers may vary between encapsulation layers and/or within each layer. For example, a first encapsulation layer (for example, a conductor) may be deposited and thereafter lightly or not oxidized/nitridized, a second encapsulation layer may then be deposited and thereafter more heavily oxidized/nitridized (relative to the oxidation/nitridation dose of the first encapsulation layer), and a third encapsulation layer may be deposited and either oxidized (for example, the same or more heavily oxidized/nitridized than the first encapsulation layer; that is, the oxidation/nitridation dose of the second encapsulation layer is the same or greater than the oxidation/nitridation dose of the first encapsulation layer, but a lower dose (or the same as) the oxidization/nitridation dose of the second encapsulation layer) or not oxidized/nitridized. The oxidation or nitridation of the encapsulation layer(s) may be, for example, via (i) a process of exposing the encapsulation layer to an oxygen or nitrogen atmosphere, or (ii) diffusion of oxygen or nitrogen from a preceding or subsequent layer or material in contact therewith.

The present inventions may employ any technique now known or later developed to oxidize or nitridize one or more encapsulation layers including, for example, a natural oxidation/nitridation, natural oxidation/nitridation with gas flow and/or plasma oxidation/nitridation may be employed. For example, the oxidization or nitridation of an encapsulation layer may employ at least one of natural oxidation/nitridation, exposure to oxygen or nitrogen radicals, and/or an argon and oxygen or nitrogen plasma. The oxidation/nitridation dose, in one embodiment, is controlled by the combination of the time of exposure to and the pressure of oxygen or nitrogen gas.

Notably, the at least three layer encapsulation structure may be employed to protect one or more MTJs of a MTJ stack/structure against undesirable contamination and/or unwanted/excessive oxidation of one or more MTJs of the stack/structure, for example, during subsequent processing/manufacturing of the magnetoresistive device and/or thereafter during operation of the magnetoresistive device. In this way, the reliability and/or thermal endurance of the MTJ stack/structure may be improved by reducing or preventing unwanted contamination and/or unwanted/excessive oxidation of one or more MTJs of the stack/structure.

Indeed, in one embodiment, the methods of manufacture deposit a first encapsulation layer (for example, electrically conductive material such as a metal) on a partially formed MTJ stack/structure and thereafter physical etching (for example, sputter etching, ion etching or milling, and/or ion-beam etching or milling) to remove re-deposited material (for example, ferromagnetic material) and the first encapsulation layer in a field region (adjacent to the partially formed MTJ stack/structure) and/or on the partially formed stack/structure. Notably, the re-deposited material may be material that resides and/or re-deposits in the field region and/or on the partially formed stack/structure (for example, on the mask) as a result of or resulting from processing of the partially formed stack/structure. Briefly, by way of background, manufacturing magnetoresistive devices, including MTJ-based magnetoresistive devices, includes a sequence of processing steps during which many layers of materials are deposited and then patterned to form a MTJ stack/structure and the electrodes used to provide electrical connections to the MTJ stack/structure. The stack includes various ferromagnetic layers that form the free and fixed portions of the magnetoresistive device as well as one or more non-ferromagnetic layers (for example, one or more dielectric layers that provide at least one tunnel junction for the MTJ stack/structure) disposed between such ferromagnetic layers. In many instances, the layers of material are quite thin, on the order of a few or tens of Angstrom.

After removal of the re-deposited material (for example, ferromagnetic material) and the first encapsulation layer in a field region (adjacent to the partially formed MTJ stack/structure) and on portions of the partially formed stack/ structure, a second encapsulation layer may be deposited on or over the partially formed stack/structure including on or over the first encapsulation layer which resides on the sidewalls of the partially formed stack/structure. Such second encapsulation layer may be a conductive material (for example, a metal) or an insulator material (for example, an oxide and/or nitride). Where the material of the second encapsulation layer is conductive, such material may thereafter be at least partially changed or transformed to an insulator material (for example, via oxidation or nitridation). In the process of depositing and/or forming the second encapsulation layer (or subsequent thereto), the material of the first encapsulation layer is at least partially transformed to an insulator material (for example, via diffusion of oxygen or nitrogen into the material of the first encapsulation layer during annealing).

Notably, the process may include deposition or formation of additional encapsulation layers (which may precede or follow the deposition or formation of second encapsulation layer). Regardless, in one embodiment, after deposition or formation of the second encapsulation layer, the partially formed MTJ stack/structure may be further or fully formed via etching of the remaining layers of the stack/structure. The process may also include deposition or formation of still further encapsulation layers after etching one or more layers of the partially formed MTJ stack/structure to protect one or more regions of the MTJ stack/structure (for example, an MTJ, the free magnetic region and/or the fixed magnetic region) during further processing, against undesirable contamination during subsequent manufacturing which may, as a result, improve the reliability and/or thermal endurance of the MTJ stack/structure.

The methods of the present inventions may employ one or more etch processes and/or recipes (which may be, for example, different etch recipes and/or etch mechanisms) to remove encapsulation materials, stack/structure materials and the re-deposited material (which may be or include the aforementioned physical etch to remove the re-deposited material).

As intimated above, the present inventions are also directed to a magnetoresistive device—for example, a magnetoresistive sensor/transducer or a magnetoresistive memory device having one or more MTJ stacks/structures (for example, a plurality of MTJ stacks/structures of a MTJ-based sensor/transducer and/or MTJ-based memory devices that are configured in an array layout) wherein MTJ-based magnetoresistive sensor/transducer or magnetoresistive memory device includes one or more MTJ stacks/structures manufactured (in whole or in part) using any of the manufacturing techniques described and/or illustrated herein.

A magnetoresistive memory device (for example, an MRAM) may include an array of MTJ stacks/structures. In those embodiments where the MTJ stacks/structures are magnetoresistive memory elements, each stack/structure of the memory element includes multiple magnetic layers (which may be arranged in regions such as a free magnetic region and a fixed magnetic region) separated by various non-magnetic and/or insulator layers (such as an MTJ), and exhibits an electrical resistance that depends on the magnetic state of the device. In one embodiment, information is stored in the MTJ stack/structure based on a direction of magnetization vectors of the layers of the free magnetic region. Magnetization vectors in the fixed magnetic region are magnetically fixed or pinned, while the magnetization direction in the free magnetic region may be free to switch between the same and opposite directions (that may be called "parallel" and "antiparallel" states, respectively). Corresponding to the parallel and antiparallel magnetic states, the magnetoresistive memory element has low and high electrical resistance states, respectively. Accordingly, a detection of the resistance allows a memory element, such as an MTJ stack/structure, to provide information stored in the magnetic memory element.

Notably, although certain exemplary embodiments are described and/or illustrated herein in the context of MTJ stacks/structures, the present inventions may be implemented in giant magnetoresistive (GMR) stacks/structures where a conductor is disposed between two ferromagnetic materials. For the sake of brevity the discussions and illustrations will not be repeated specifically in the context of GMR stacks/structures of GMR-based magnetoresistive devices—but such discussions and illustrations are to be interpreted as being entirely applicable to GMR stacks/structures.

BRIEF DESCRIPTION OF THE DRAWINGS

The present inventions may be implemented in connection with embodiments illustrated in the attached drawings. These drawings show different aspects of the present inventions and, where appropriate, reference numerals illustrating like structures, components, materials and/or elements in different figures are labeled similarly. It is understood that various combinations of the structures, components, and/or elements, other than those specifically shown, are contemplated and are within the scope of the present inventions.

Moreover, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein. Notably, an embodiment or implementation described herein as "exemplary" is not to be construed as preferred or advantageous, for example, over other embodiments or implementations; rather, it is intended reflect or indicate the embodiment(s) is/are "example" embodiment(s).

FIGS. 4A and 4B illustrate cross-sectional views of a MTJ stack/structure at selected stages of exemplary manufacturing to expose the top electrode to facilitate electrical contact to the MTJ stack/structure in accordance with the embodiment of the FIG. 3B wherein an insulating material (for example, a silicon oxide (such as $SiO_2$), a silicon nitride (such as $Si_3N_4$) and/or TEOS) is deposited and thereafter portions removed (via polishing such as CMP), together with the mask employed to form a first portion of the MTJ stack/structure (see, FIG. 2D); notably, in one embodiment, the mask is not removed and forms a portion of an electrode of the MTJ stack/structure;

Figure 11A:
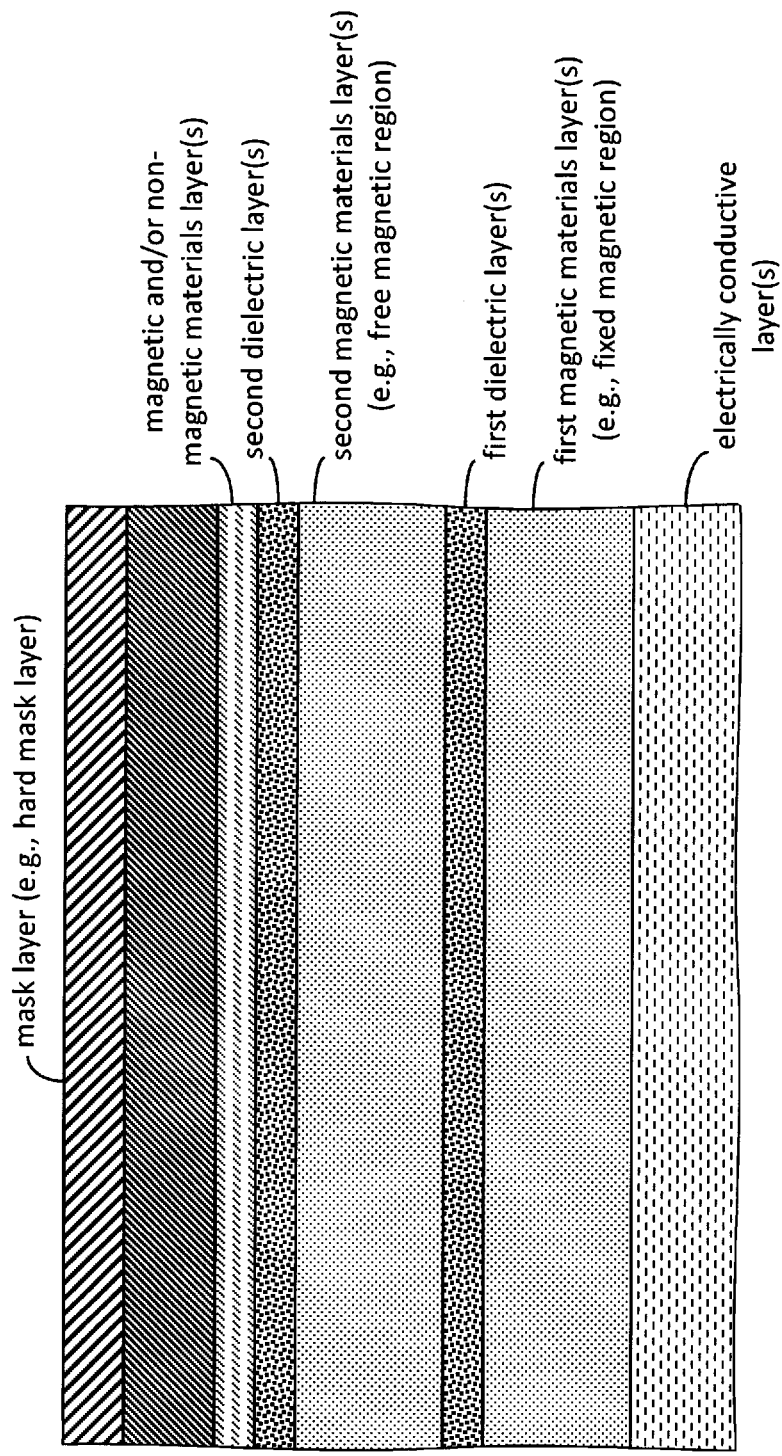
Figure 11B:
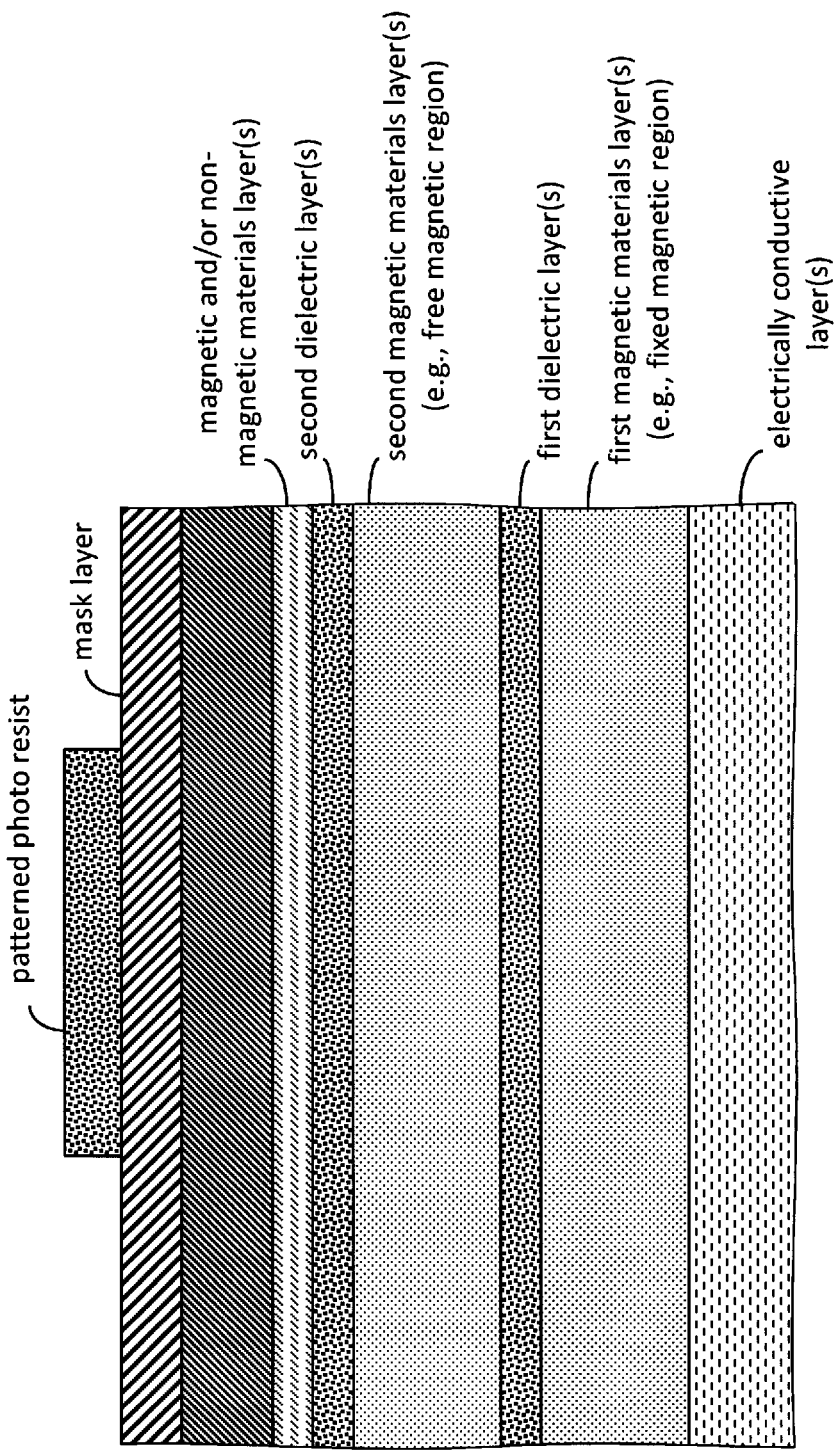
Figure 11C:
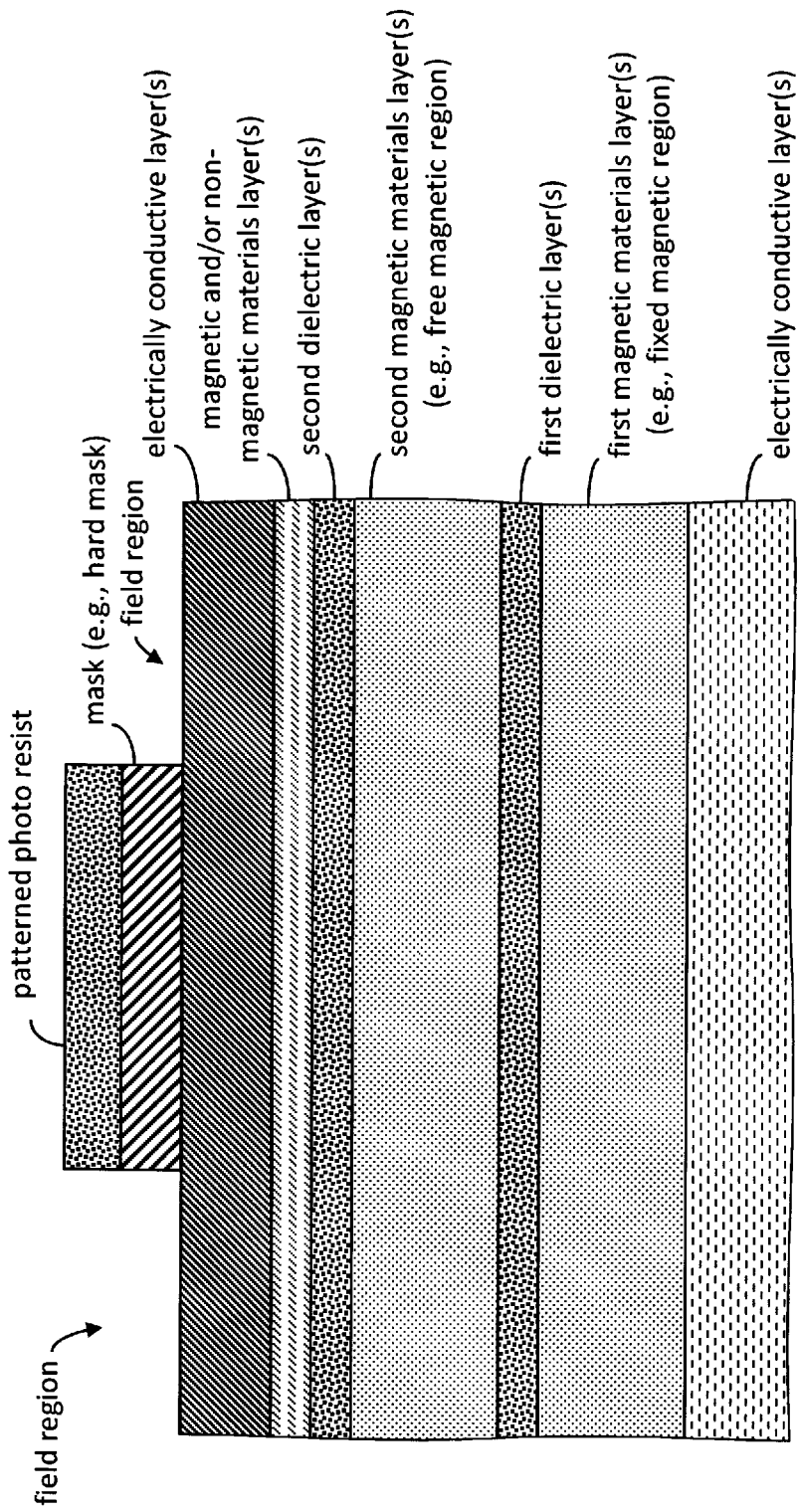
Figure 11D:
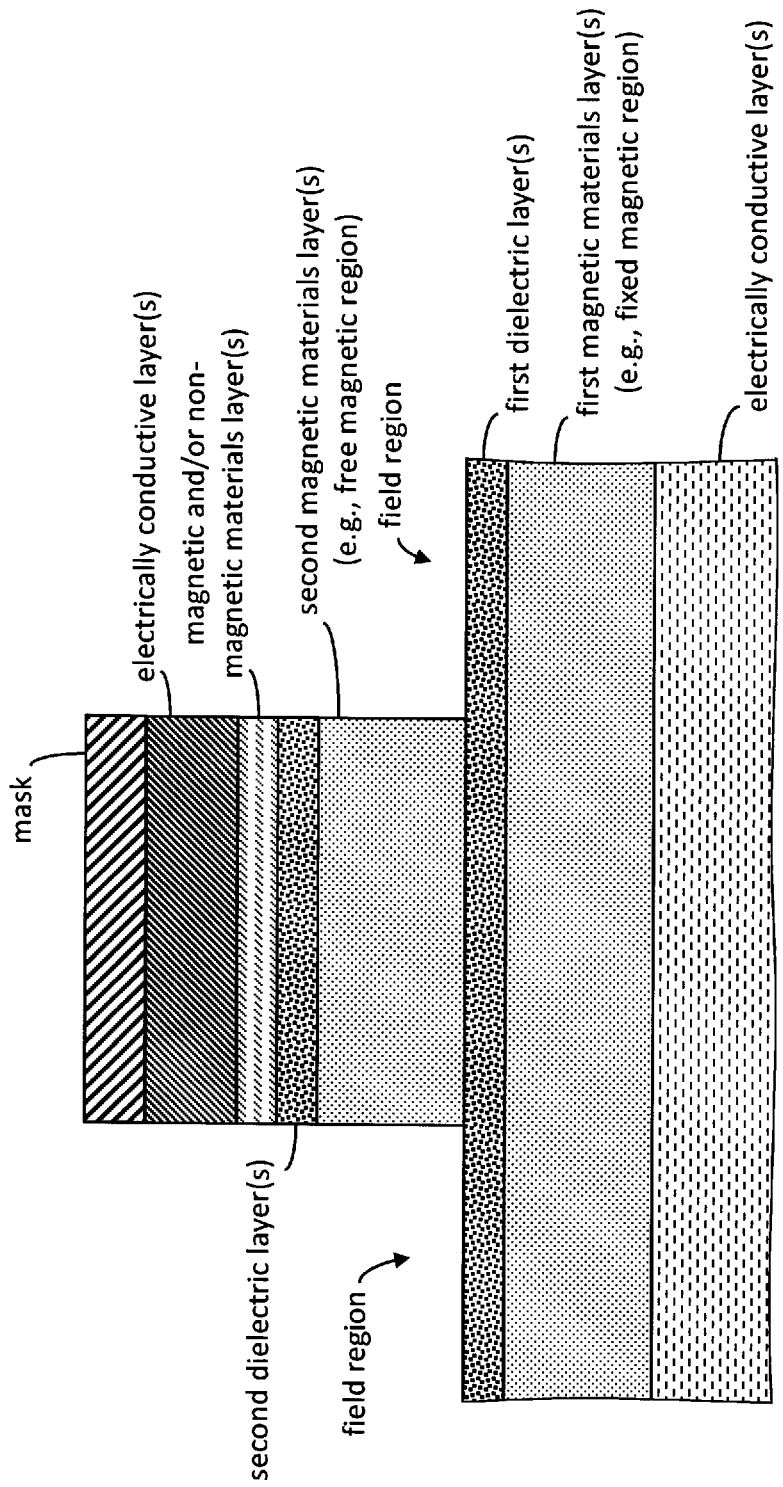
Figure 11E:
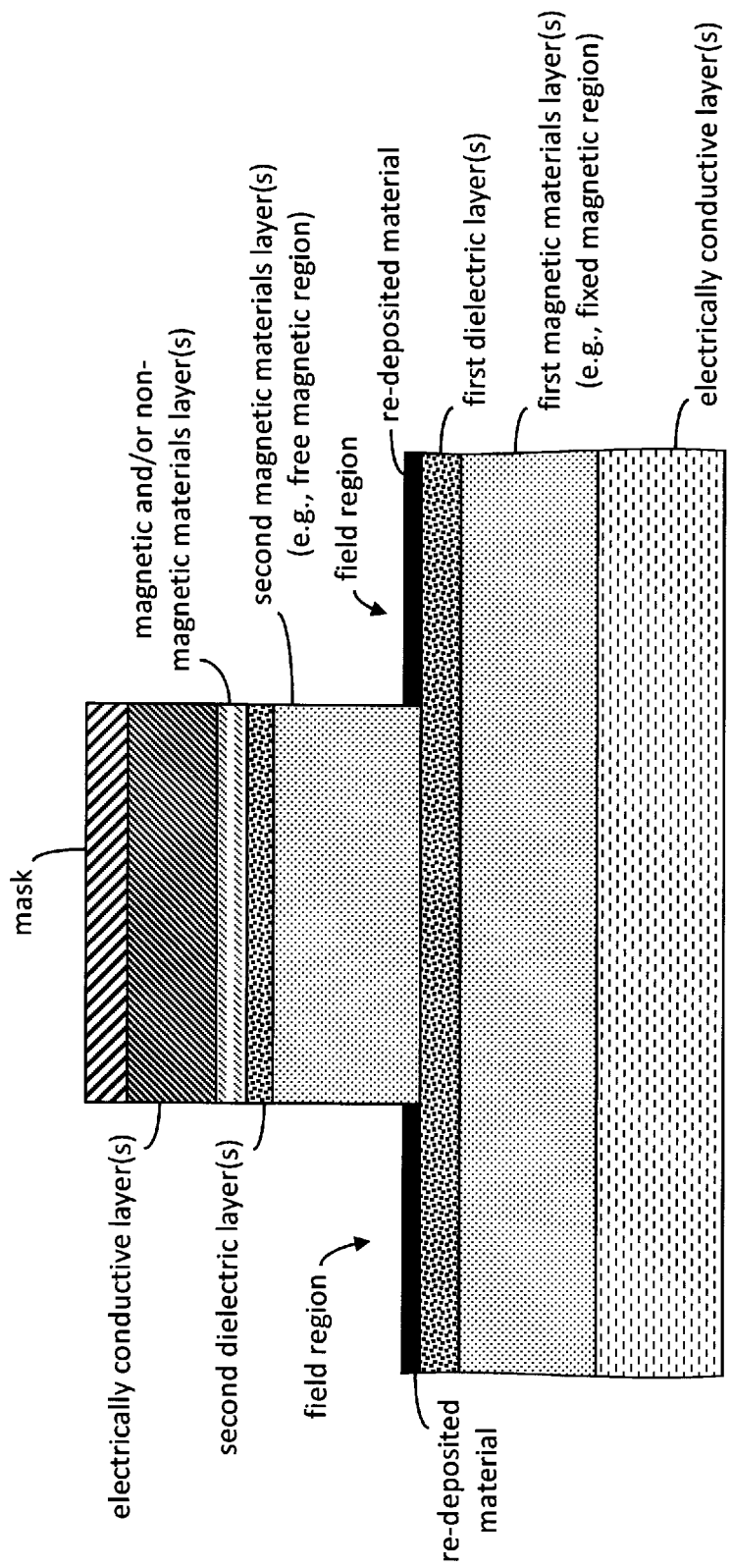
Figure 11F:
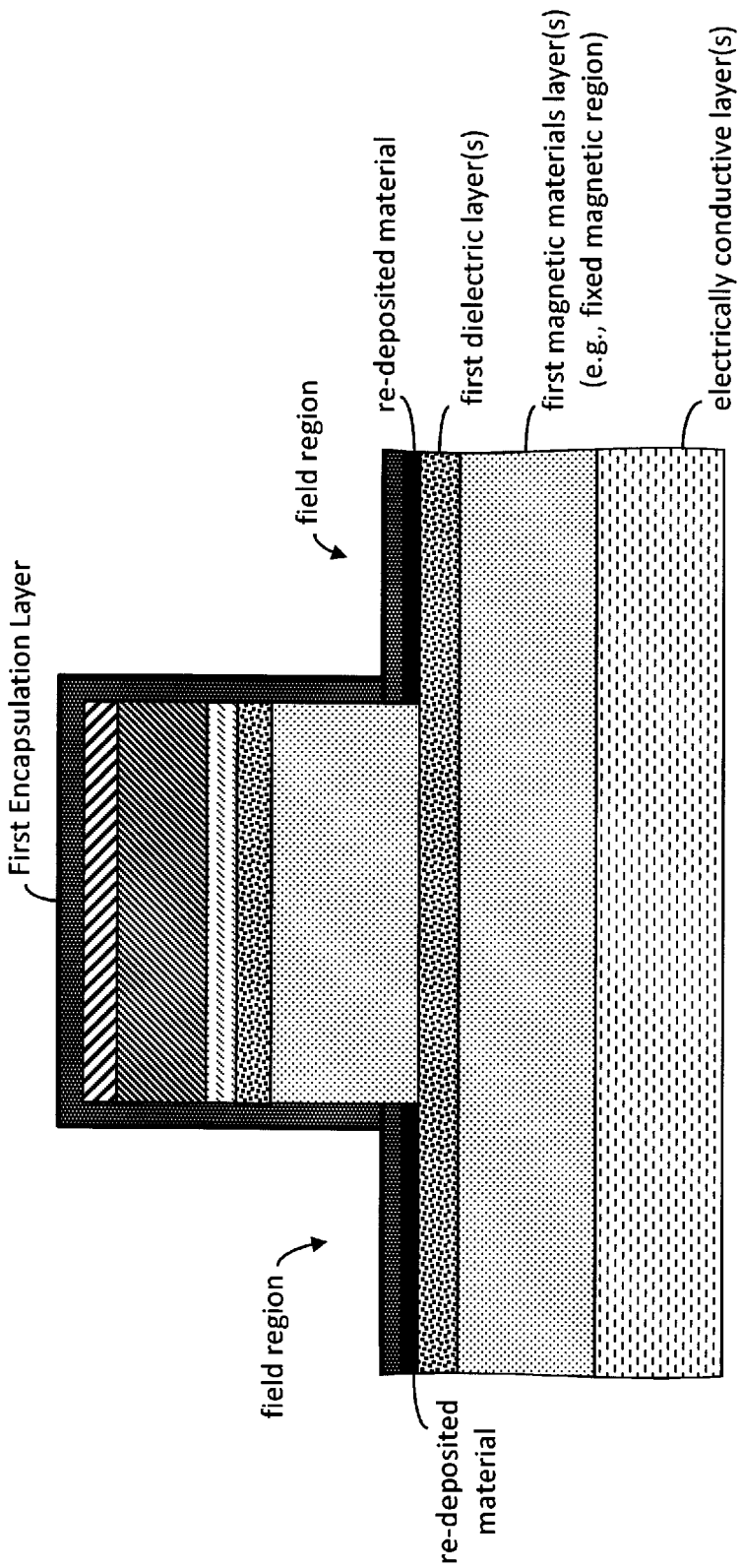
Figure 11G:
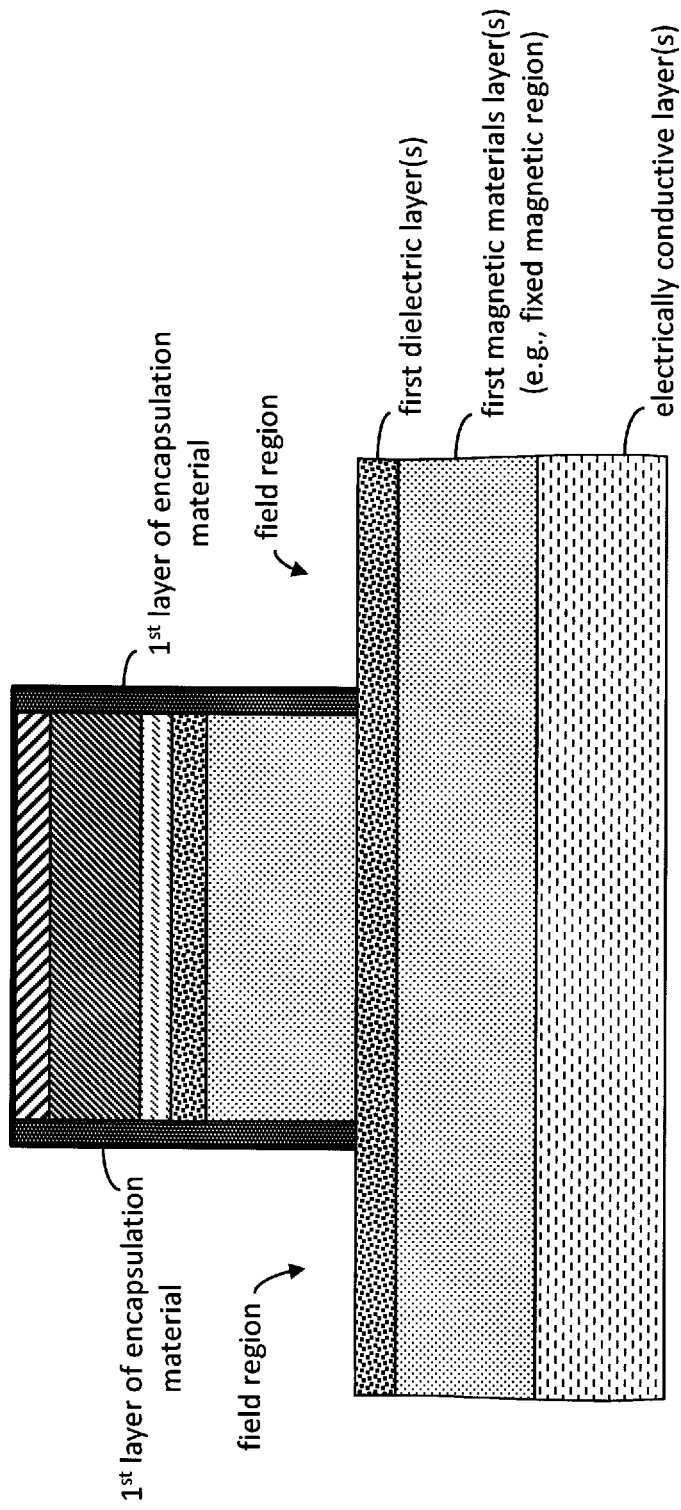
Figure 11H:
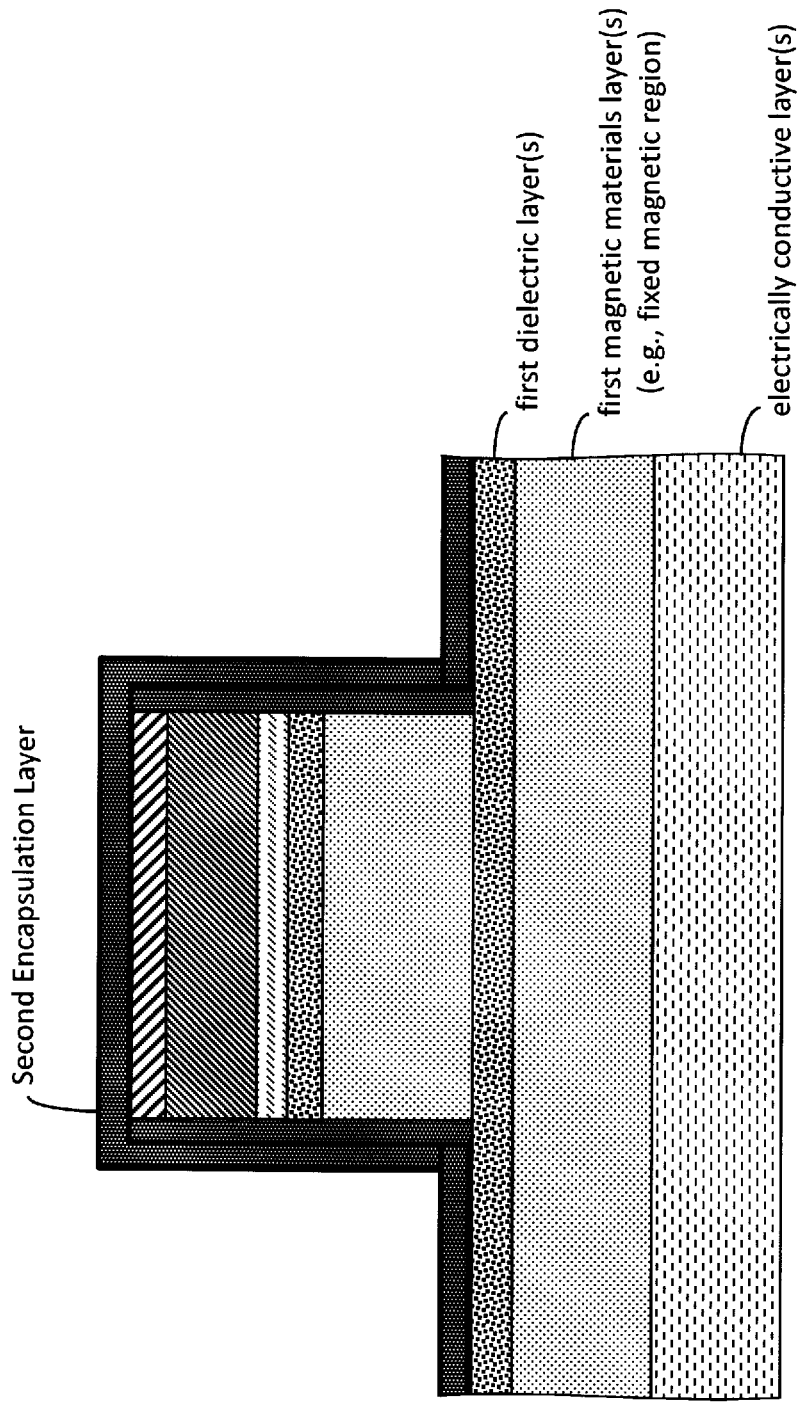
Figure 11I:
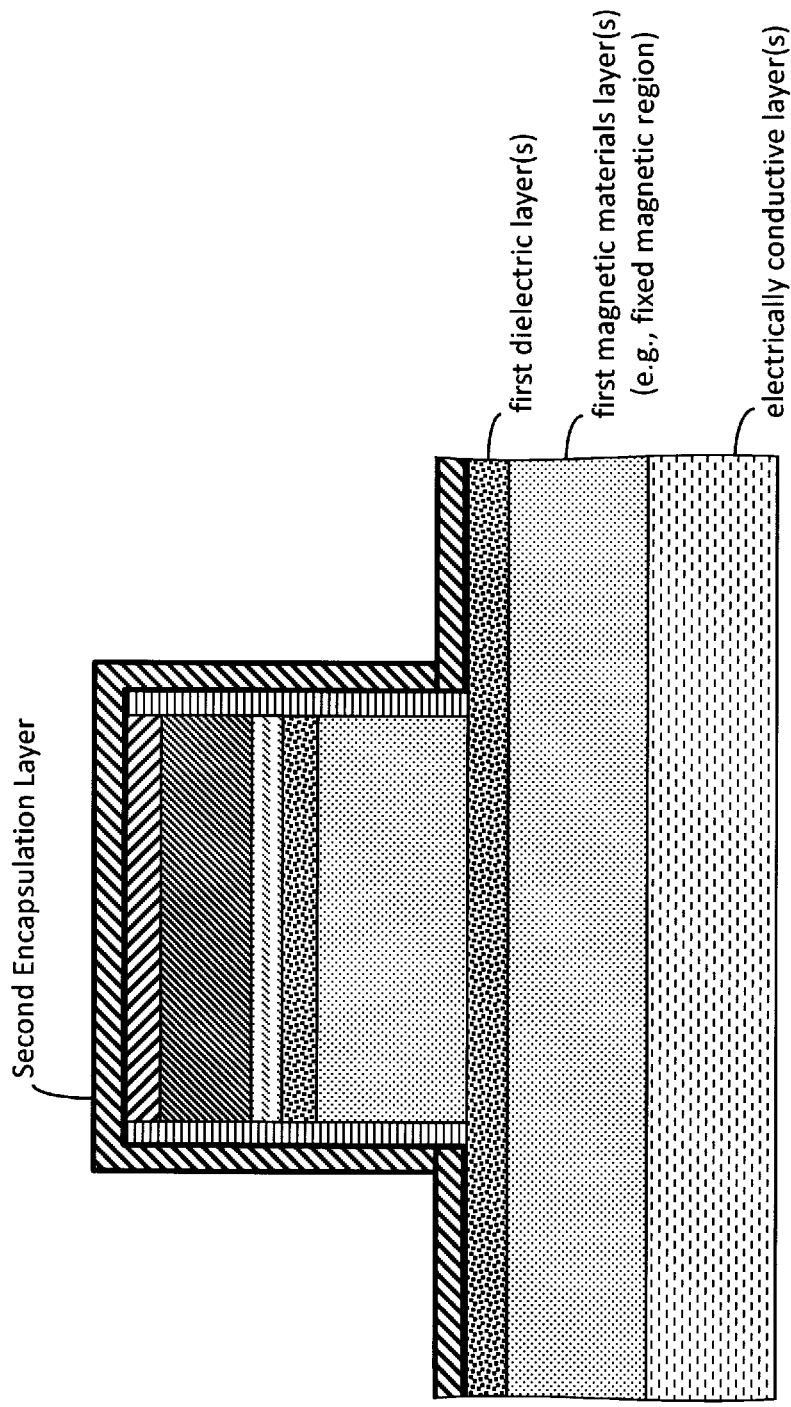
Figure 11J:
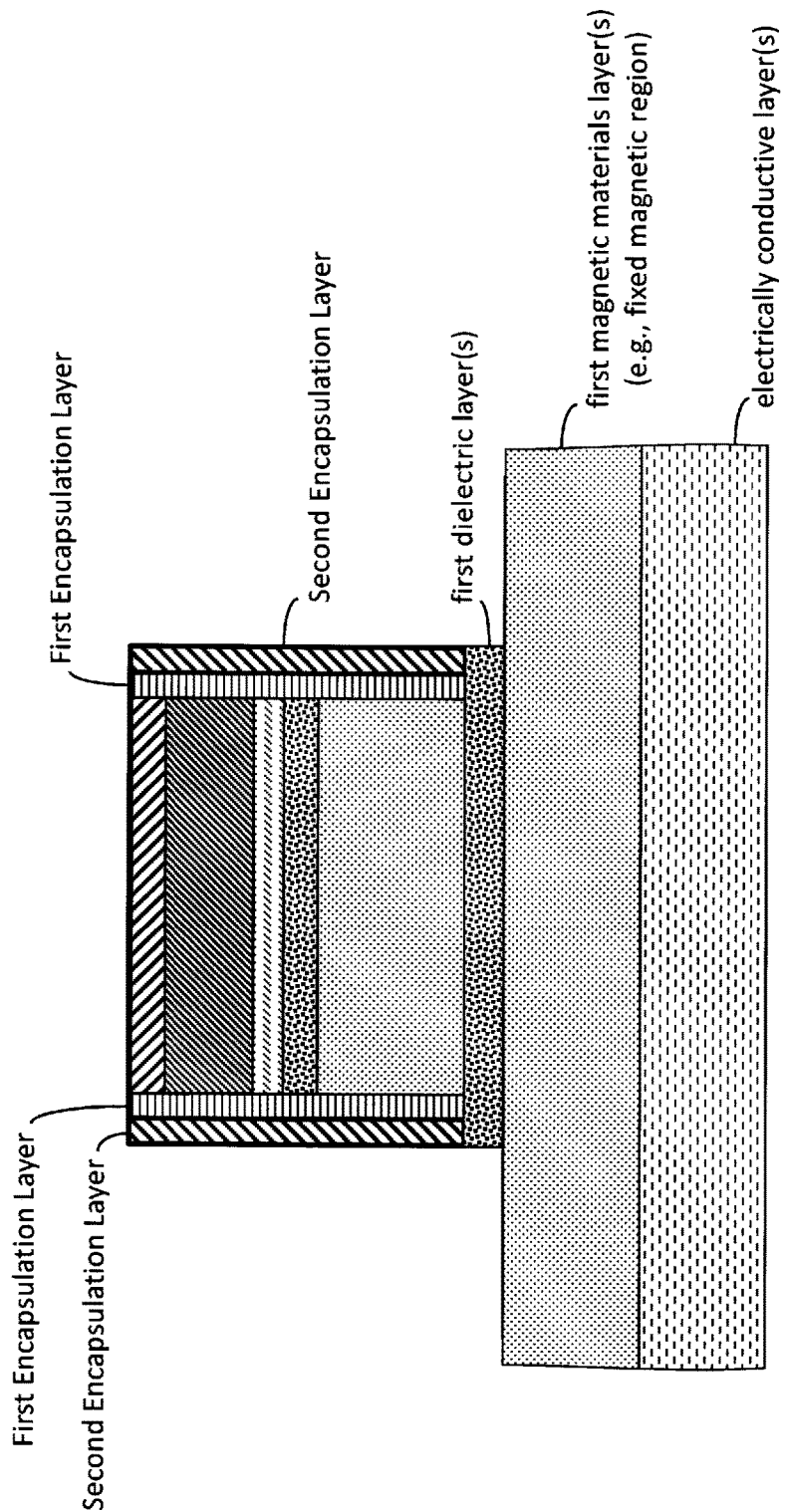
Figures 12A, 12B:
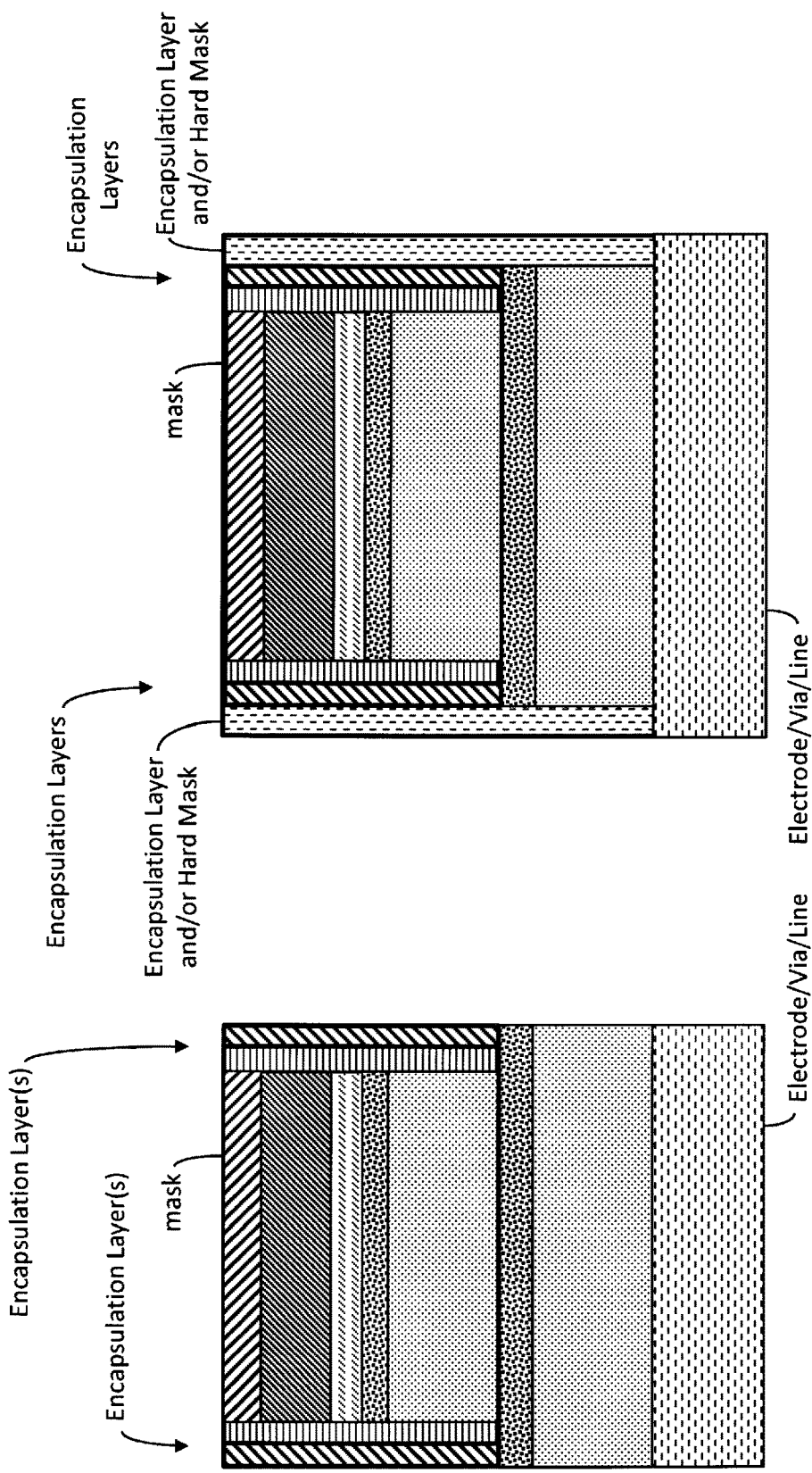
Figures 12C, 12D:
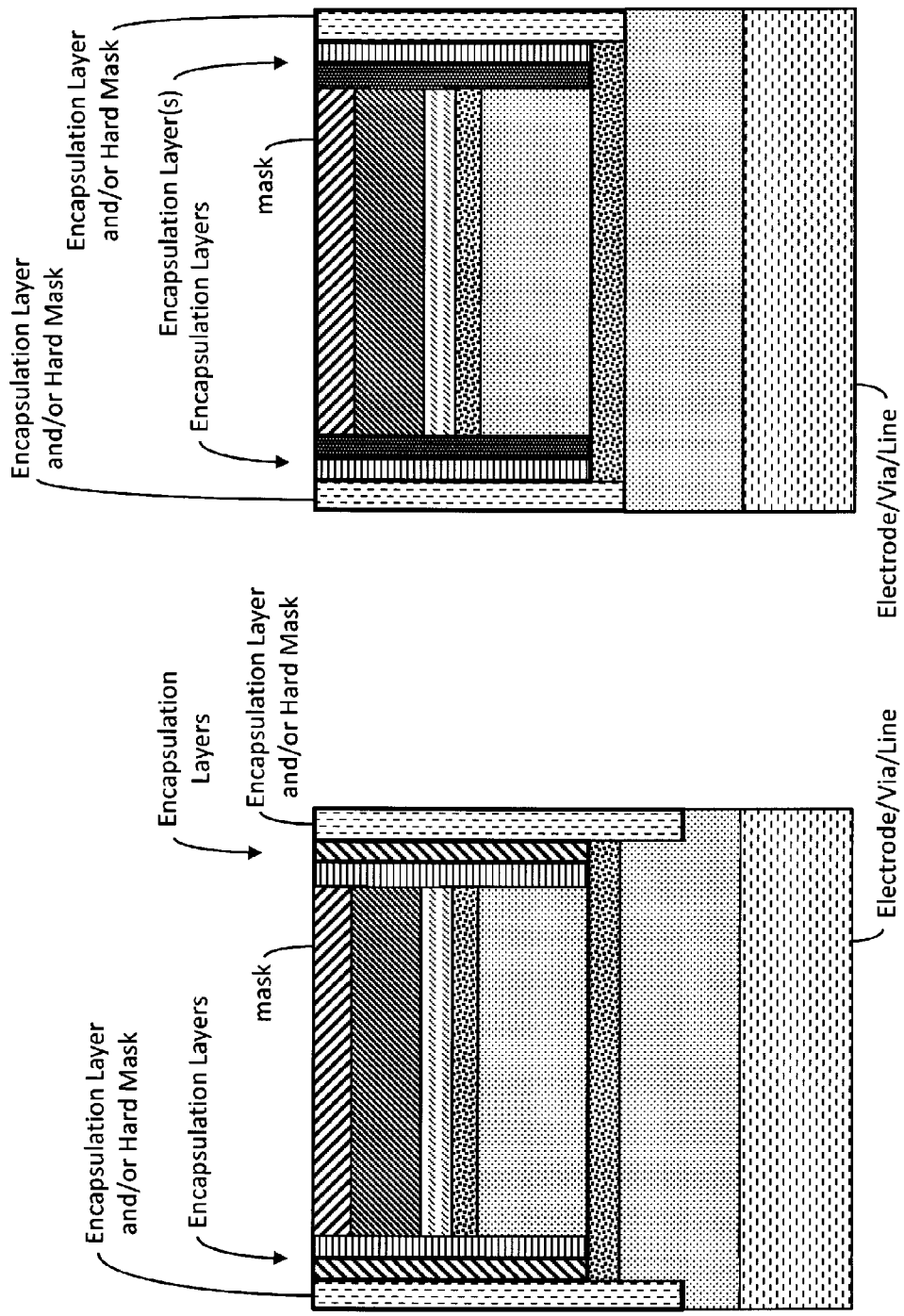
Figure 12F:
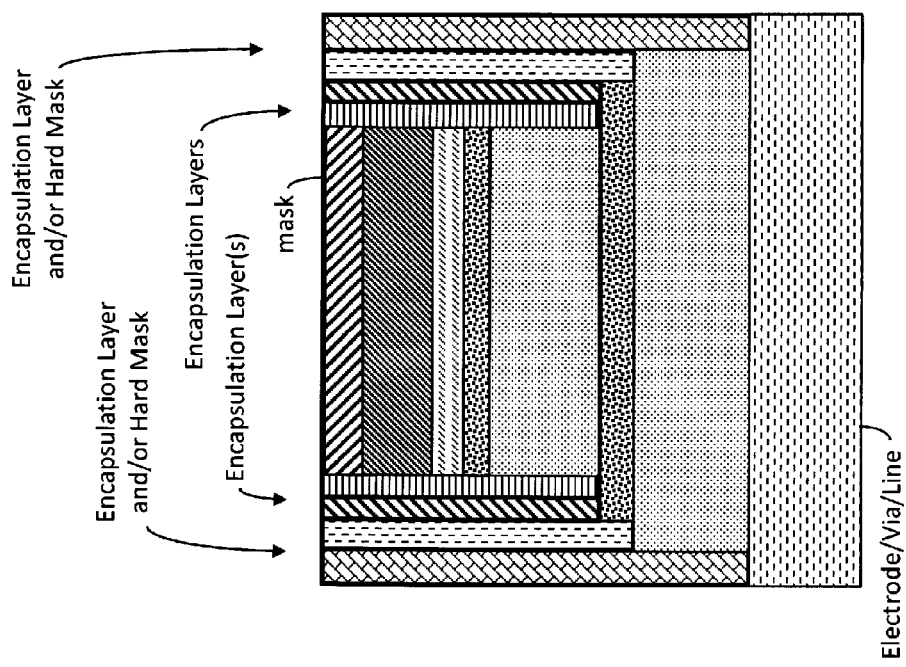
Figure 12E:
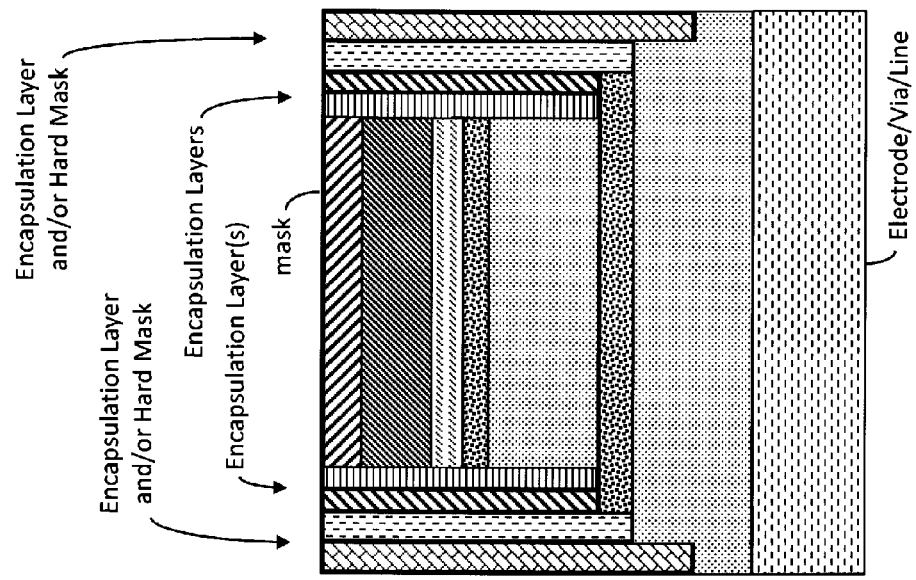
Figure 13A:
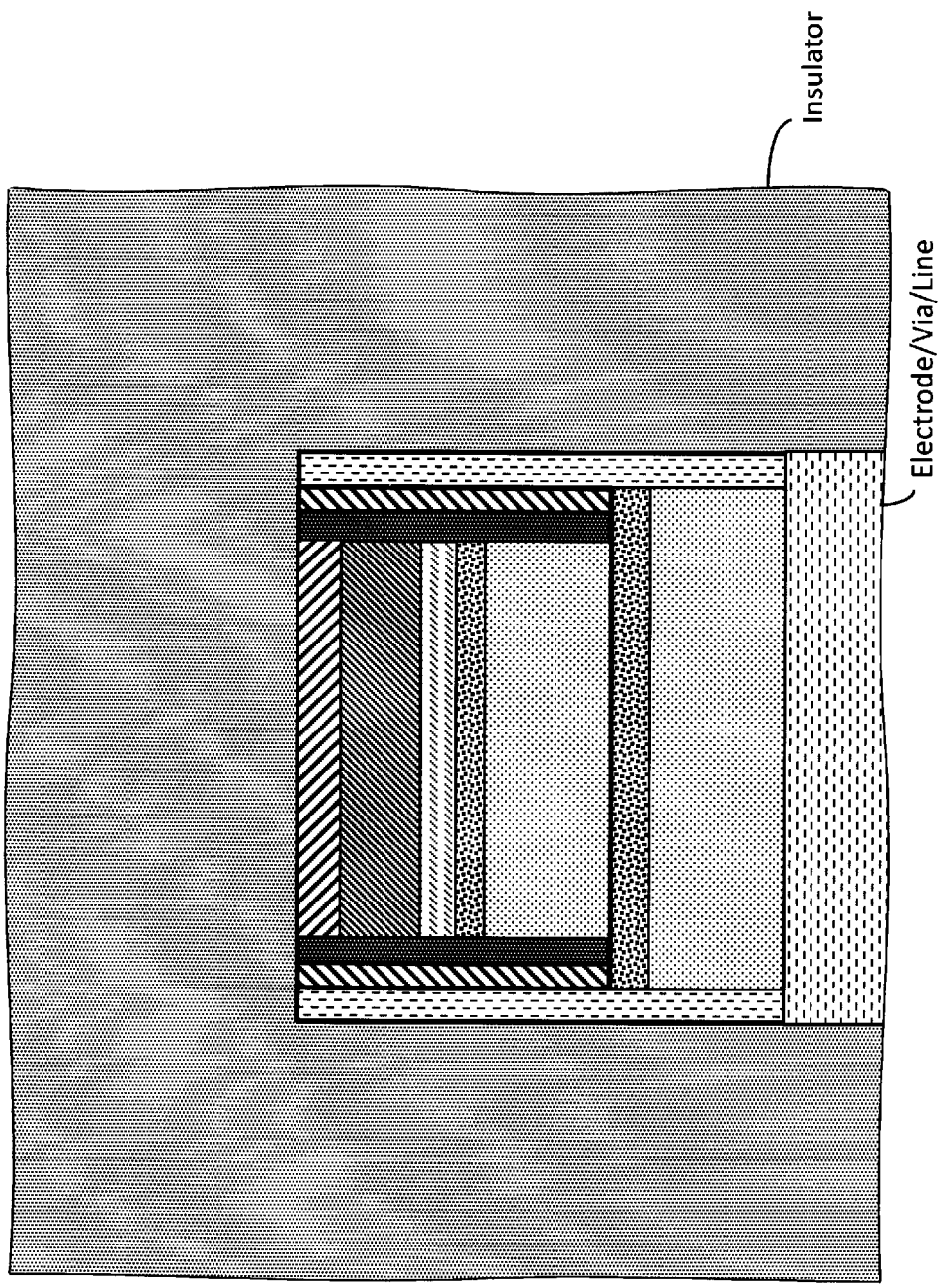
Figure 13B:
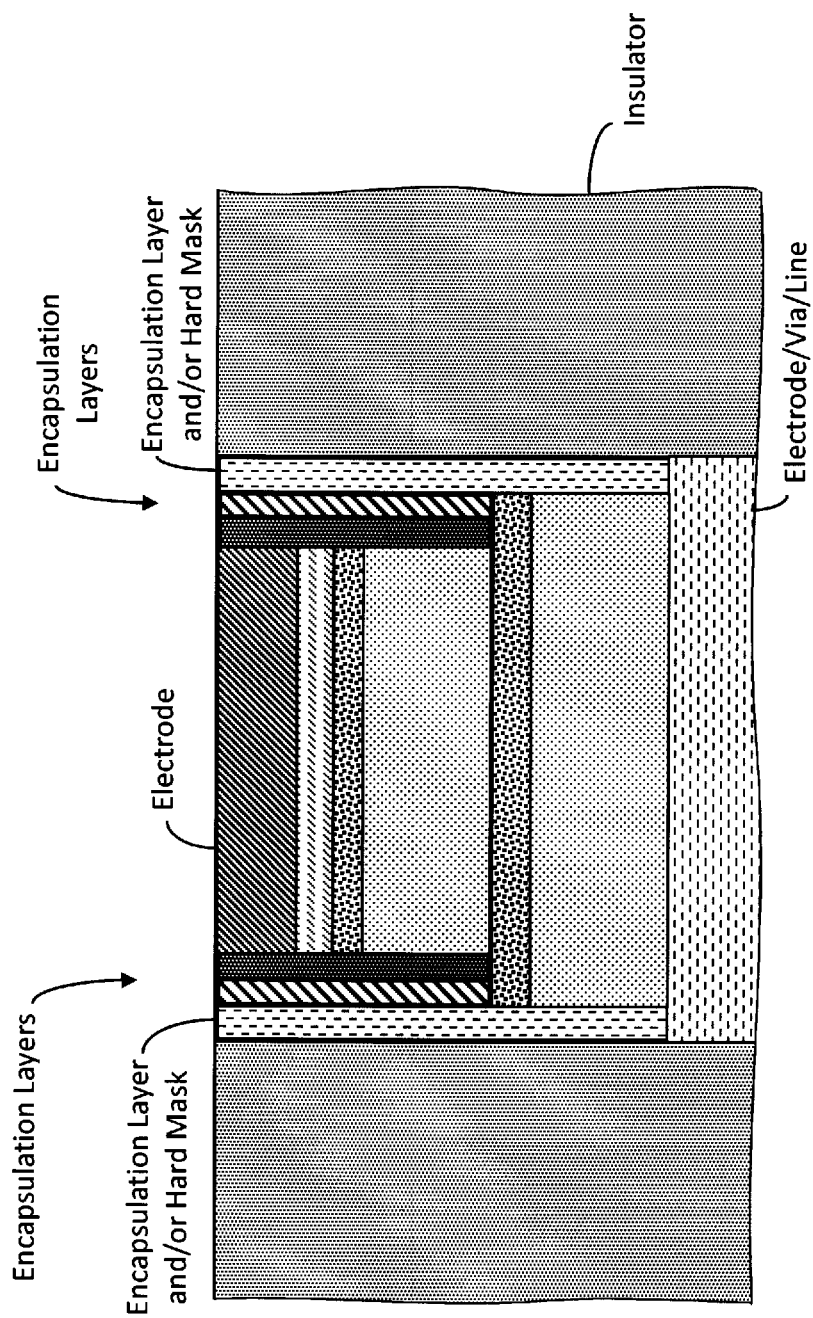
Figure 14A:
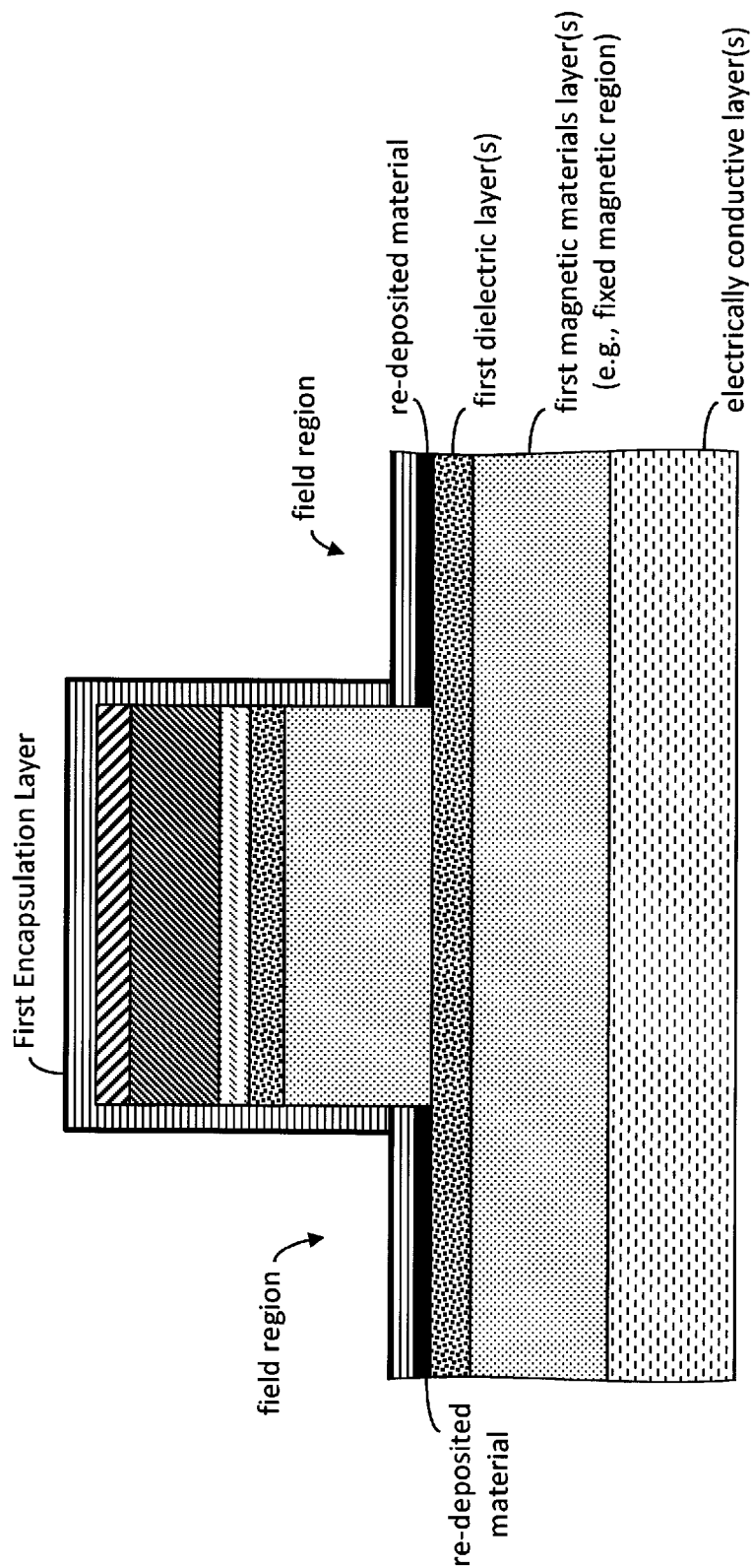
Figure 14B:
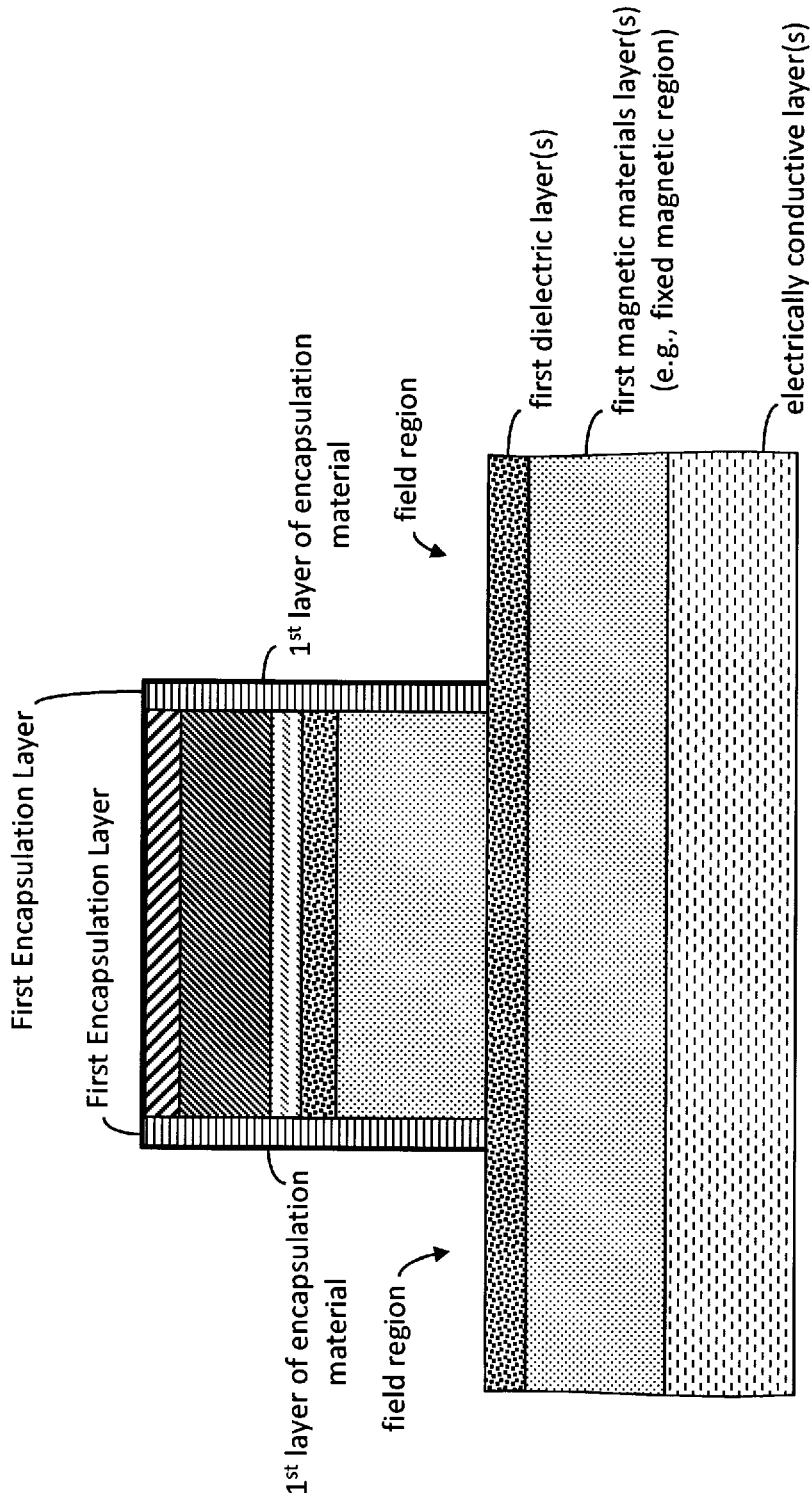
Figure 14C:
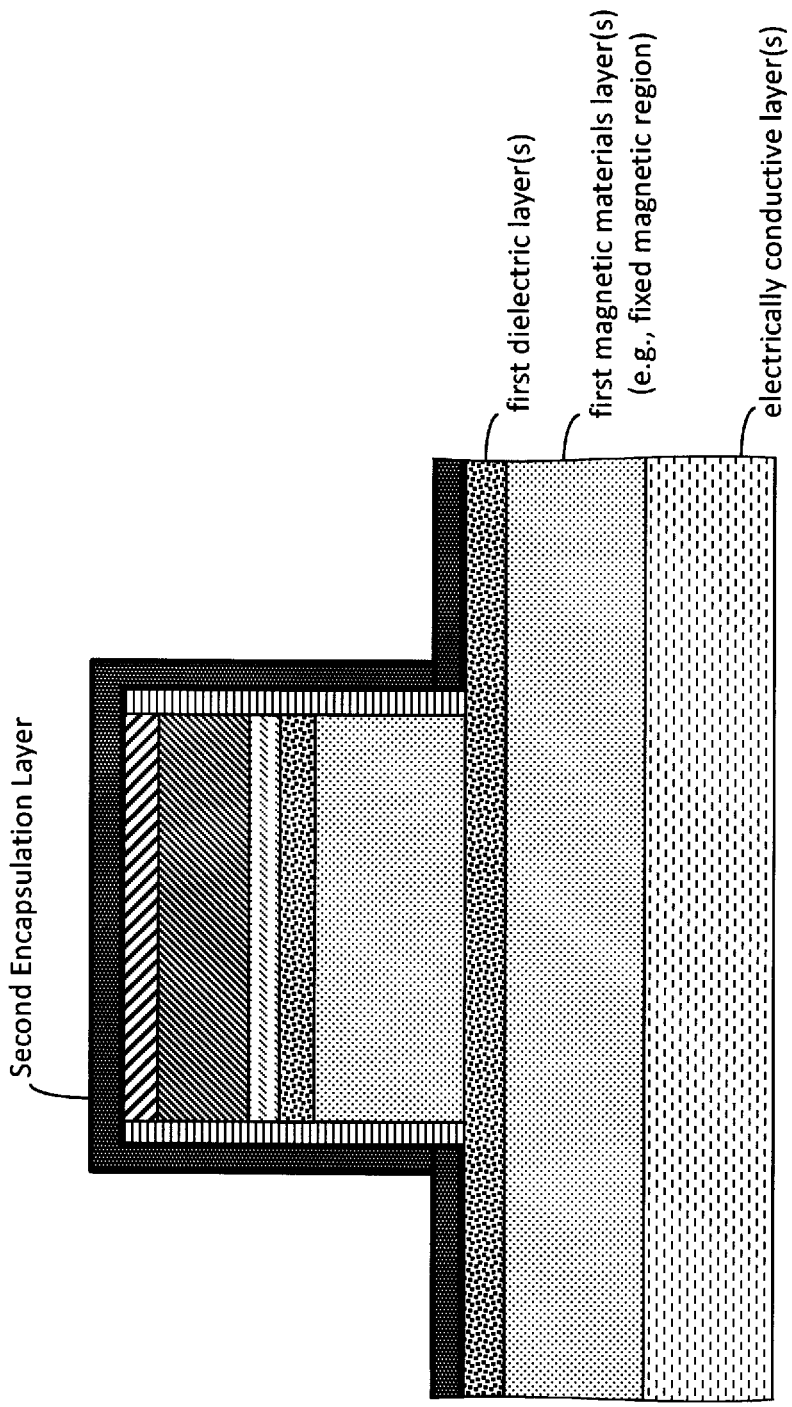
Figure 14D:
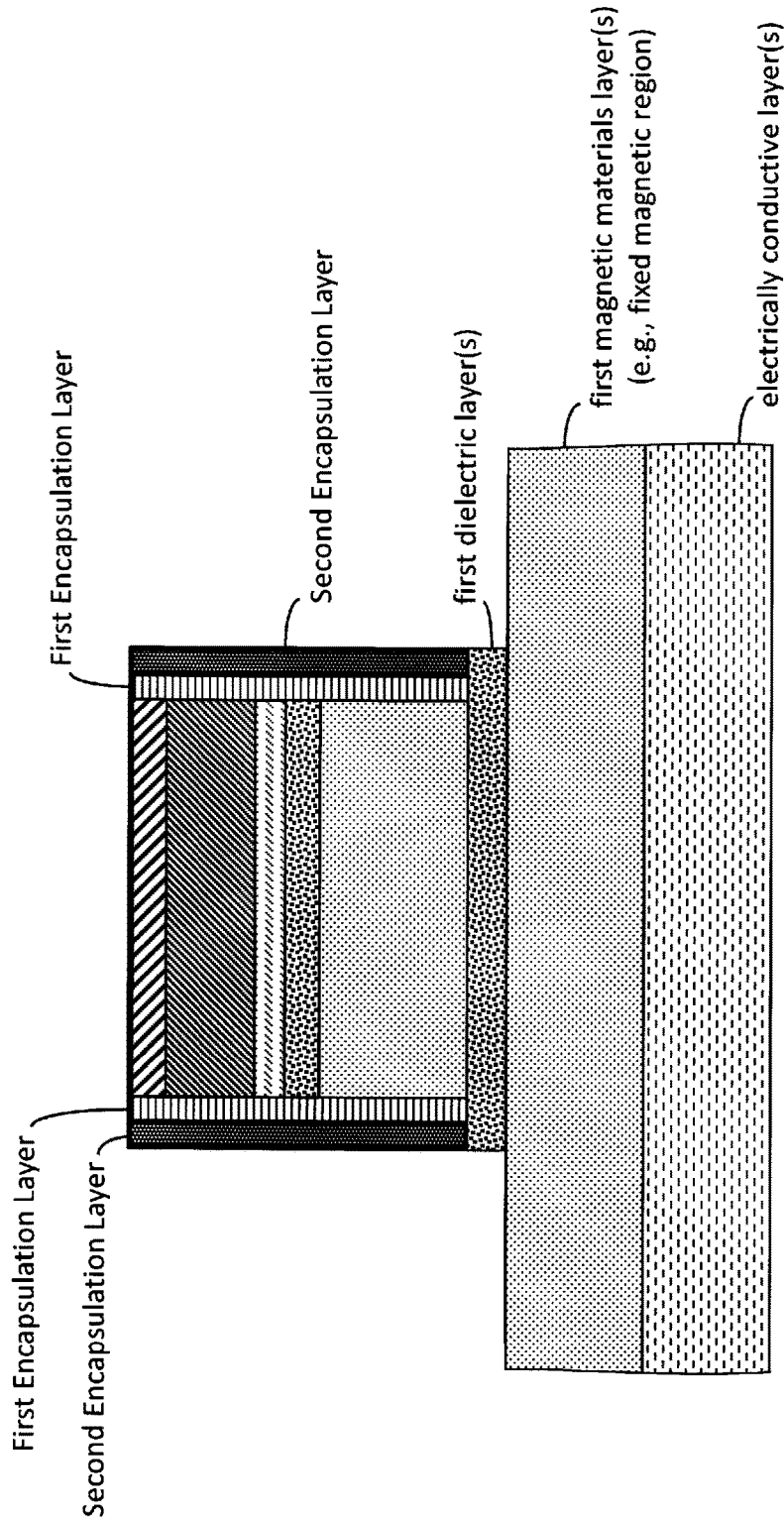
Figure 15A:
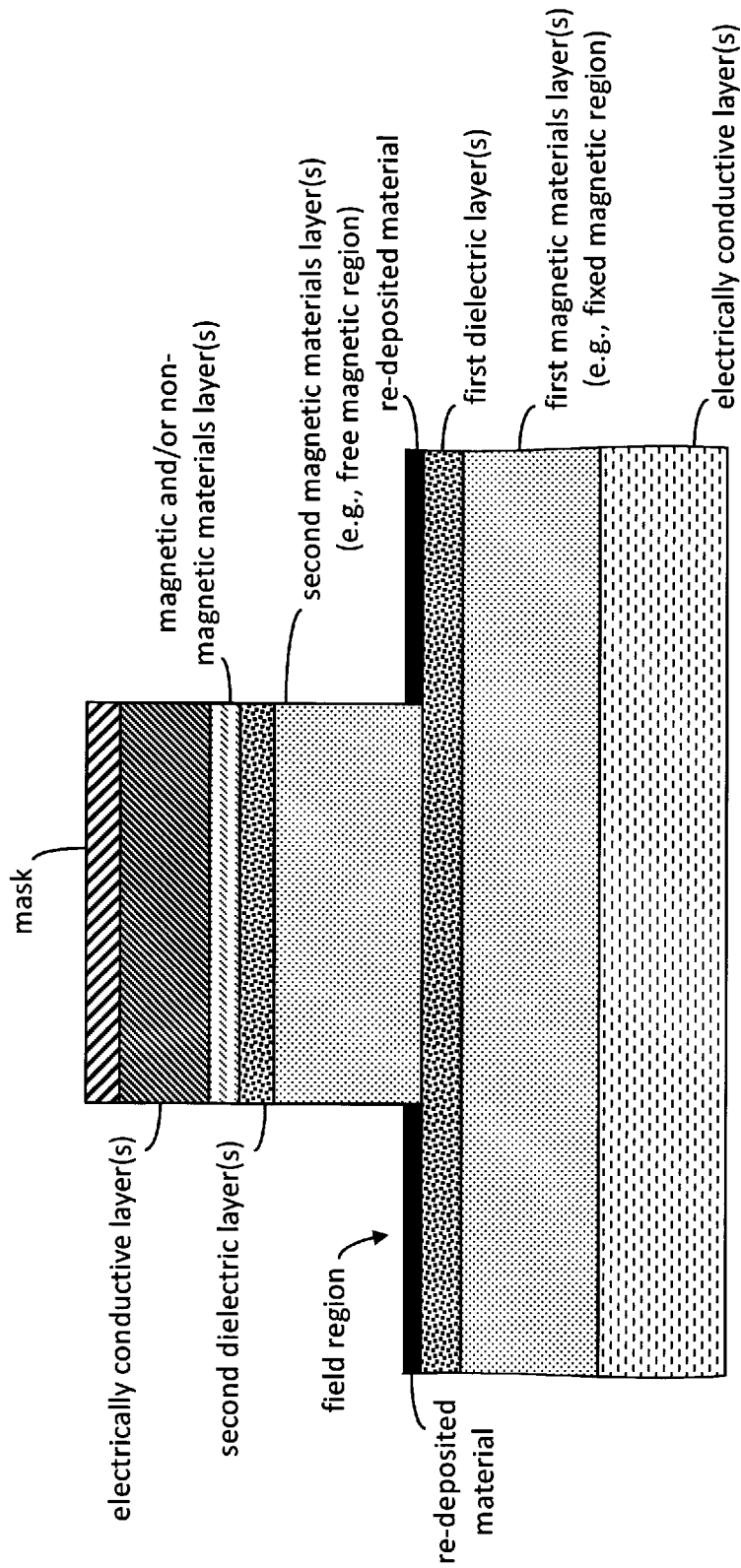
Figure 15B:
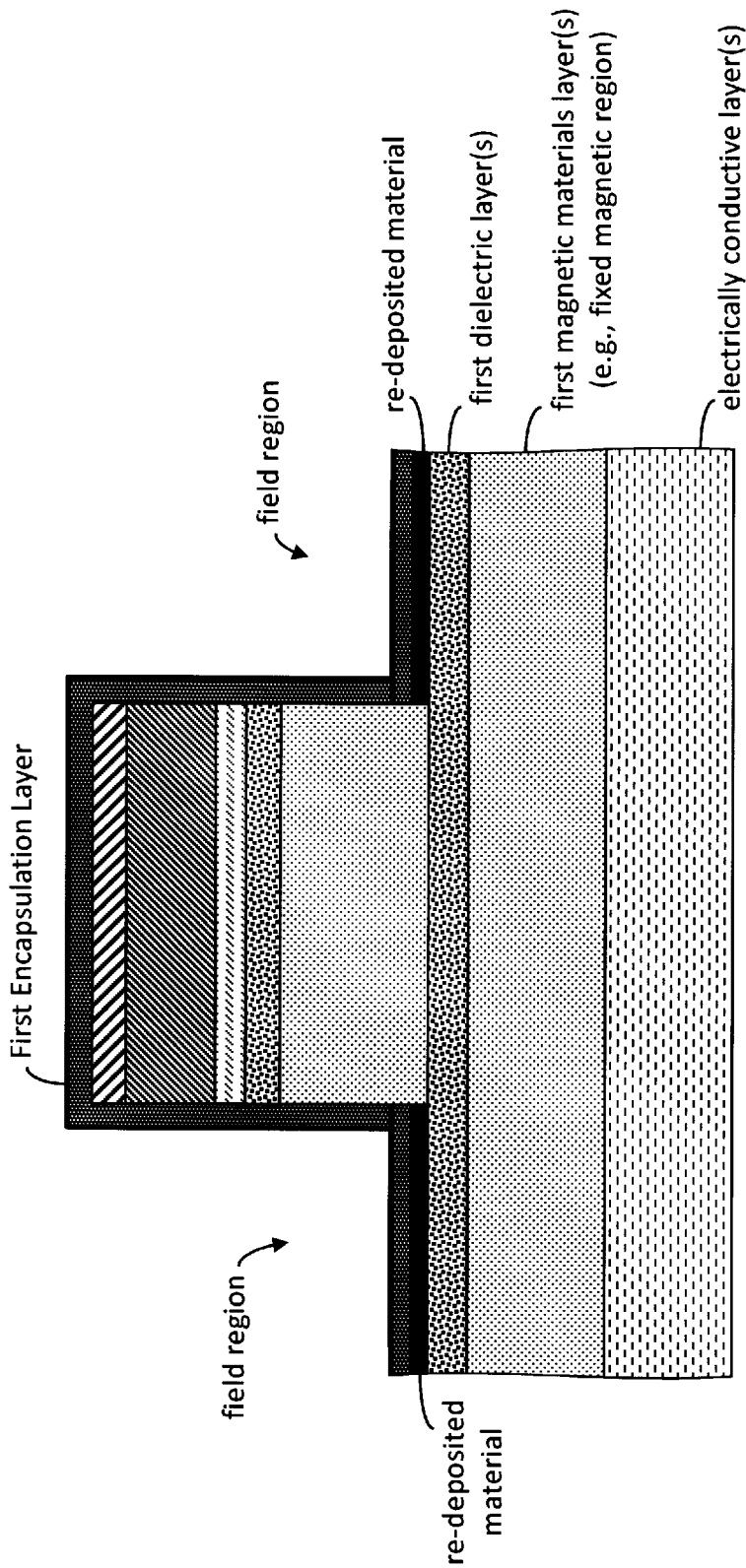
Figure 15C:
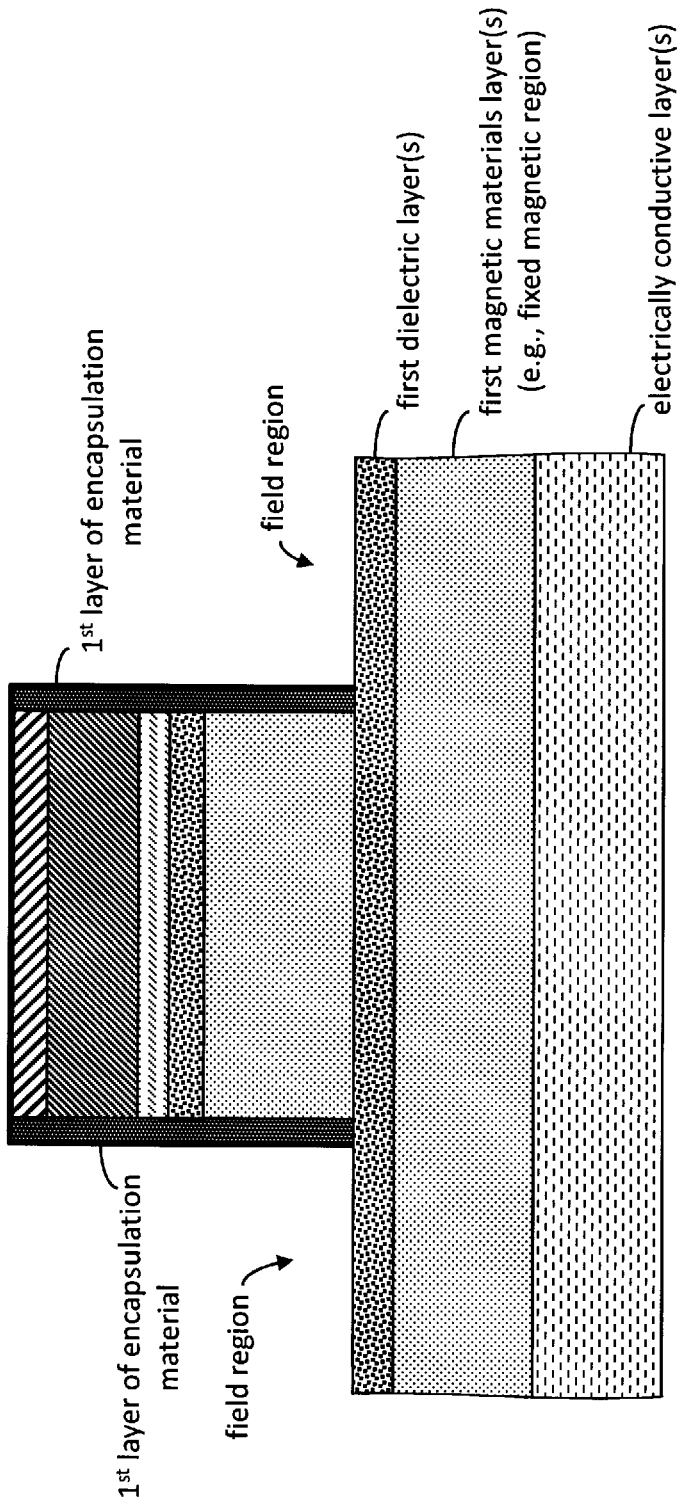
Figure 15D:
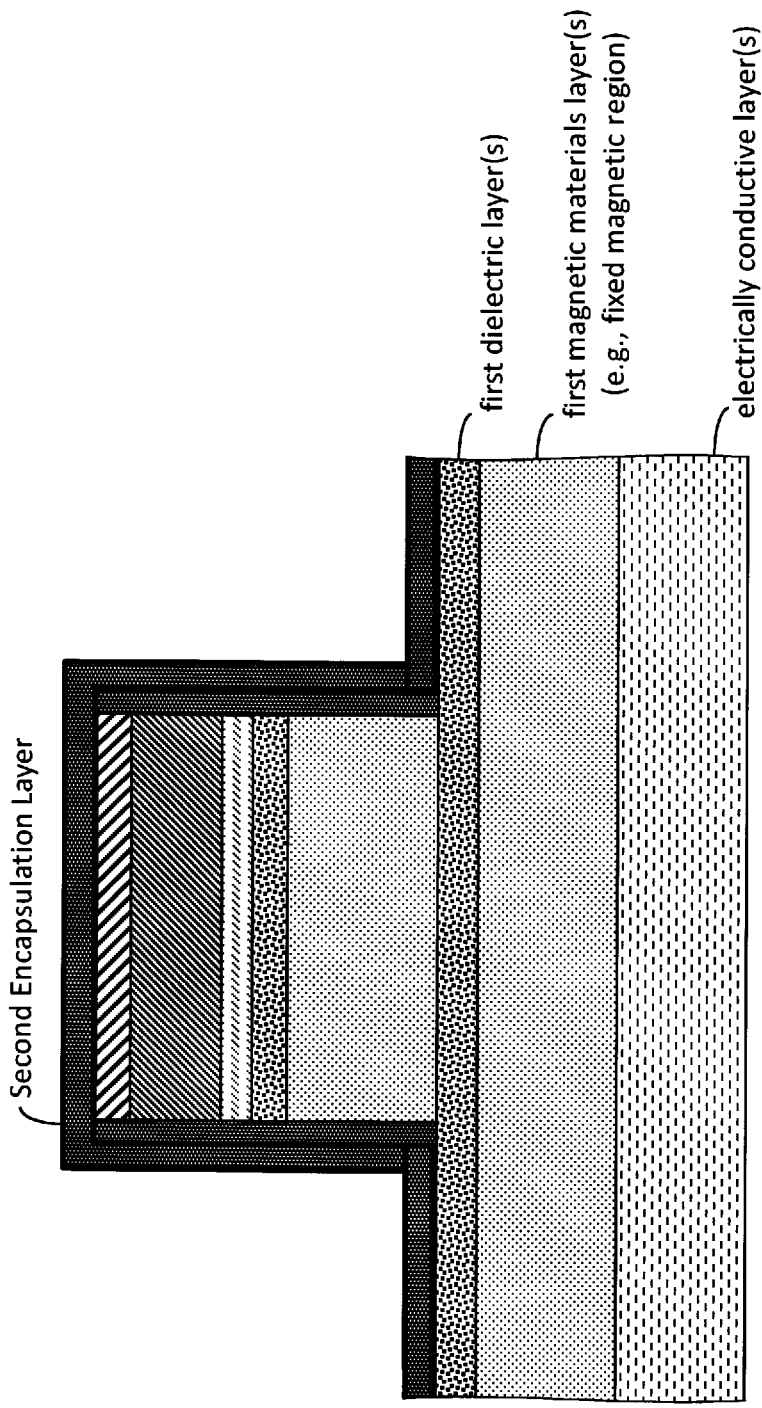
Figure 15E:
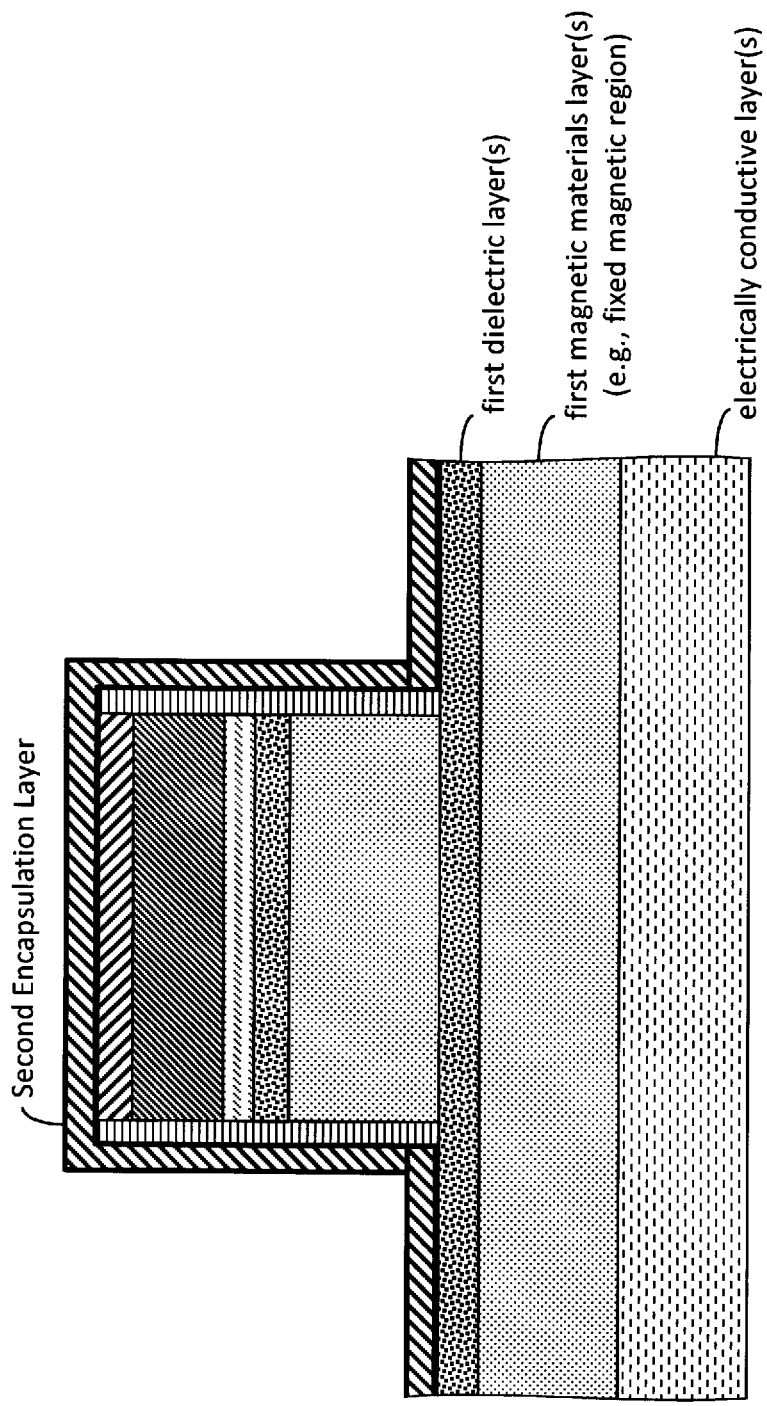
Figure 15F:
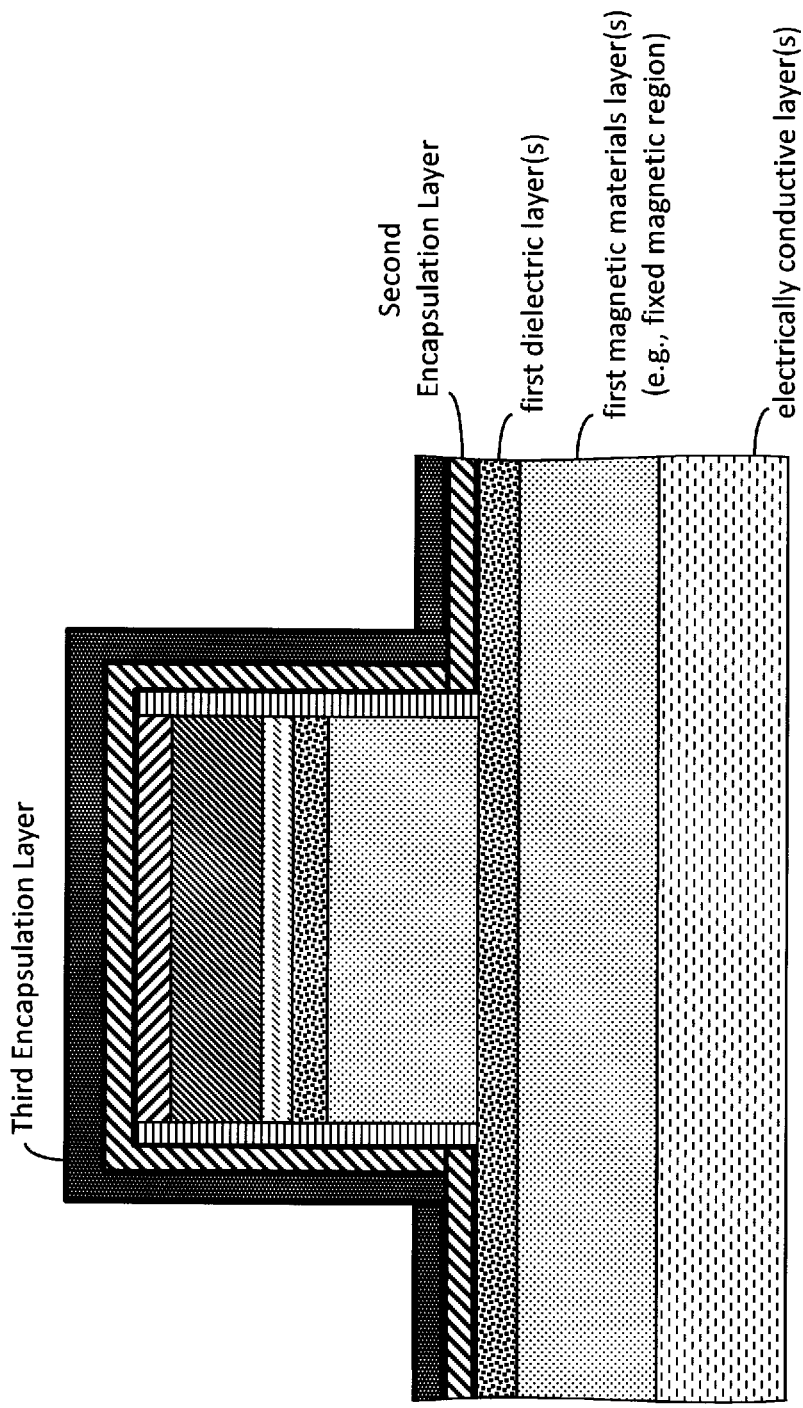
Figure 15G:
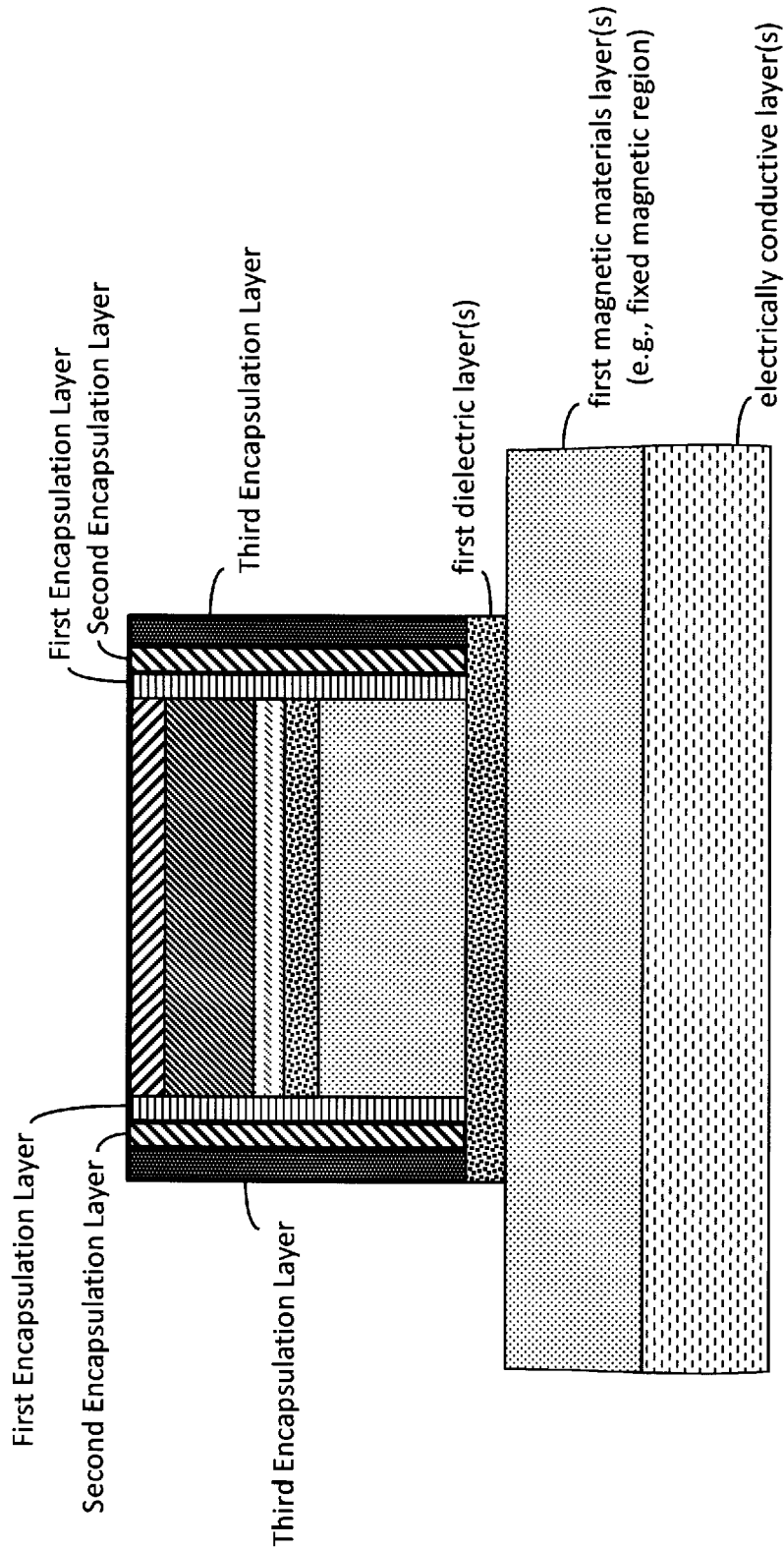
Figure 16A:
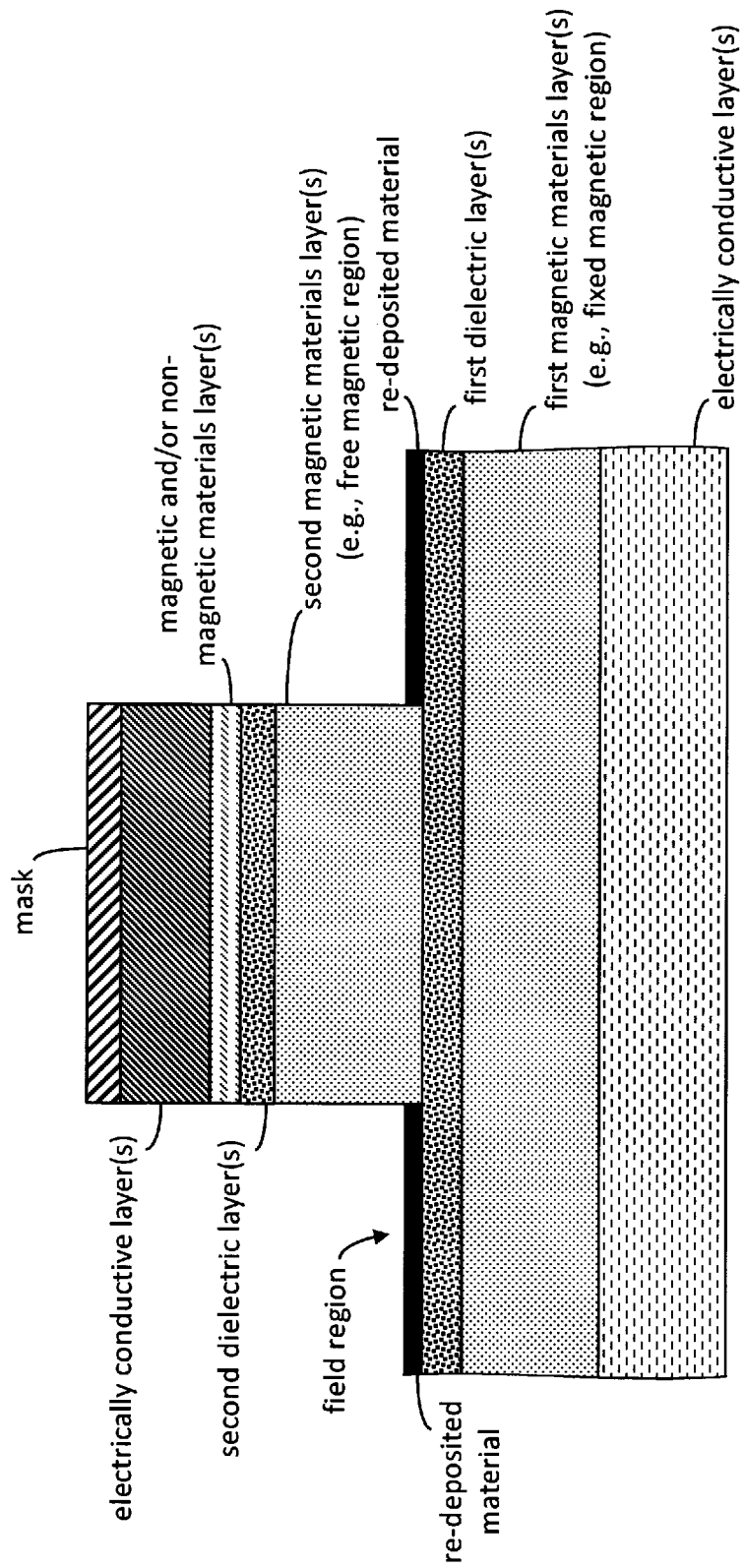
Figure 16B:
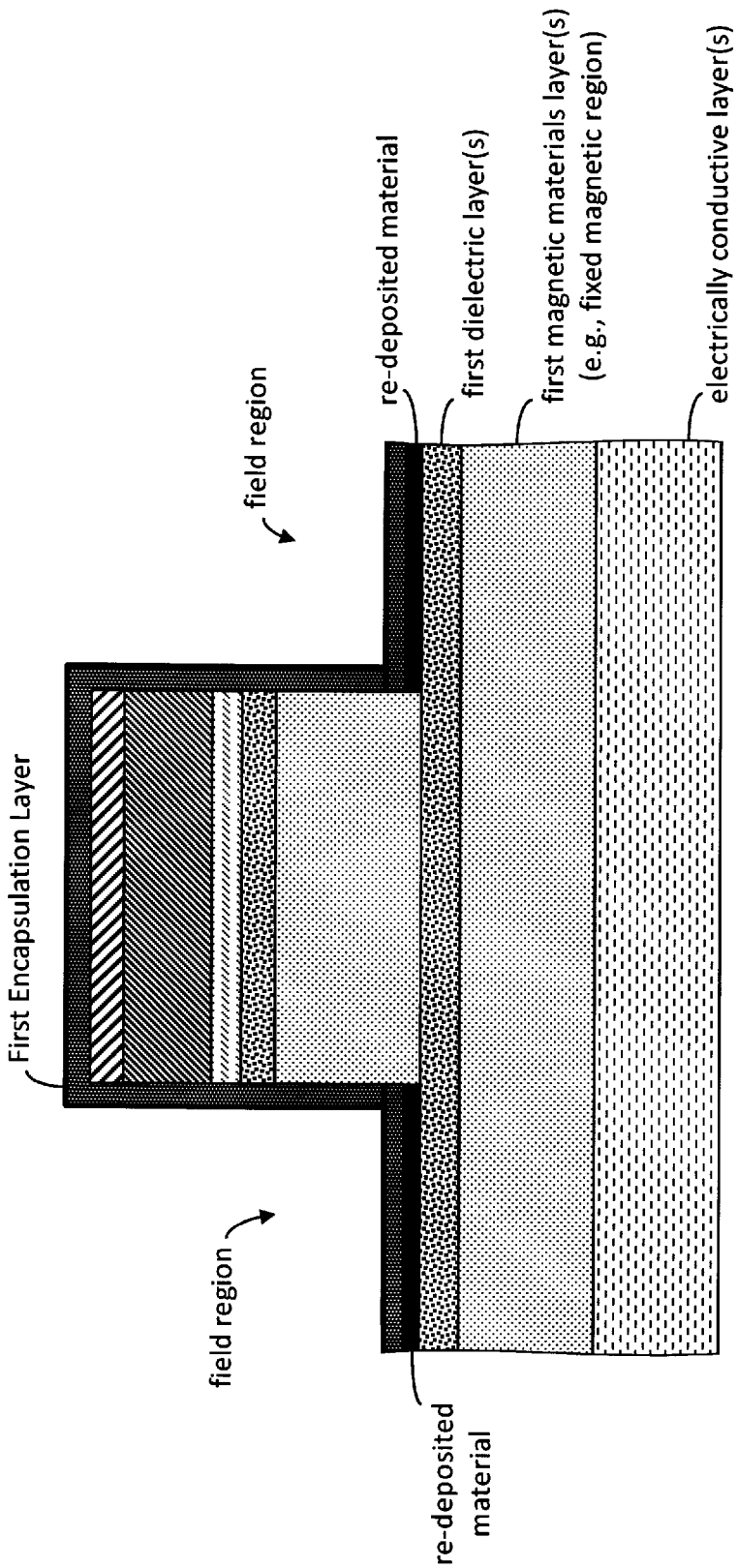
Figure 16C:
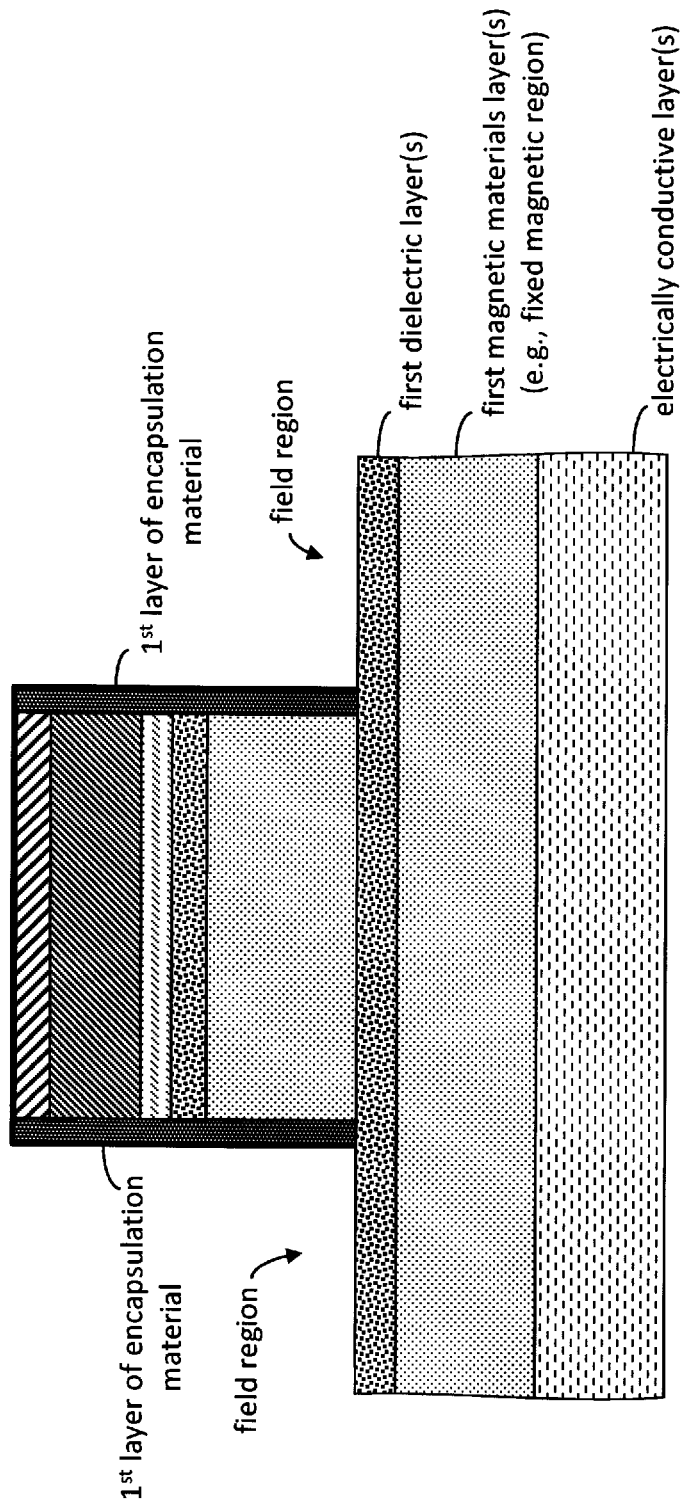
Figure 16D:
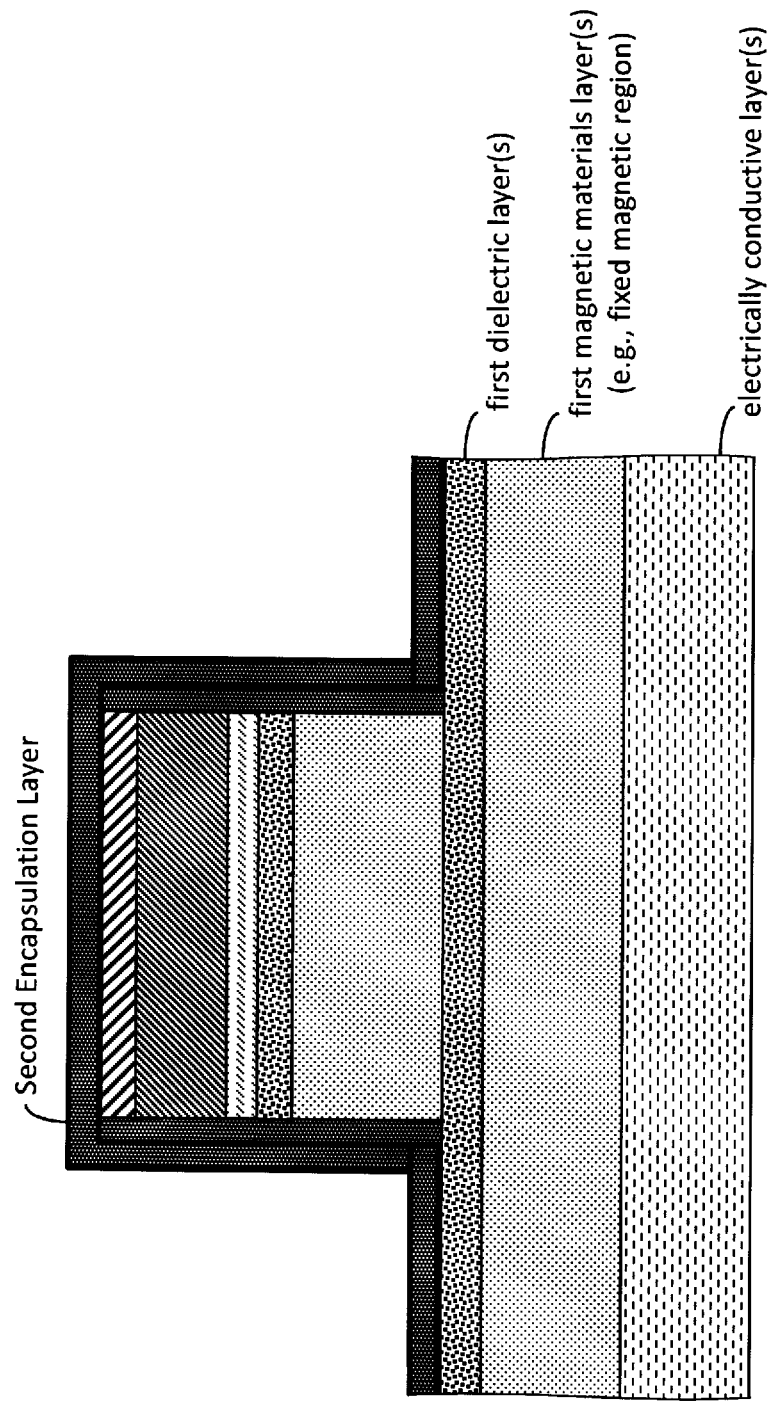
Figure 16E:
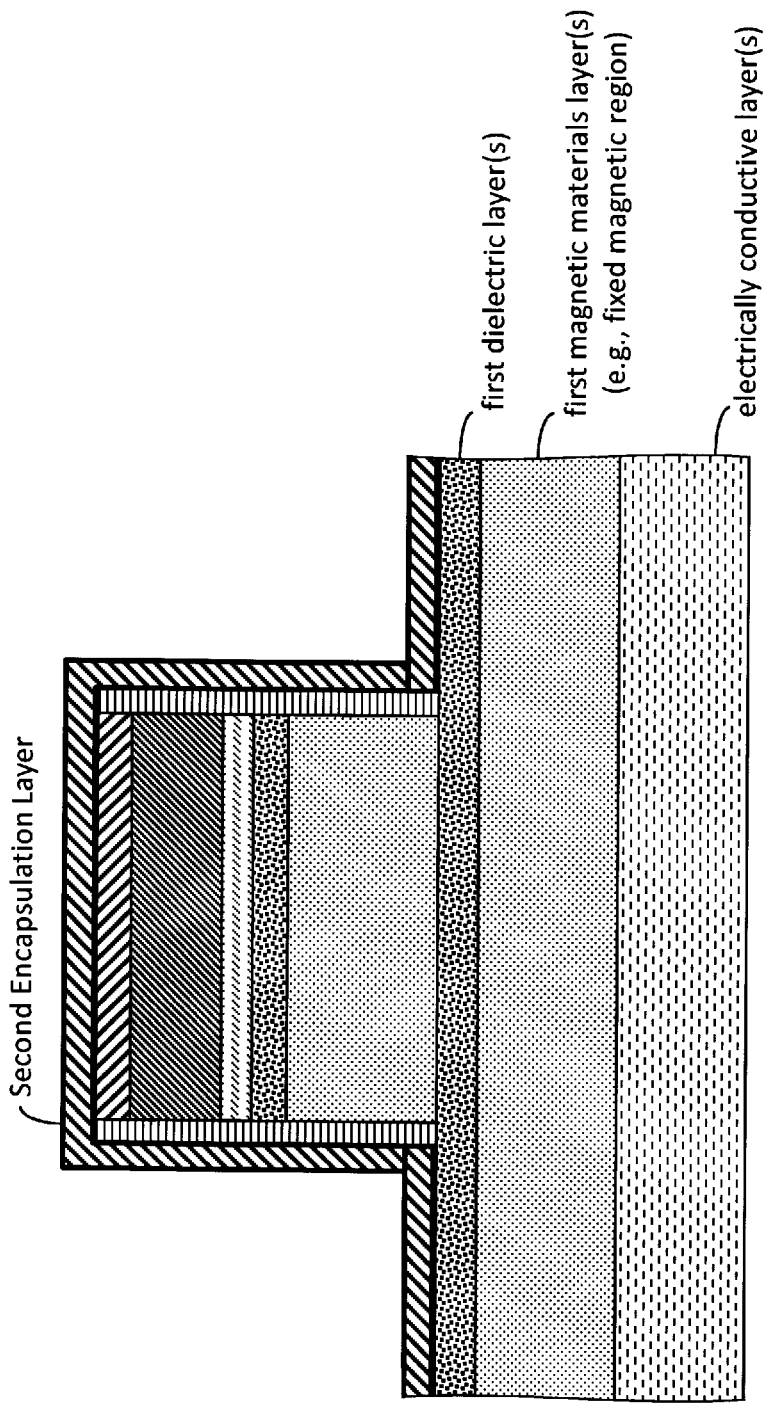
Figure 16F:
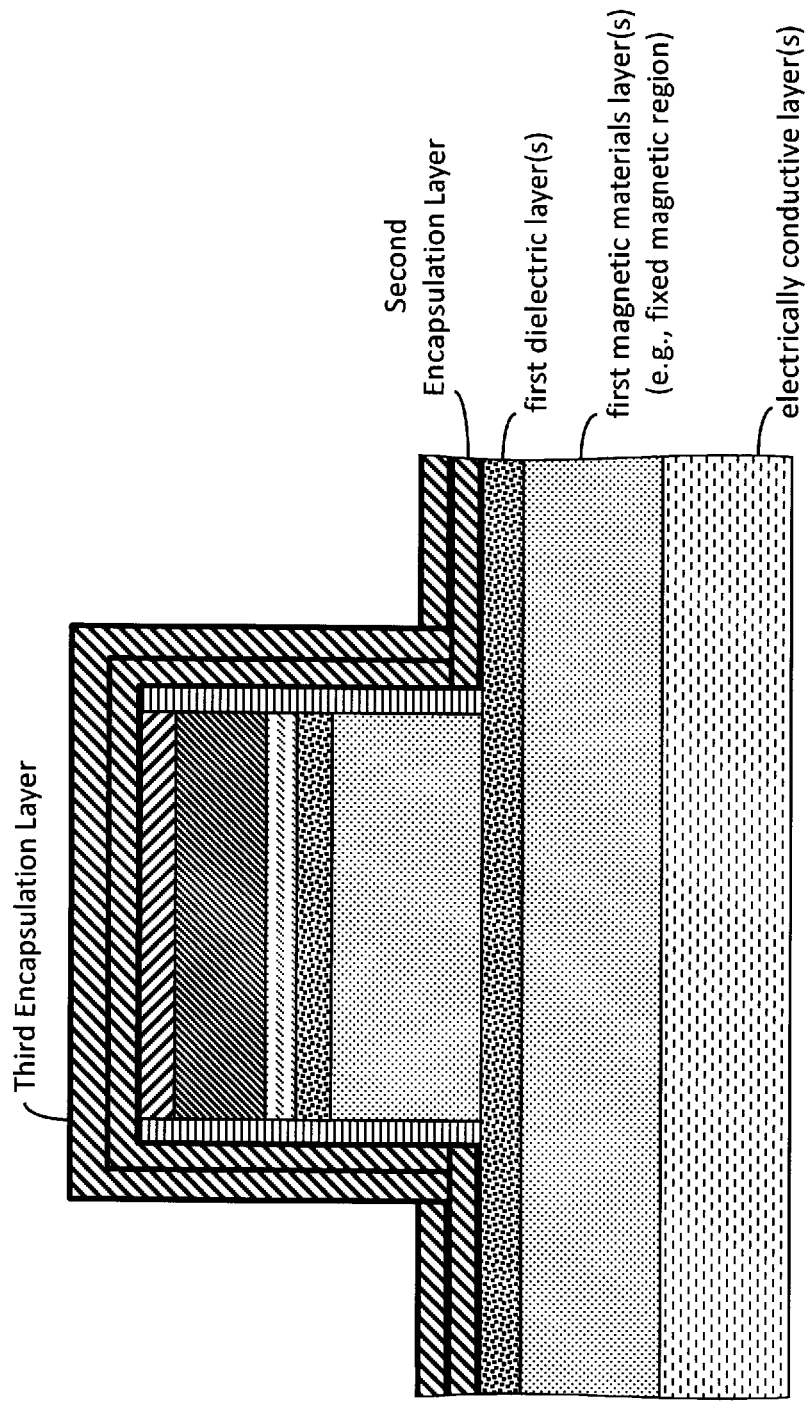
Figure 16G:
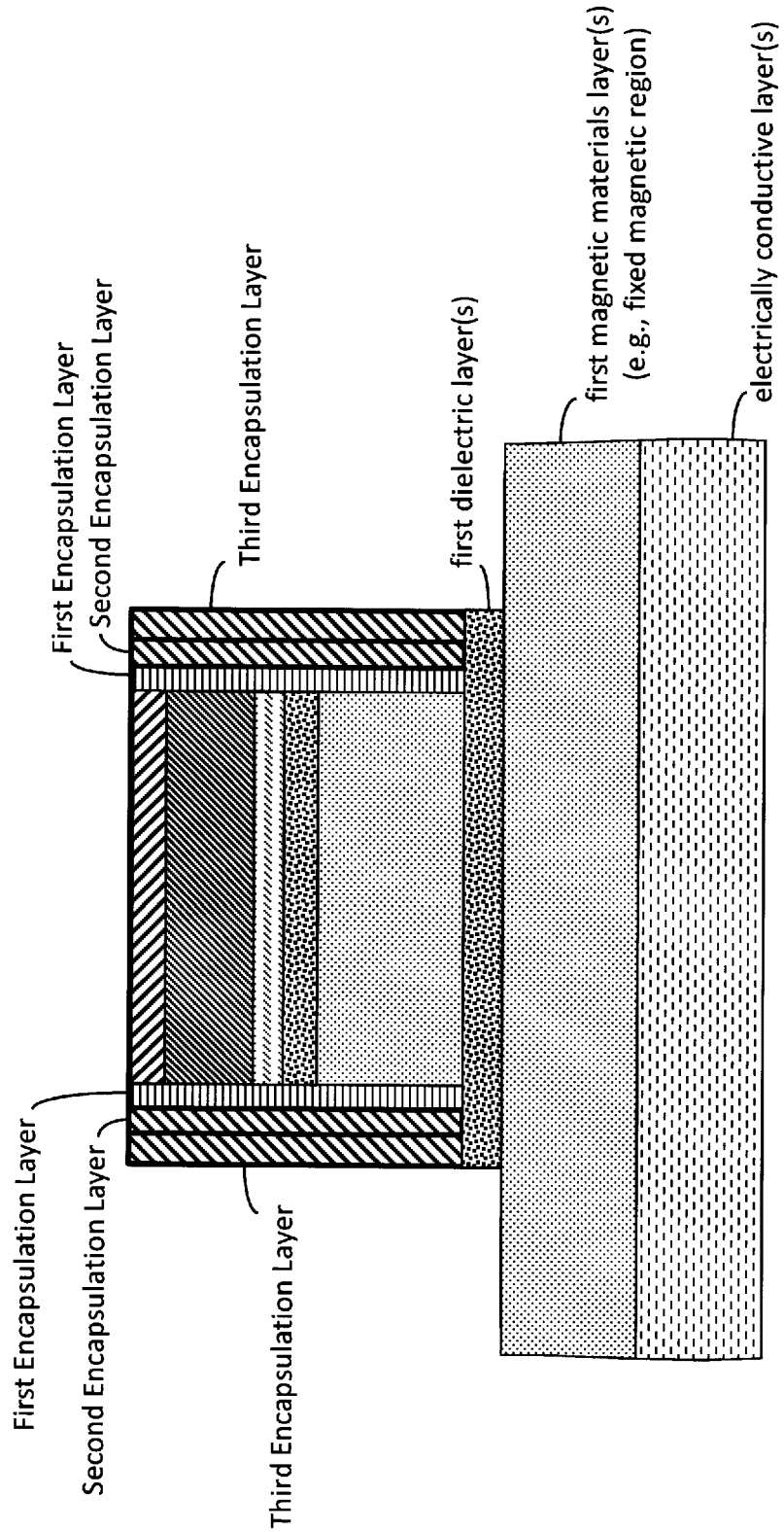
Figure 17A:
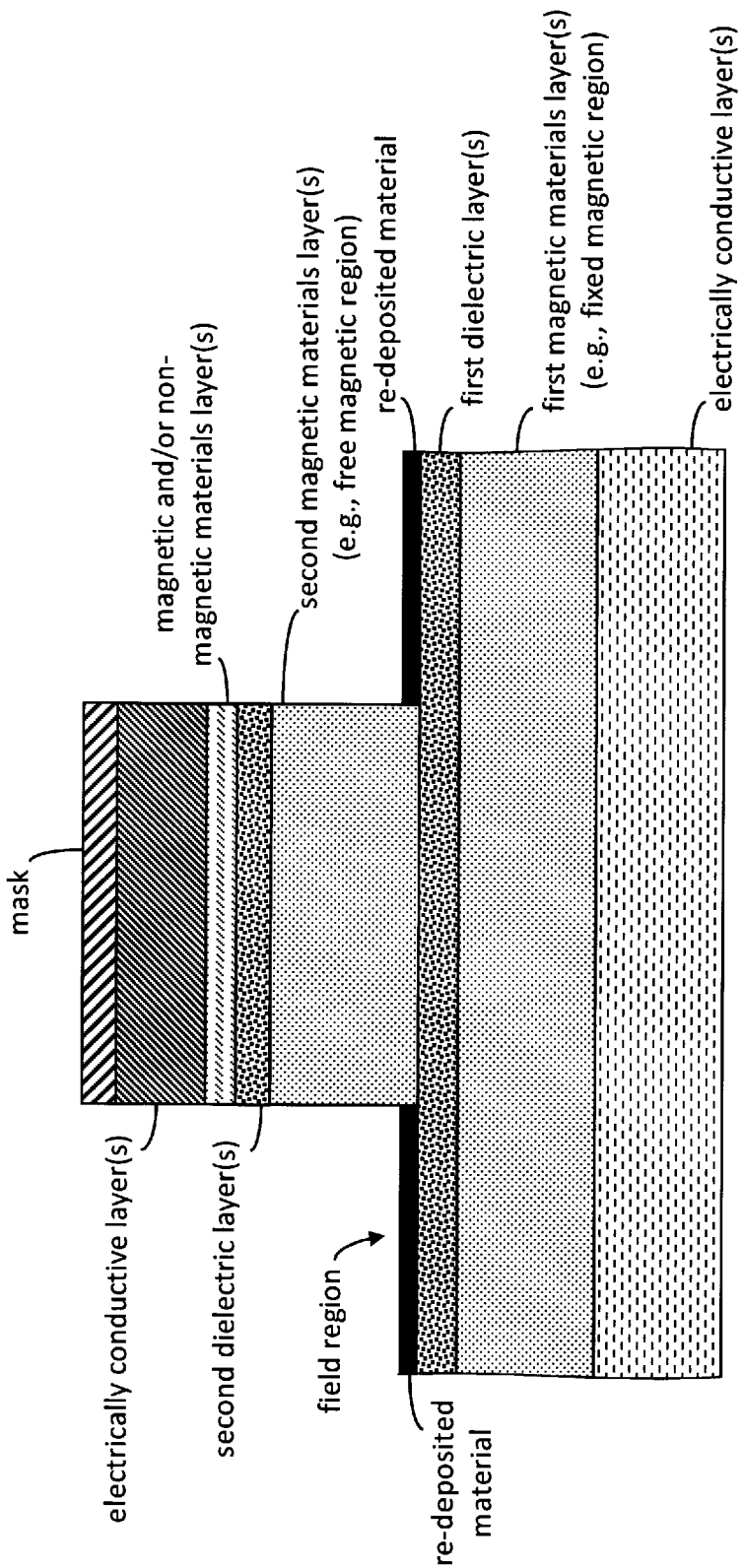
Figure 17B:
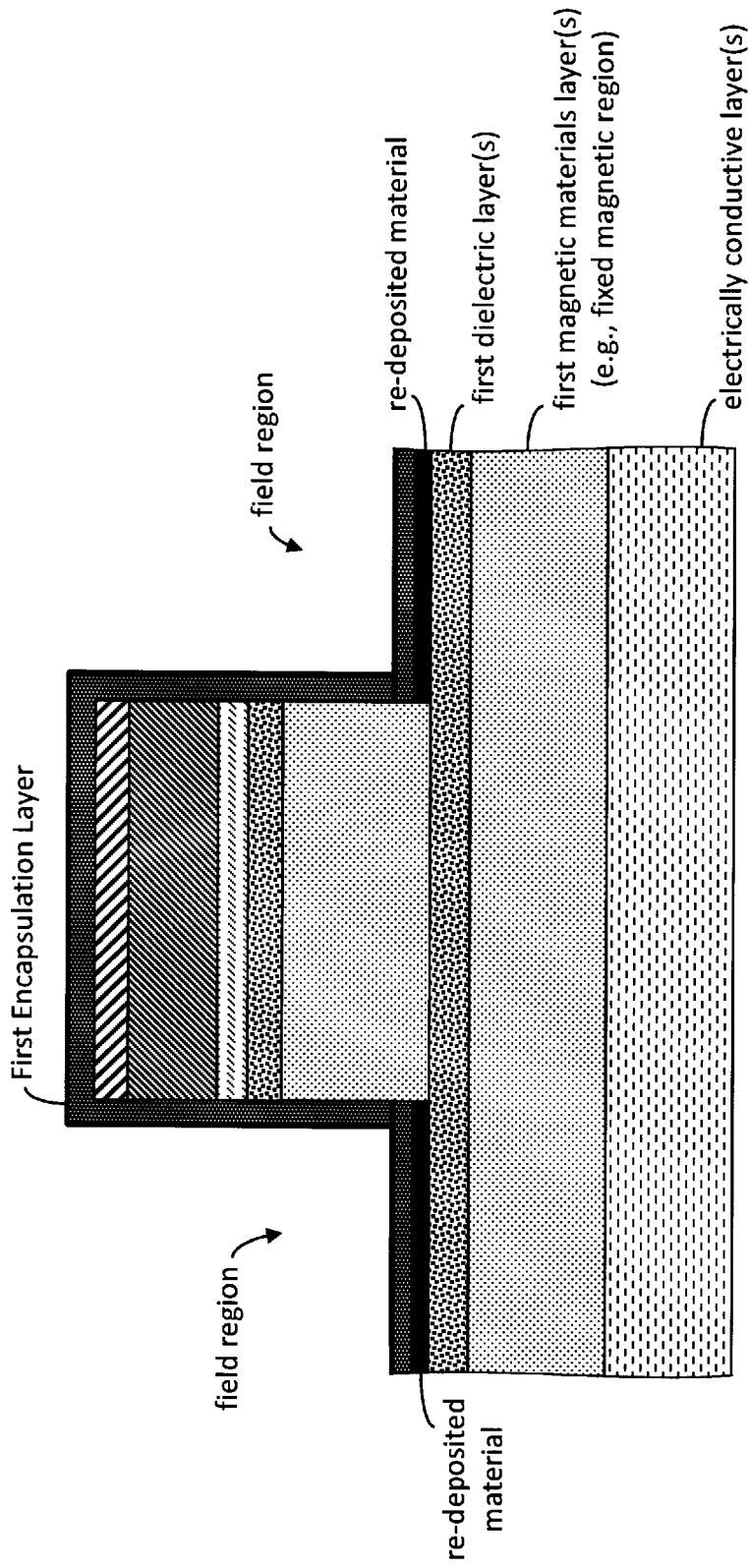
Figure 17C:
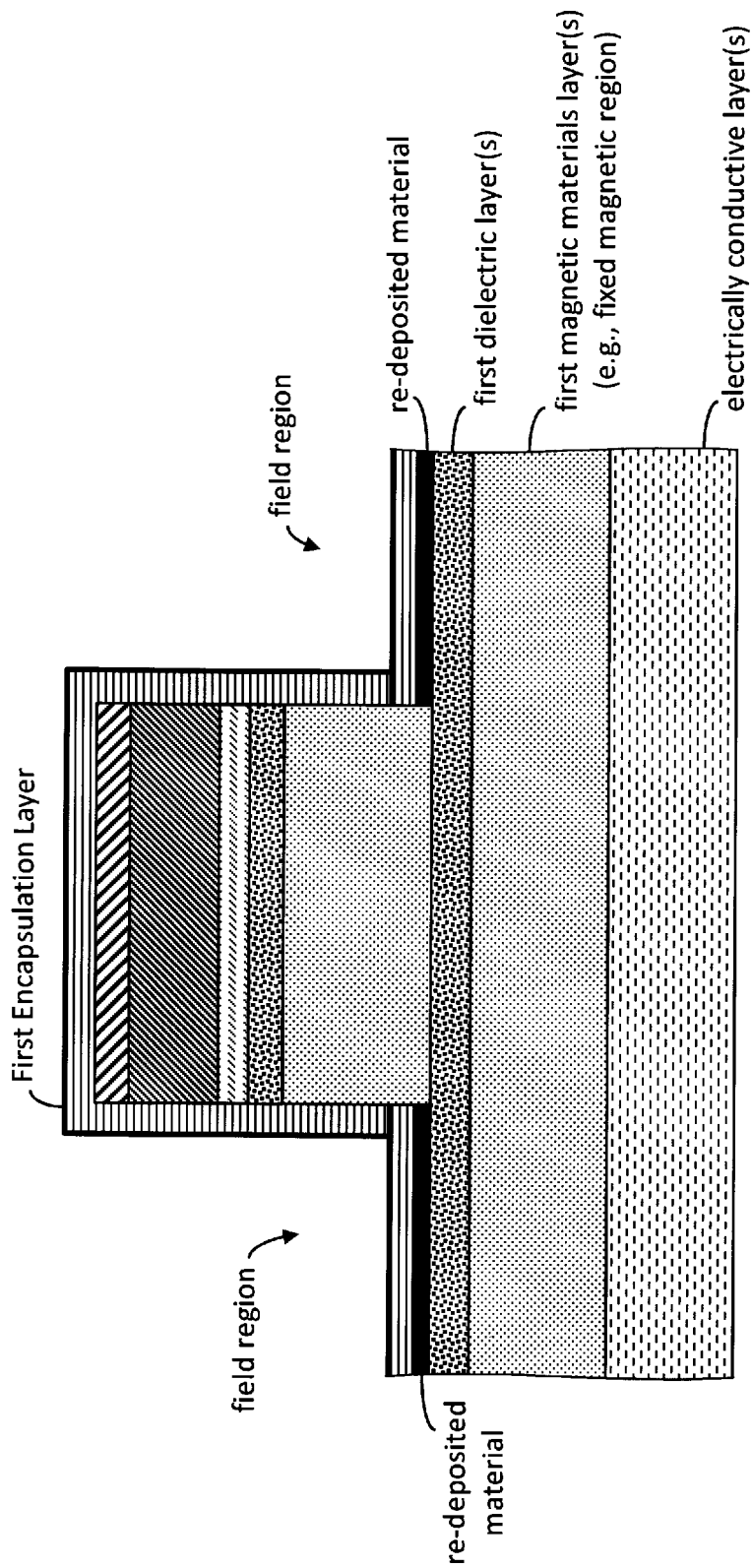
Figure 17D:
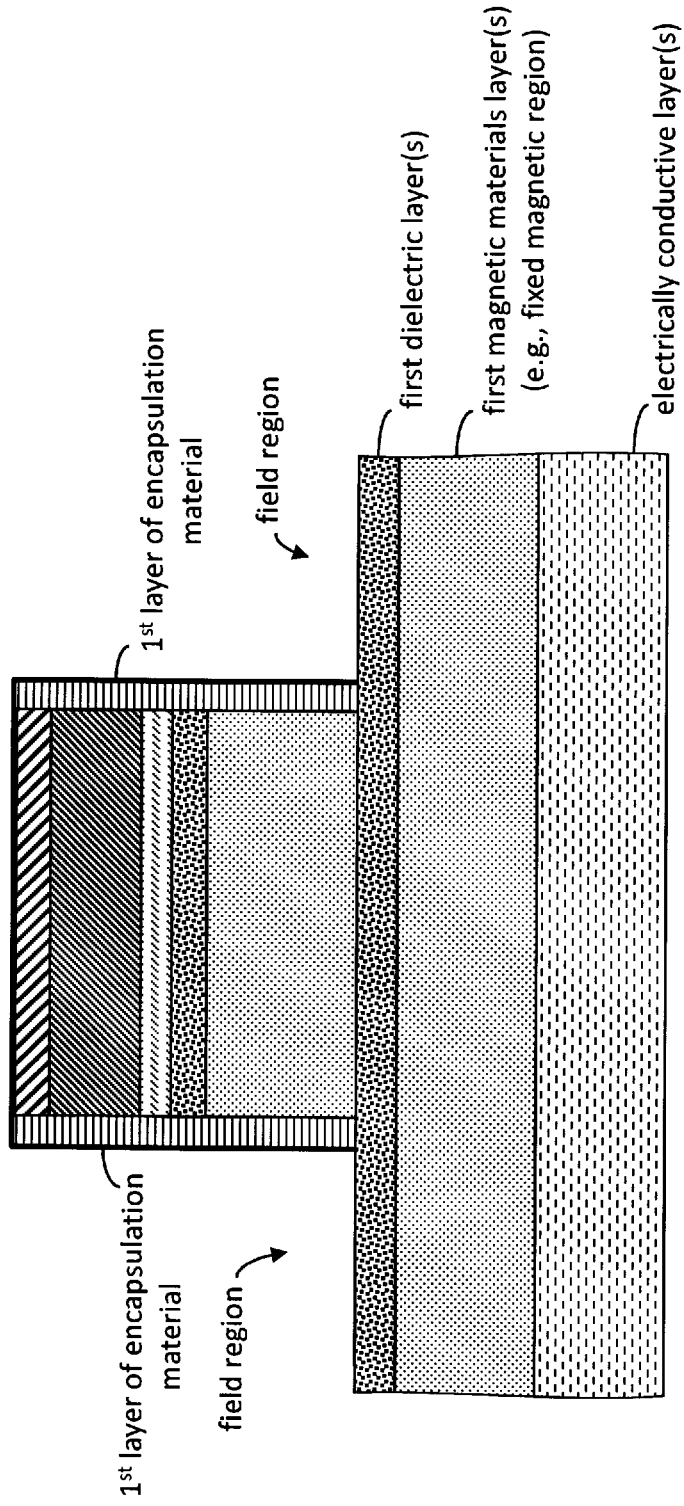
Figure 17E:
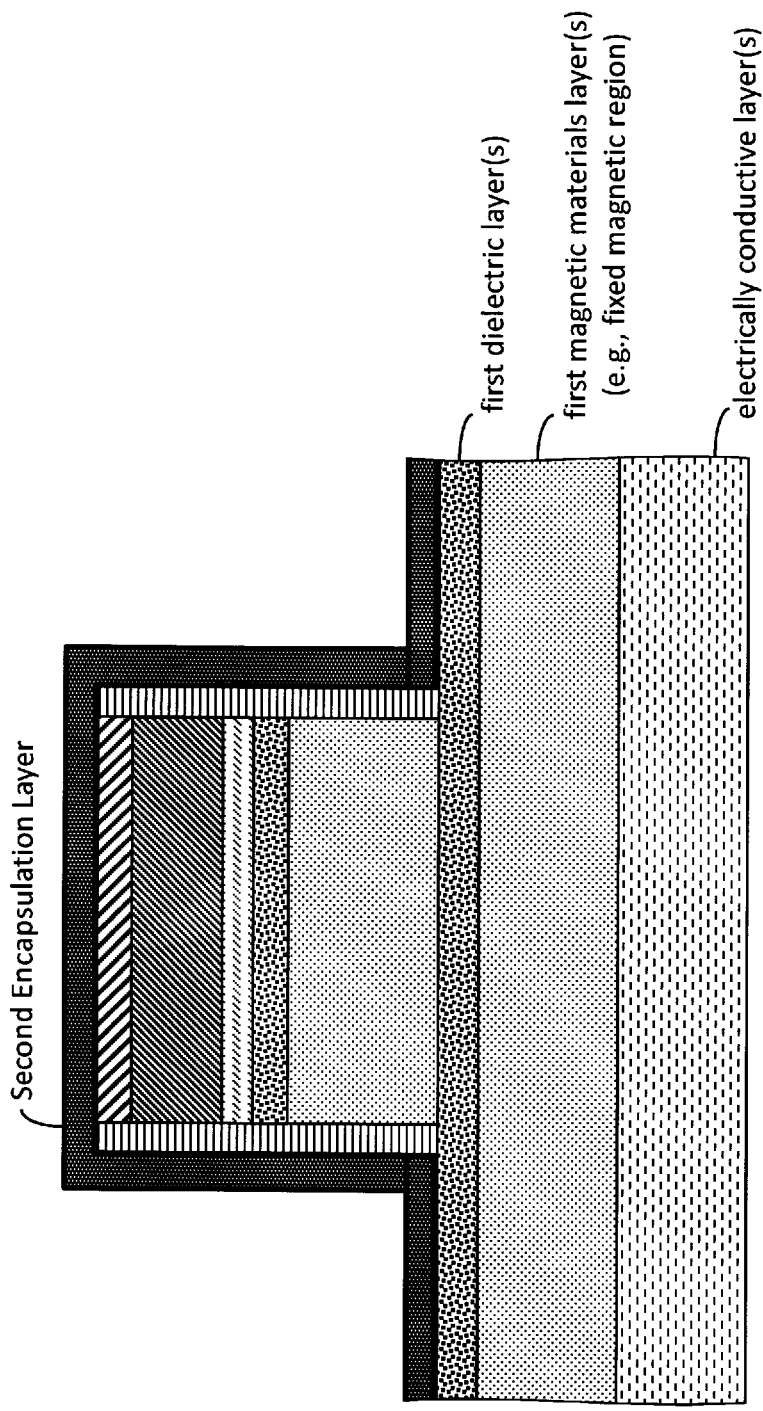
Figure 17F:
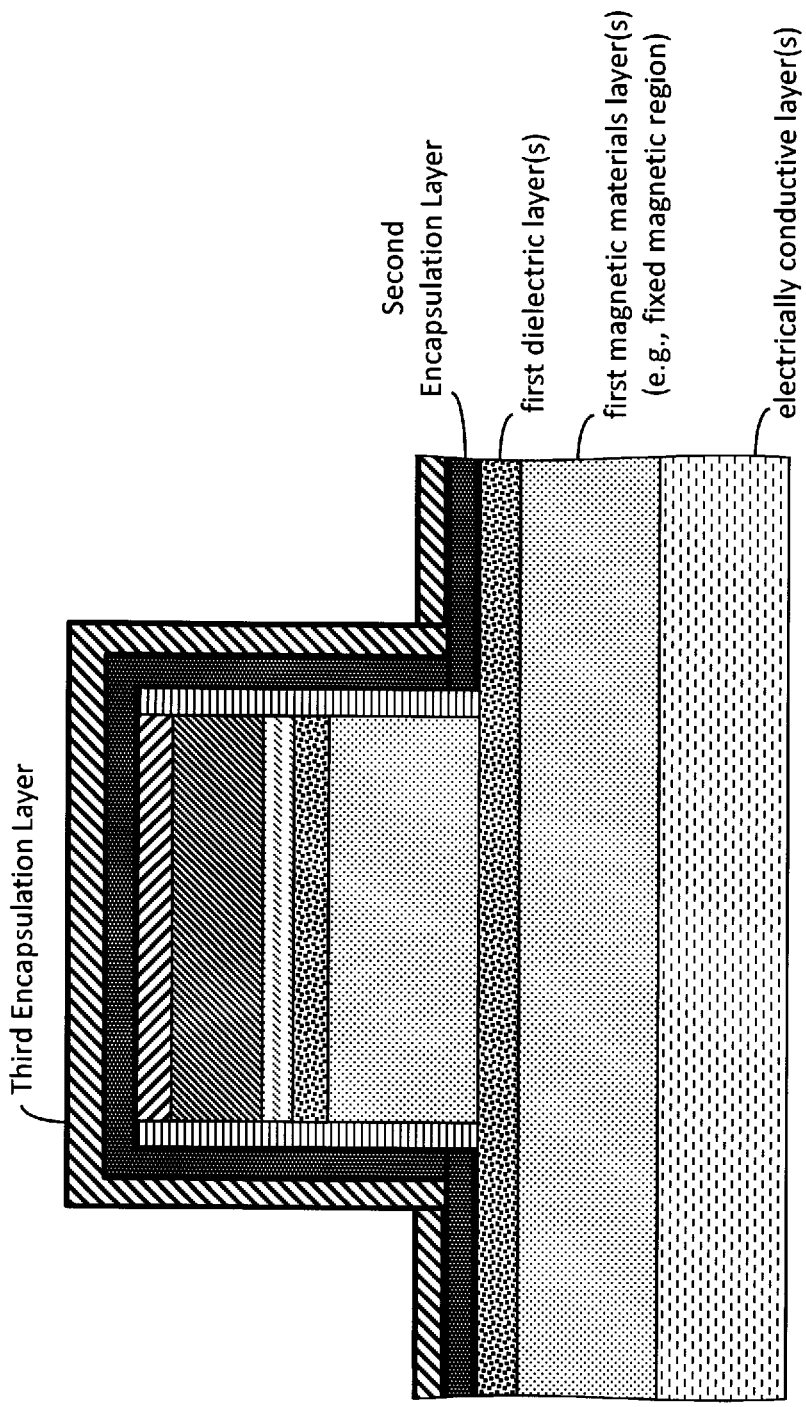
Figure 17G:
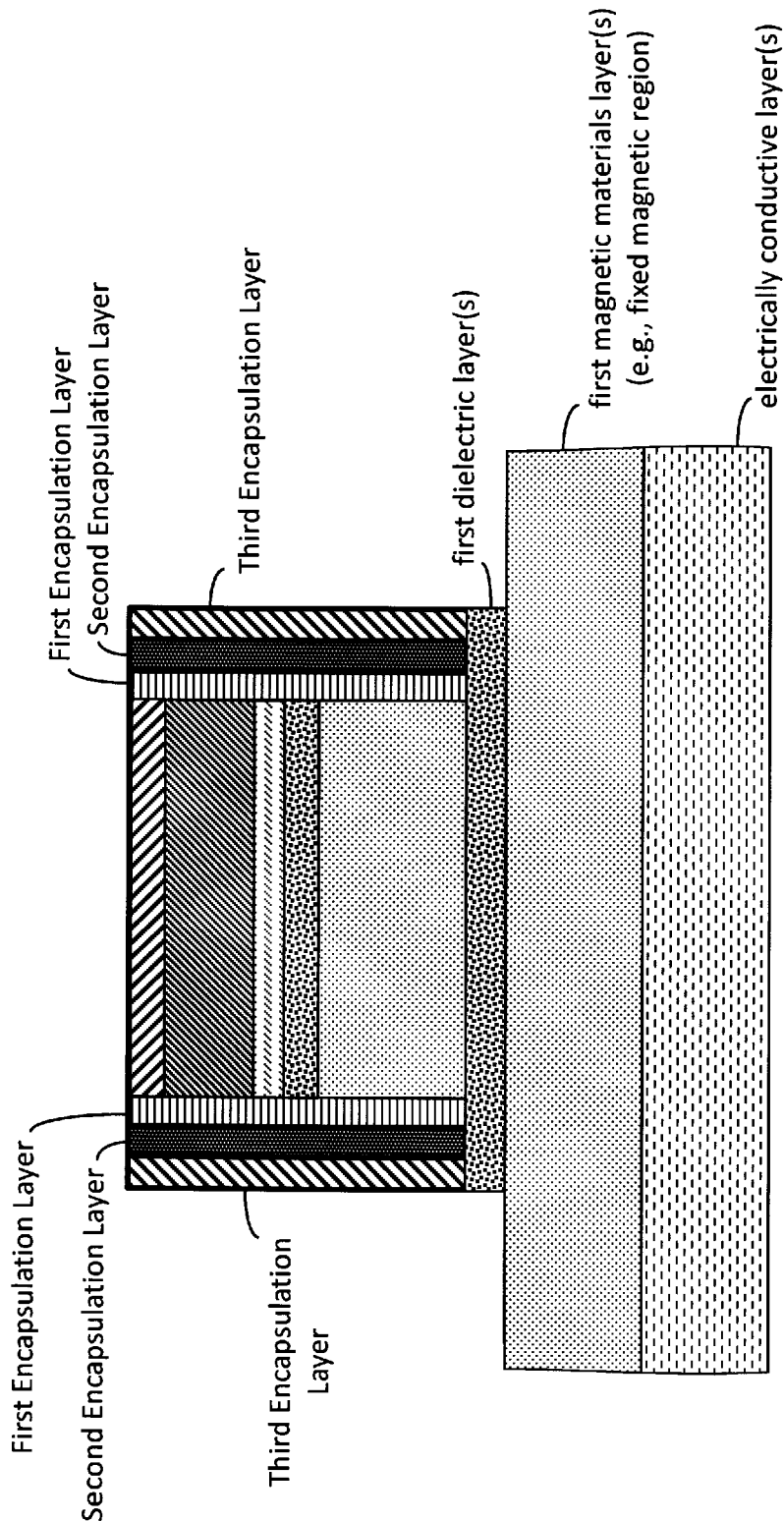
Figure 19A:
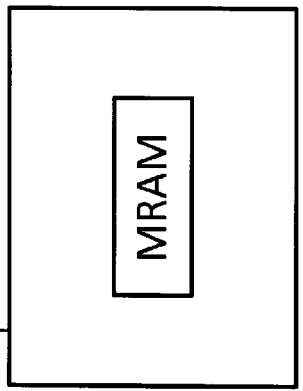
Figure 19B:
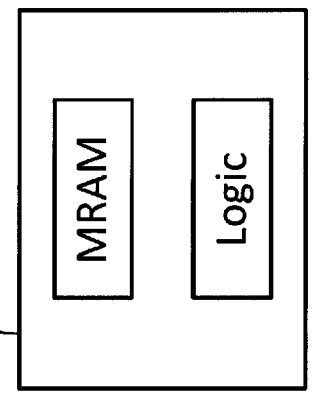
Figure 18:
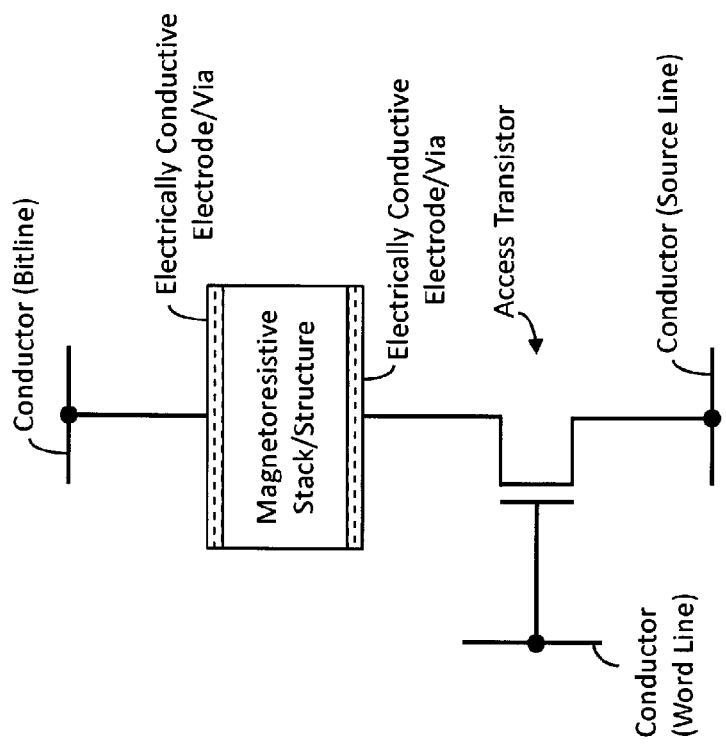

3A-3F, 4A, 4B and/or 5A-5E to more fully manufacture/form an embodiment of the MTJ stack/structure according to one or more aspects of the present inventions;

FIGS. 11A-11J illustrate cross-sectional views of layers included in a MTJ stack/structure at various stages of an exemplary manufacturing process of a second aspect of the inventions for fabricating a partially formed exemplary MTJ stack/structure according to at least certain aspects of certain embodiments of the present inventions wherein, the first encapsulation layer is a conductive material (for example, a metal such as aluminum and/or magnesium) and is deposited on the partially fabricated MTJ stack/structure and the re-deposited material (see FIG. 11F), and, after removal of the re-deposited material, a second encapsulation layer of an insulative material (for example, an aluminum oxide (such as $Al_2O_3$), a silicon oxide (such as $SiO_2$), a silicon nitride (such as $Si_3N_4$), a magnesium oxide (such as MgO), a TEOS, an aluminum nitride (such as AlN), and/or one or more combinations thereof) is deposited or formed prior to etching the first dielectric layer (which, in this embodiment, is a magnetic tunnel barrier of the MTJ stack/structure); notably, at least portion of a first encapsulation layer is transformed to insulative material during and/or after depositing or forming the second encapsulation layer;

FIGS. 12A-12F illustrate cross-sectional views of different embodiments of a more fully formed MTJ stack/structure according to at least certain aspects of certain embodiments of the present inventions wherein certain of the embodiments include additional encapsulation layer(s) and/or hard mask(s) that is/are employed in the manufacture of the MTJ stack/structure after etching a dielectric layer to provide a magnetic tunnel barrier of the MTJ stack/structure as illustrated in FIG. 11J; for example, in FIG. 12B, after deposition or formation of the second encapsulation layer and etching the first dielectric layer(s) (which forms the magnetic tunnel barrier) and the first magnetic materials layer(s) (for example, the fixed magnetic region or the free magnetic region), an additional encapsulation layer and/or hard mask is deposited or formed on the partially formed stack/structure including the magnetic tunnel barrier and the first magnetic materials layer(s), wherein thereafter, the electrically conductive layer(s) is etched to form a bottom electrode of the MTJ stack/structure;

FIGS. 13A and 13B illustrate cross-sectional views of a MTJ stack/structure at selected stages of exemplary manufacturing to expose the top electrode to facilitate electrical contact to the MTJ stack/structure in accordance with the embodiment of the FIG. 12B wherein an insulating material (for example, a silicon oxide (such as $SiO_2$), a silicon nitride (such as $Si_3N_4$) and/or a TEOS) is deposited and thereafter portions removed (via, for example, CMP), together with the mask employed to form a first portion of the MTJ stack/structure (see, FIG. 11E); notably, in one embodiment, the mask is not removed and forms a portion of an electrode of the MTJ stack/structure;

FIGS. 14A-14D illustrate cross-sectional views of layers included in a MTJ stack/structure at various stages of an exemplary manufacturing process of a second aspect of the inventions for fabricating a partially formed exemplary MTJ stack/structure according to at least certain aspects of certain embodiments of the present inventions wherein, the first encapsulation layer is an insulative material or conductive material (which is oxidized or nitridized (for example, a metal such as aluminum and/or magnesium which is oxidized)) (see FIG. 14A), and, after removal of the re-deposited material (see FIG. 14B), a second encapsulation layer of an insulative material or a conductive material is deposited or formed prior to etching the first dielectric layer (see FIG. 14C); notably, the partially formed MTJ stack/structure of FIG. 14D may be further fabricated via techniques generally illustrated in FIGS. 12A-12F, 13A and 13B to more fully manufacture/form an embodiment of the MTJ stack/structure according to one or more aspects of the present inventions;

FIGS. 15A-15G illustrate cross-sectional views of layers included in a MTJ stack/structure at various stages of an exemplary manufacturing process of a second aspect of the inventions for fabricating a partially formed exemplary MTJ stack/structure according to at least certain aspects of certain embodiments of the present inventions wherein, the first encapsulation layer is a conductive material, and, after removal of the re-deposited material (see FIG. 15C), a second encapsulation layer of an insulative material or a conductive material (which is oxidized or nitridized (for example, a metal such as aluminum and/or magnesium which is oxidized)) is deposited or formed (see FIG. 15E)) wherein during or after deposition or formation of the second encapsulation layer, at least a portion of the material of the first encapsulation layer is transformed to an insulative material; in this embodiment, at least a third encapsulation layer is deposited (see FIG. 15F) prior to etching the first dielectric layer; notably, the partially formed MTJ stack/structure of FIG. 15G may be further processed via techniques generally illustrated in FIGS. 12A-12F, 13A and 13B to more fully manufacture/form an embodiment of the MTJ stack/structure according to one or more aspects of the present inventions;

FIGS. 16A-16G illustrate cross-sectional views of layers included in a MTJ stack/structure at various stages of another exemplary manufacturing process of a second aspect of the inventions for fabricating a partially formed exemplary MTJ stack/structure according to at least certain aspects of certain embodiments of the present inventions wherein, the first encapsulation layer is a conductive material, and, after removal of the re-deposited material (see FIG. 16C), a second encapsulation layer of an insulative material or a conductive material (which is oxidized or nitridized (for example, a metal such as aluminum and/or magnesium which is oxidized)) is deposited or formed (see FIG. 16E)) wherein during or after deposition or formation of the second encapsulation layer, at least a portion of the material of the first encapsulation layer is transformed to an insulative material; at least a third encapsulation layer, which is an insulative material or a conductive material (which, thereafter may be at least partially transformed to an insulative material via, for example, oxidization or nitridization) is deposited (see FIG. 16F) prior to etching the first dielectric layer; notably, the partially formed MTJ stack/structure of FIG. 16G may be further processed via techniques generally illustrated in FIGS. 12A-12F, 13A and 13B to more fully manufacture/form an embodiment of the MTJ stack/structure according to one or more aspects of the present inventions; and FIGS. 17A-17G illustrate cross-sectional views of layers included in a MTJ stack/structure at various stages of another exemplary manufacturing process of a second aspect of the inventions for fabricating a partially formed exemplary MTJ stack/structure according to at least certain aspects of certain embodiments of the present inventions wherein, the first encapsulation layer is a conductive material (which, thereafter is at least partially transformed to an insulative material via, for example, oxidization or nitridization), and, after removal of the re-deposited material (see FIG. 17D), a second encapsulation layer of an insulative material or a conductive material (which may be oxidized or nitridized (for example, a metal such as aluminum and/or magnesium which is oxidized)) is deposited or formed (see FIG. 17E)), and at least a third encapsulation layer, which is an insulative material or a conductive material (which, thereafter may be transformed to an insulative material via, for example, oxidization or nitridization) is deposited (see FIG. 17F) prior to etching the first dielectric layer; notably, the partially formed MTJ stack/structure of FIG. 17G may be further processed via techniques generally illustrated in FIGS. 12A-12F, 13A and 13B to more fully manufacture/form an embodiment of the MTJ stack/structure according to one or more aspects of the present inventions;

FIG. 18 is an exemplary schematic diagram of a magnetoresistive memory stack/structure electrically connected to an access transistor in a magnetoresistive memory cell configuration; and FIGS. 19A and 19B are schematic block diagrams of integrated circuits including discrete memory device and an embedded memory device, each including MRAM (which, in one embodiment is representative of one or more arrays of MRAM having a plurality of magnetoresistive memory stacks/structures according to according to at least certain aspects of certain embodiments of the present inventions.

Again, there are many inventions described and illustrated herein. The present inventions are neither limited to any single aspect nor embodiment thereof, nor to any combinations and/or permutations of such aspects and/or embodiments. Each of the aspects of the present inventions, and/or embodiments thereof, may be employed alone or in combination with one or more of the other aspects of the present inventions and/or embodiments thereof. For the sake of brevity, many of those combinations and permutations are not discussed separately herein.

DETAILED DESCRIPTION

The following detailed description is merely illustrative in nature and is not intended to limit the embodiments of the subject matter or the application and uses of such embodiments. Any implementation described herein as exemplary is not to be construed as preferred or advantageous over other implementations. Rather, the term "exemplary" is used in the sense of "example" or "illustrative".

For simplicity and clarity of illustration, the figures depict the general structure and/or manner of construction of the various embodiments. Descriptions and details of well-known features and techniques may be omitted to avoid unnecessarily obscuring other features. Elements in the figures are not necessarily drawn to scale; the dimensions of some features may be exaggerated relative to other elements to improve understanding of the example embodiments. For example, one of ordinary skill in the art appreciates that the cross-sectional views are not drawn to scale and should not be viewed as representing proportional relationships between different layers. The cross-sectional views are provided to help illustrate the processing steps performed by simplifying the various layers to show their relative positioning. Moreover, while certain layers and features are illustrated with straight 90-degree edges, in actuality or practice such layers may be more "rounded" and gradually sloping.

The terms "comprise," "include," "have" and any variations thereof are used synonymously to denote or describe non-exclusive inclusion. As such, a process, method, article, or apparatus that uses such terms does not include only those steps, structure or elements but may include other steps, structures or elements not expressly listed or inherent to such process, method, article, or apparatus.

Further, the terms "first," "second," and the like, herein do not denote any order, quantity, or importance, but rather are used to distinguish one element from another. Moreover, the terms "a" and "an" herein do not denote a limitation of quantity, but rather denote the presence of at least one of the referenced item.

For the sake of brevity, conventional techniques related to semiconductor processing may not be described in detail herein. The exemplary embodiments may be fabricated using known lithographic processes. The fabrication of integrated circuits, microelectronic devices, micro electro mechanical devices, microfluidic devices, and photonic devices involves the creation of several layers of materials that interact in some fashion. One or more of these layers may be patterned so various regions of the layer have different electrical or other characteristics, which may be interconnected within the layer or to other layers to create electrical components and circuits. These regions may be created by selectively introducing or removing various materials. The patterns that define such regions are often created by lithographic processes. For example, a layer of photoresist is applied onto a layer overlying a wafer substrate. A photo mask (containing clear and opaque areas) is used to selectively expose the photoresist by a form of radiation, such as ultraviolet light, electrons, or x-rays. Either the photoresist exposed to the radiation, or that not exposed to the radiation, is removed by the application of a developer. An etch may then be employed/applied whereby the layer not protected by the remaining resist is patterned. Alternatively, an additive process can be used in which a structure is built up using the photoresist as a template.

Although the magnetoresistive device or structure is illustrated as being fabricated and disposed on an electrically conductive electrode, which is disposed on the substrate, such electrically conductive electrode may be disposed above the substrate, for example, on an insulation material or a conductive material (for example, a conductor or via that is electrically connected to one to more other layers of the integrated circuit including, for example, an active element (for example, a transistor device)) that is on or above the substrate. Notably, in one embodiment, the magnetoresistive device or structure does not include one or both of the electrically conductive electrodes; for the sake of brevity, such embodiments will not be illustrated separately.

As noted above, there are many inventions described and illustrated herein, as well as many aspects and embodiments of those inventions. In one aspect, the described embodiments relate to, among other things, methods of manufacturing a magnetoresistive device having one or more electrically conductive electrodes or conductors on either side of a magnetic material stack. As described in further detail below, the magnetic material stack may include many different layers of material, where some of the layers include magnetic materials, whereas others do not. In one embodiment, the methods of manufacturing include forming the layers for the magnetoresistive device and then masking and etching those layers to produce an MTJ stack/structure.

Magnetoresistive structures or stacks are typically formed to include or on a top electrode and a bottom electrode that permit access to the device by allowing for connectivity to circuitry and other elements of the magnetoresistive device. Between the electrodes is a set of layers or regions, including at least one fixed magnetic layer or region (hereinafter collectively, "fixed magnetic region"), at least one free magnetic layer or region (hereinafter collectively, "free magnetic region") which is, and one or more dielectric layers or regions (hereinafter collectively, "dielectric layer")—including at least one dielectric layer, disposed between a fixed magnetic region and the free magnetic region, to provide a tunnel barrier layer or region (hereinafter collectively, "MTJ" or "tunnel barrier layer").

In one embodiment, the fixed magnetic region may achieve its fixed magnetization based on (i) an antiferromagnetic material (for example, platinum manganese (PtMn), iron manganese (FeMn) and/or (ii) one or more pinned or unpinned SAF or SyF which typically include one or more layers of ferromagnetic material layers (cobalt (Co), iron (Fe), nickel (Ni)) separated by one or more non-magnetic materials layers (for example, ruthenium (Ru), copper (Cu), aluminum (Al)). In addition thereto, or in lieu thereof, in other embodiments, the fixed magnetization may be achieved through other means, including the manner in which the fixed magnetic region is formed (for example, via shape anisotropy). Indeed, in one embodiment, the fixed magnetic region is provided via an unpinned, fixed SAF.

In one embodiment, the free magnetic region is comprised of a plurality ferromagnetic materials (Co, Fe and/or Ni). The free magnetic region may also include one or more non-magnetic materials (for example, one or more non-ferromagnetic transition metals, such as tantalum (Ta), titanium (Ti), tungsten (W) and/or molybdenum (Mo)). (See, for example, U.S. Pat. No. 8,686,484).

The MTJ structure/stack may include one or more dielectric layers wherein at least one dielectric layer is disposed between the fixed magnetic region and the free magnetic region and provides the tunnel barrier layer therebetween. (See, for example, U.S. Pat. Nos. 8,686,484 and 9,136,464).

Figure 1:
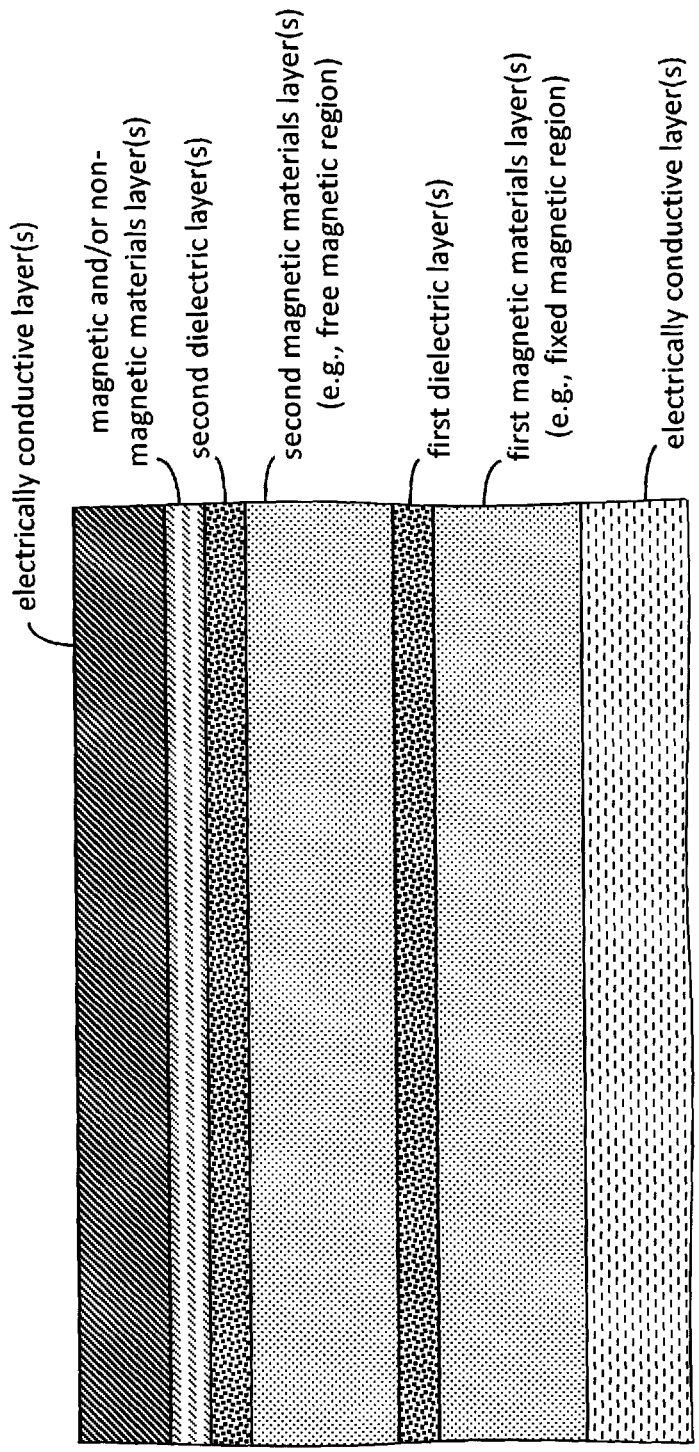
FIG. 1 illustrates a cross-sectional view of layers that, after manufacturing, will form or provide a MTJ stack/structure (for example, an in-plane or out-of-plane (e.g., perpendicular) magnetic anisotropy magnetoresistive device or structure) according to at least certain aspects of certain embodiments of the present inventions; the arrangement of the layers (and materials thereof) is exemplary and other arrangements, configurations and/or materials of the various layers are suitable and intended to fall within the scope of the present inventions; notably, the magnetic materials layer(s) (which, after processing, form the free magnetic layer/region or the fixed magnetic layer/region) may include one or more layers of materials (for example, Nickel (Ni), Iron (Fe), Cobalt (Co), Palladium (Pd), Platinum (Pt), Magnesium (Mg), Manganese (Mn), Chromium (Cr) and alloys thereof) as well as one or more synthetic antiferromagnetic structures (SAF) or synthetic ferromagnetic structures (SYF) wherein one or more layers of magnetic materials layers may also include one or more non-magnetic materials layers (for example, Ruthenium (Ru), Copper (Cu), Aluminum (Al), Tantalum (Ta), Titanium (Ti), and alloys thereof, and in certain embodiments, Tungsten (W) and Molybdenum (Mo); further the dielectric layers may be, for example, one or more layers of aluminum oxide and/or magnesium oxide; as mentioned above, such layers and/or materials thereof may be any type now known or later developed and/or arranged in any combination or permutation now known or later developed.

With reference to FIG. 1, the present inventions will be described and/or illustrated in the context of an exemplary layer architecture wherein one or more electrically conductive layers (which, after processing, forms a top conductive electrode) is/are disposed on or over a non-magnetic layer which is disposed on a dielectric layer(s) which is disposed on a magnetic region (for example, a free magnetic region) which consists of one or more ferromagnetic material layers and one or more non-magnetic material layers (e.g., insertion layer(s)). In this exemplary layer architecture, the free magnetic region is disposed on a dielectric layer(s) (which, after processing and in operation, is a magnetic tunnel barrier) and the dielectric layer(s) is disposed on a magnetic region (for example, a fixed magnetic region) which consists of one or more ferromagnetic material layers and one or more non-magnetic material layers (which, after processing may form a fixed, unpinned SAF). The magnetic region, in this embodiment, is disposed on one or more electrically conductive layers (which, after processing, becomes a "bottom" conductive electrode). (See, for example, the embodiment illustrated in FIG. 9 (among others) of U.S. Pat. No. 8,686,484, and the text associated therewith). Importantly, this layer architecture is merely exemplary; the present inventions may be implemented in conjunction with any layer organization or sequence of magnetic materials, non-magnetic materials and dielectric layers which are all intended to fall within the scope of the present inventions.

With continued reference to FIG. 1, in one embodiment, a plurality of layers of various materials have been previously and sequentially deposited, grown, sputtered and/or provided (hereinafter collectively "deposited" or various forms thereof (e.g., deposit or depositing)) which, after further processing, will be an MTJ stack of a magnetoresistive device. A mask layer may be deposited (for example, a hard mask layer) on one or more layers of electrically conductive materials. The mask layer may be deposited using any technique now known or later developed, for example, well known conventional techniques. In one embodiment, the mask layer includes and/or consists of a silicon oxide, silicon nitride and/or a material that is relatively inert to or during the etch process of one or more layers of electrically conductive materials (which, after patterning form the electrically conductive electrode) and one or more layers of magnetic materials (which, after patterning form the magnetic material stack). (See, for example, U.S. Pat. No. 8,747,680, which is incorporated by reference).

Figure 2A:
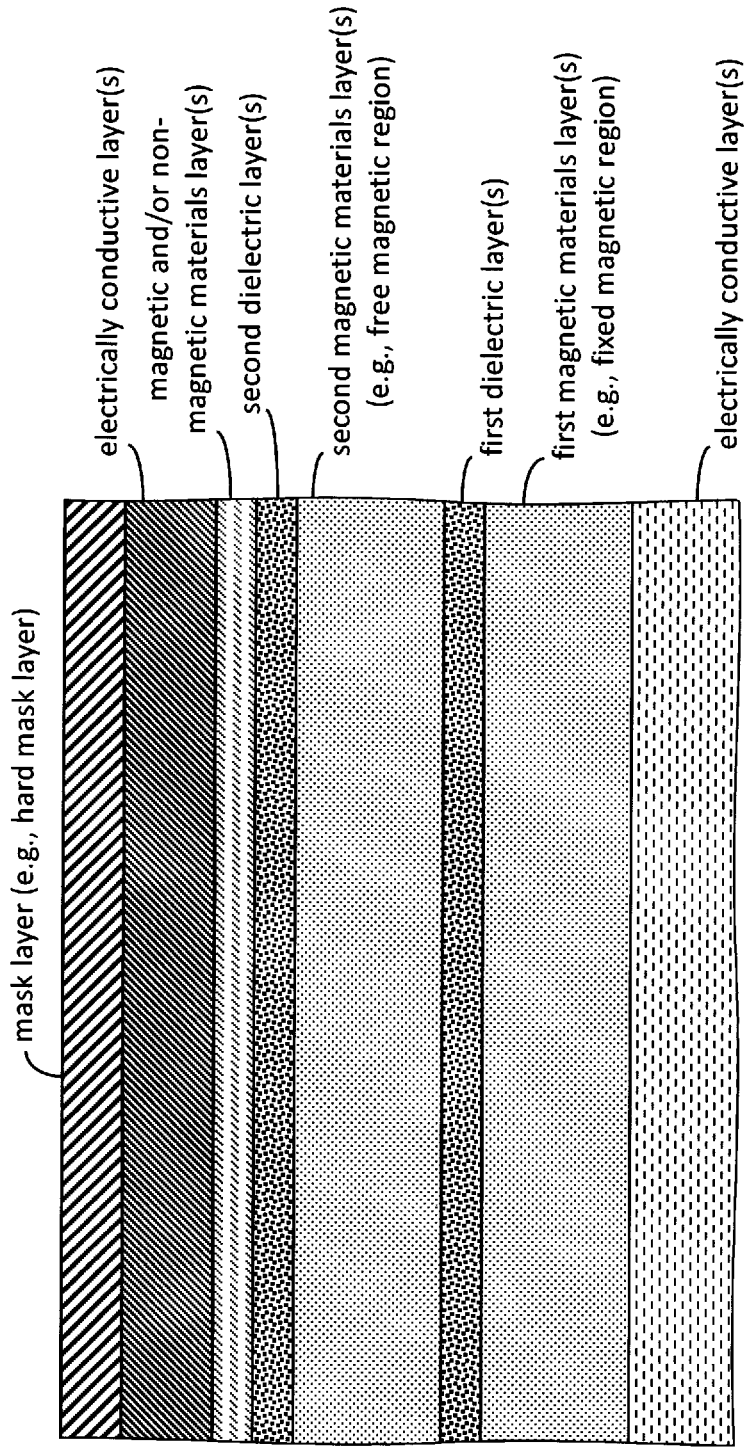
FIGS. 2A-2H illustrate cross-sectional views of layers included in a MTJ stack/structure at various stages of an exemplary manufacturing process for fabricating a partially formed exemplary MTJ stack/structure according to at least certain aspects of certain embodiments of the present inventions wherein, the first encapsulation layer is conductive material (for example, a metal such as aluminum and/or magnesium), the second encapsulation layer is an insulative material (for example, an aluminum oxide (such as $Al_2O_3$), a silicon oxide (such as $SiO_2$), a silicon nitride (such as $Si_3N_4$), a magnesium oxide (such as MgO), a tetraethylorthosilicate (TEOS), an aluminum nitride (such as AlN), and/or one or more combinations thereof), and the third encapsulation layer is a conductive or insulative material.
Figure 2B:
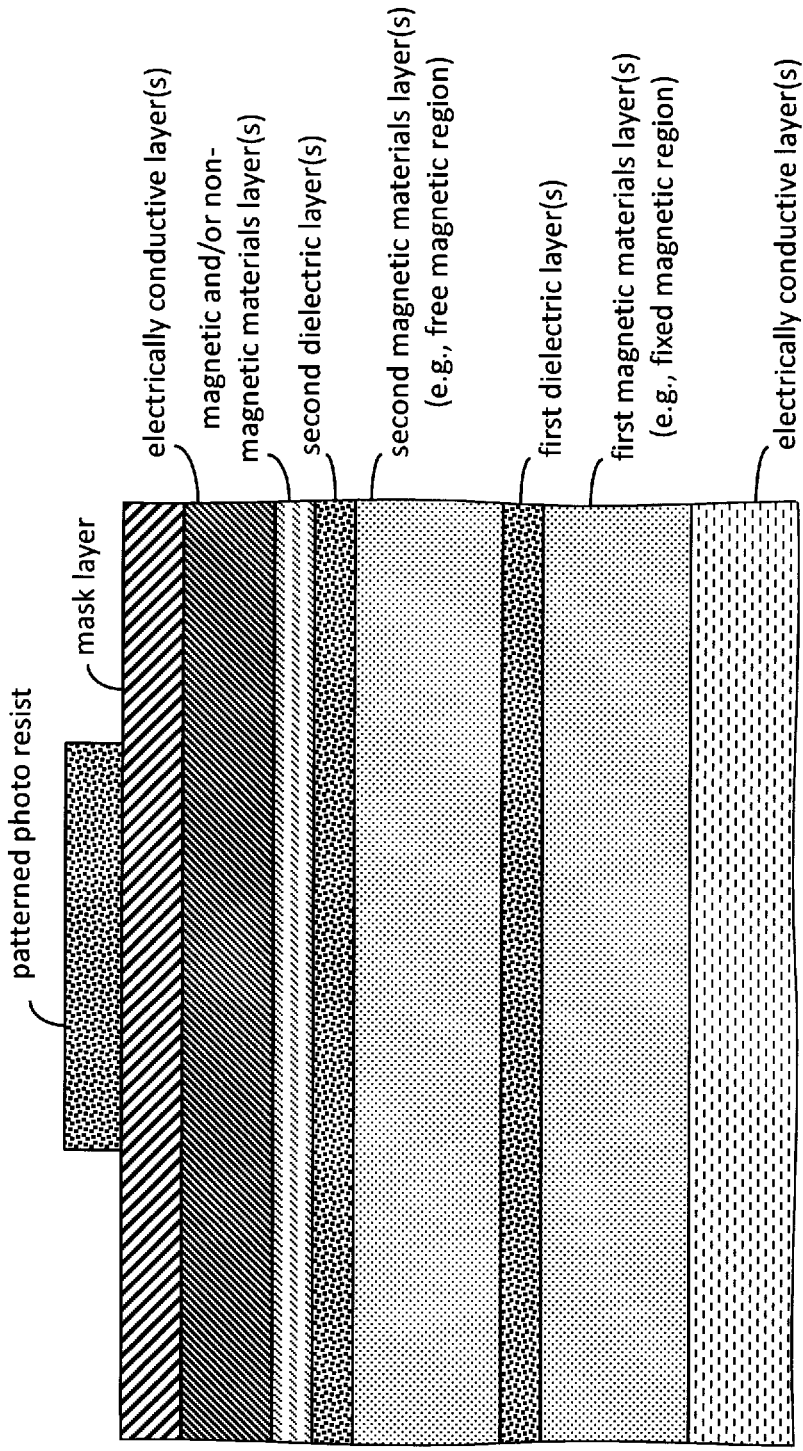

In one embodiment, after deposition of the mask layer (see FIG. 2A), a photo resist is deposited thereon and patterned to predetermined dimensions consistent with or correlated to selected dimensions of the electrically conductive electrode to be formed. (See, FIG. 2B). The photo resist may be deposited and patterned using any technique now known or later developed, for example, well known conventional deposition and lithographic techniques.

Figure 2C:
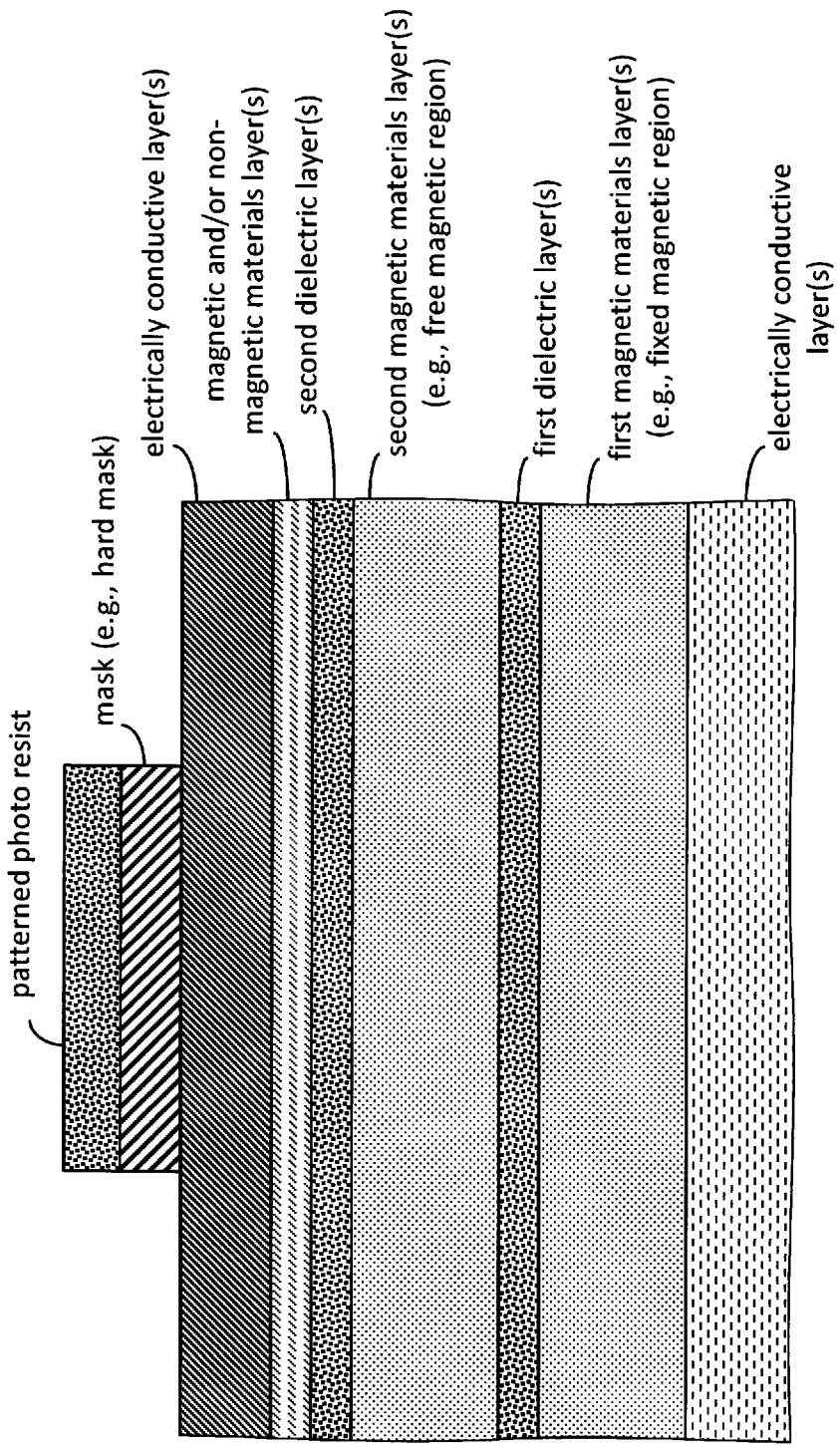

With reference to FIG. 2C, the mask layer is etched, for example, via mechanical etching (such as, for example, via sputter etching techniques) or chemical etching, to form or provide the mask. After forming or patterning the mask (having a predetermined pattern which is at least partially defined by the patterned photo resist), it may be advantageous to remove or strip the photo resist, for example, using conventional techniques.

Figure 2D:
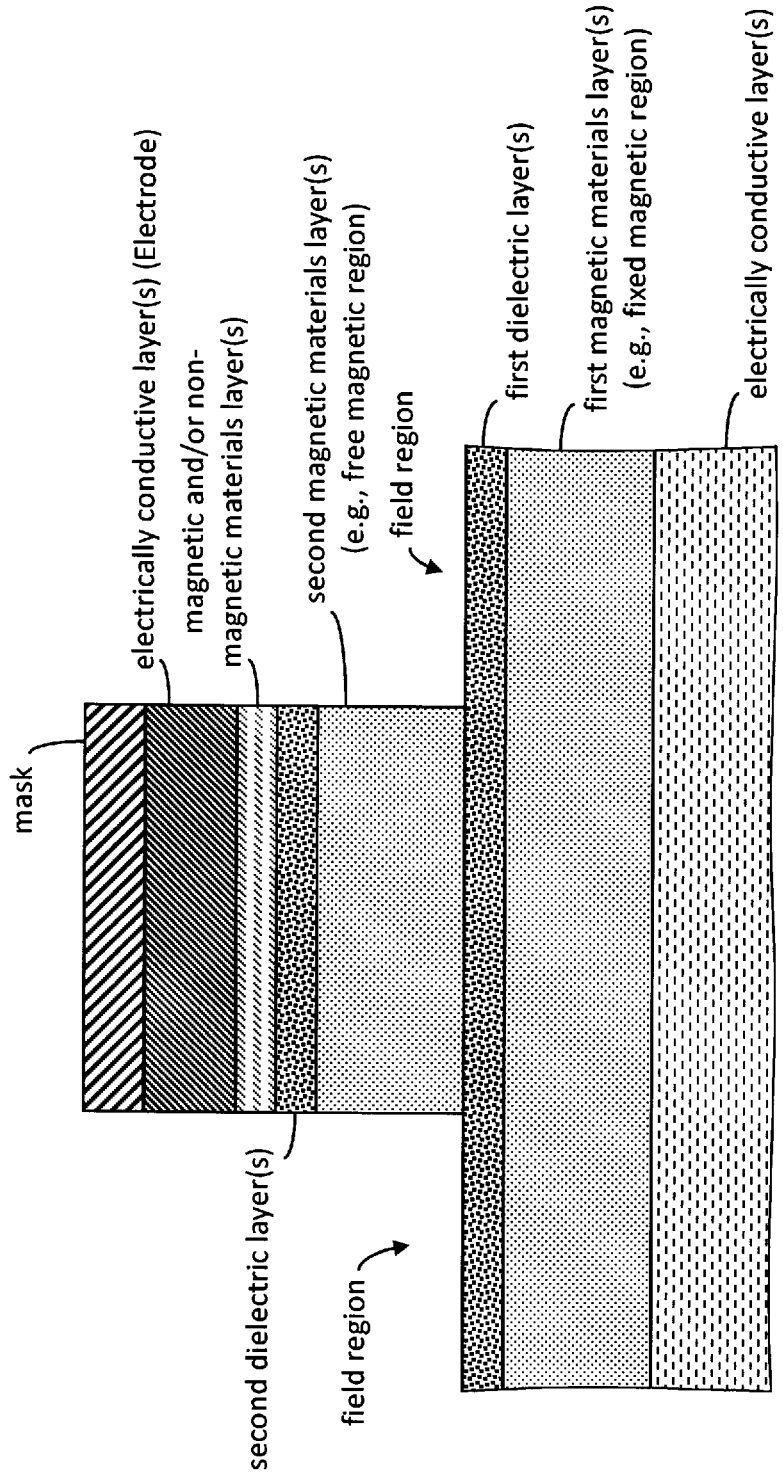

With reference to FIG. 2D, one or more layers of electrically conductive materials are then etched with the mask "protecting" certain portions thereof, to form, define, pattern and/or provide an electrically conductive electrode. The one or more layers of electrically conductive materials (for example, Tantalum (Ta), Tantalum-Nitride (TaN) or Ta—TaN composite) may be etched, formed and/or patterned using any etchants and/or technique now known or later developed—for example, using mechanical etchants and techniques (for example, sputter etchants and techniques) or chemical etching techniques.

After etching the one or more layers of electrically conductive materials and using the mask to "protect" the electrically conductive electrode, one or more other layers may be etched to form, define, pattern and/or provide a partially formed MTJ stack/structure (for example, the free magnetic region and the fixed magnetic region of the MTJ stack/structure). (See, FIG. 2D).

The etch process corresponding to the magnetic materials layer(s) may be time controlled/monitored or endpoint controlled/monitored. In one embodiment, the etch process of magnetic materials layers is stopped when endpoint monitoring detects a predetermined material, combination of materials and/or percentages. That is, the etch process terminates or stops upon detecting the material of the tunnel barrier layer(s) (i.e., one or more layer(s) of dielectric material) or upon detecting the material of the magnetic materials layer(s) after etching the tunnel barrier layer(s) (not illustrated). For example, in one particular embodiment, the etch process of magnetic materials layers is stopped when endpoint monitoring detects a predetermined material, for example, the material of the first dielectric layer (for example, Magnesium (Mg) or Magnesium-Oxide (MgO)), and/or the absence of a predetermined material. Here, the etch process terminates largely on the first dielectric layer (which will form the tunnel barrier layer) and before significant etching of the dielectric layer by monitoring the endpoint for a rise in one or more of the tunnel barrier material signals in the plasma based on optical emission spectra (OES). A drop or rise in the OES signal for the material of the dielectric layer or magnetic material of the region on or above dielectric layer may be monitored and, upon detection of signals corresponding to one or more tunnel barrier material(s), the etch process may be terminated.

Figure 2E:
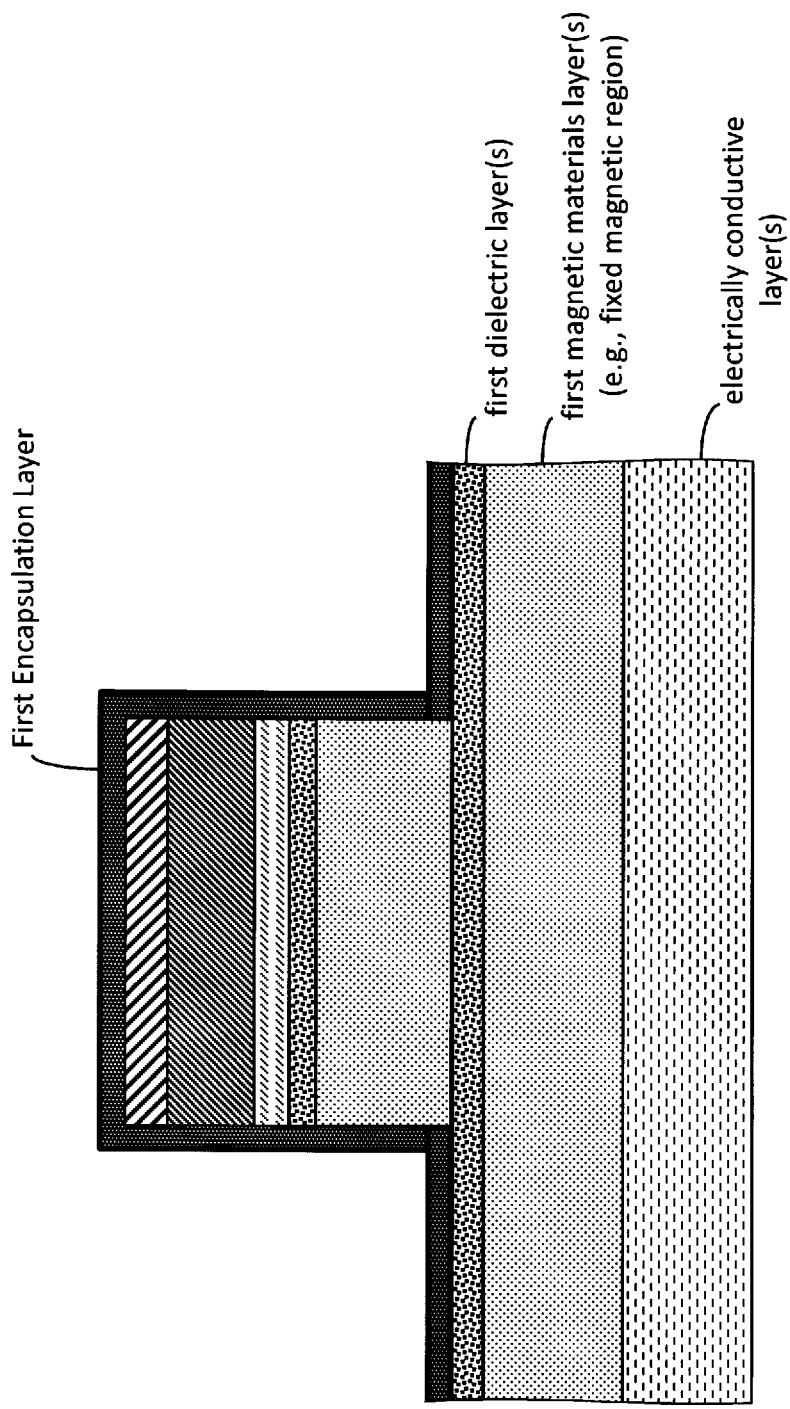

With reference to FIG. 2E, a first encapsulation layer is deposited on the partially formed MTJ stack/structure (for example, on all or substantially all of the exposed portions of the partially formed stack/structure—including the sidewalls thereof). In this embodiment, the first encapsulation layer is a conductive material (for example, a metal or metal alloy such as, example, aluminum or magnesium). In one embodiment, the first encapsulation layer has a thickness of less than 35 Angstrom. In a preferred embodiment, the thickness of the first encapsulation layer is between 10 and 25 Angstrom.

Figure 2F:
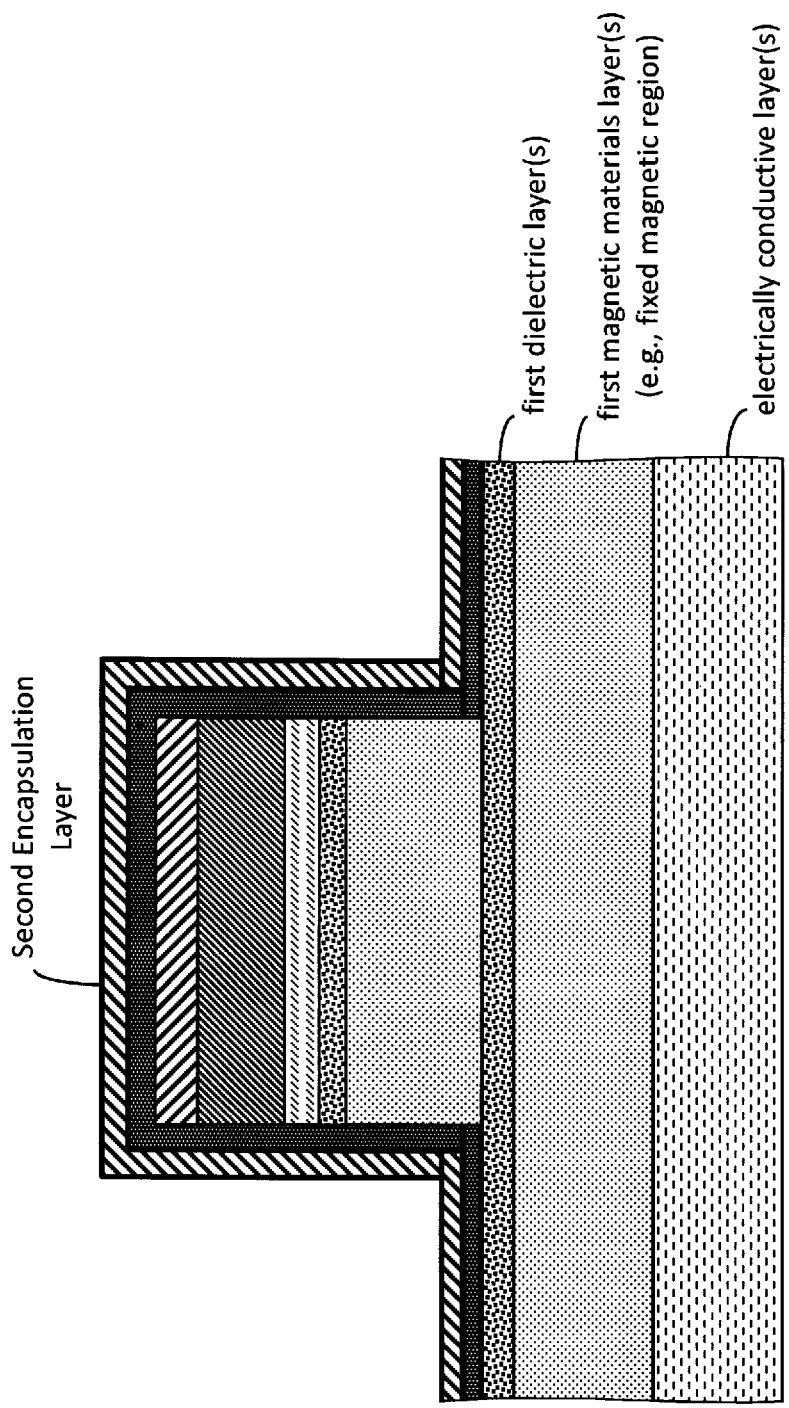

After deposition of the first encapsulation layer, a second encapsulation layer is deposited on or above the first encapsulation layer. (See, FIG. 2F). The second encapsulation layer may be an insulator material such as an aluminum oxide (such as $Al_2O_3$), a silicon oxide (such as $SiO_2$), a silicon nitride (such as $Si_3N_4$), a magnesium oxide (such as MgO), a TEOS, an aluminum nitride (such as AlN), and/or one or more combinations thereof). In one embodiment, the second encapsulation layer is initially deposited as a conductor (for example, a metal such as aluminum or magnesium) and thereafter oxidized or nitridized to change or transform at least a portion of the material of the second encapsulation layer to an insulative material. In another embodiment, the second encapsulation layer is deposited in one step as an insulator.

The second encapsulation layer may have a thickness of less than 50 Angstrom. In a preferred embodiment, the thickness of the second encapsulation layer is between 10 and 40 Angstrom. Indeed, in one embodiment, the thickness of the second encapsulation layer is a function of the oxidation or nitridation dose and the depth of absorption of the oxygen or nitrogen by the material of the second encapsulation layer during formation.

Notably, the first encapsulation layer, during the deposition or formation of the second encapsulation layer, may be at least partially transformed from a conductive material to an insulative material. That is, the electrical conductivity of at least a portion of the material of the first encapsulation layer is modified to be more insulative than conductive. For example, in one embodiment, during deposition or formation of the second encapsulation layer and/or after such deposition or formation (for example, after the MTJ stack/structure is subjected to various anneal process during formation of the magnetoresistive device and/or during operation of the magnetoresistive device), oxygen or nitrogen (for example, oxygen or nitrogen employed in the formation of the second encapsulation layer) may be "absorbed" by the material of the first encapsulation layer thereby modifying the electrical conductivity of the first encapsulation layer such that at least a portion of material of the first encapsulation layer is more insulative than conductive (for example, the material of the first encapsulation layer which is in contact with the sidewalls of the partially formed MTJ stack/structure).

Notably, in one embodiment, the thickness of the second encapsulation layer may also be a function of the thickness of the first encapsulation layer, the oxidation or nitridation dose and the depth of absorption of the oxygen or nitrogen by the material of the second encapsulation layer and the material of the first encapsulation layer (during deposition or formation of the second encapsulation layer and/or after such deposition or formation (for example, after the MTJ stack/structure is subjected to various anneal process during formation of the magnetoresistive device and/or during operation of the magnetoresistive device).

Figure 2G:
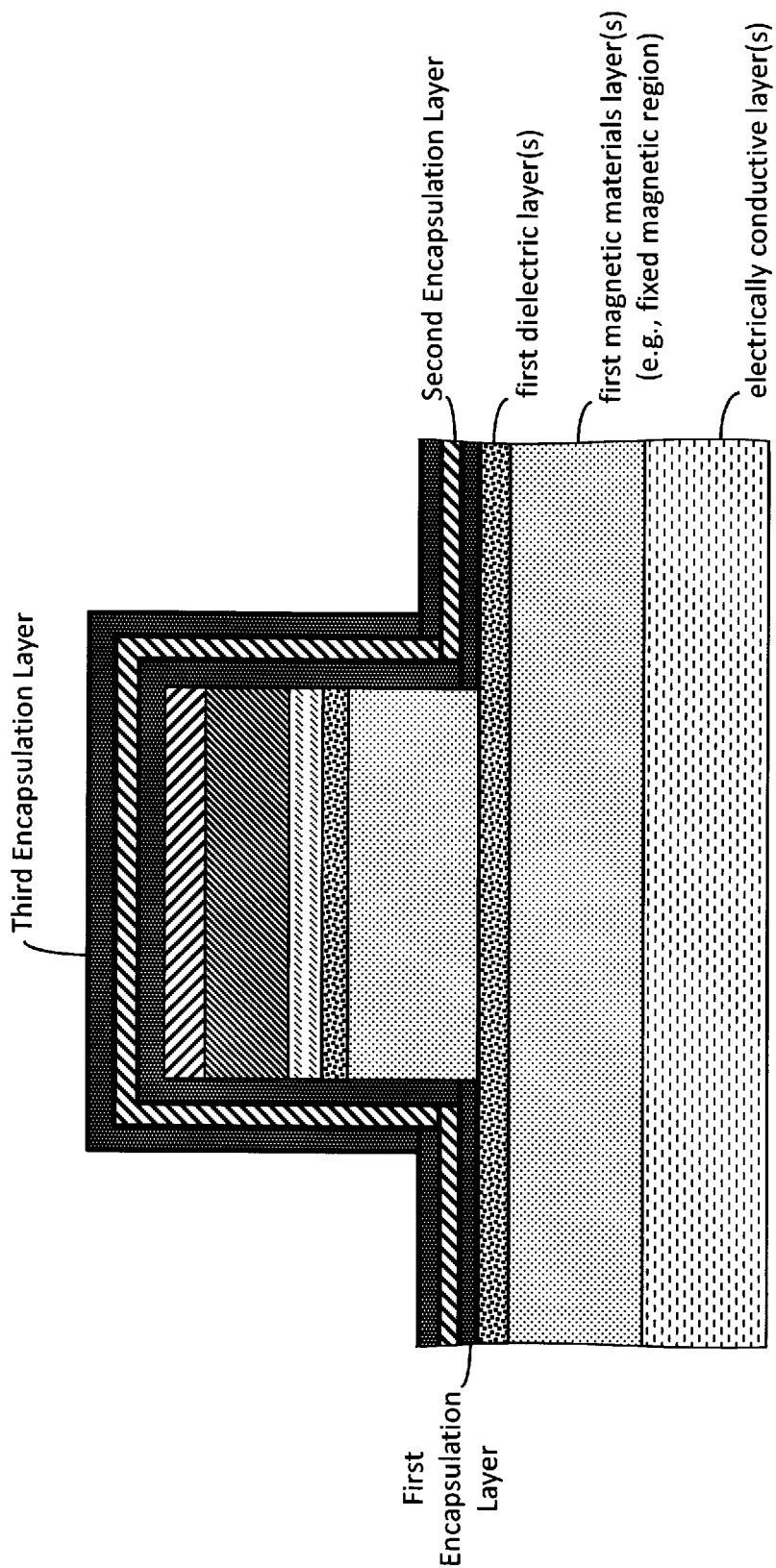

With reference to FIG. 2G, a third encapsulation layer is deposited. The third encapsulation layer may be a conductive or insulative material. The third encapsulation layer may be deposited as a metal and thereafter at least a portion thereof may be modified to an insulator or insulative material (for example, via oxidation or nitridation of the conductive material). In one embodiment, the third encapsulation layer includes a thickness to reduce the likelihood of defects or pin holes in the three encapsulation layer structure as well as provide an aggregate thickness of the first, second and third encapsulation layers that provides, defines and/or establishes a relative width or diameter of a free magnetic layer to the (i) fixed magnetic region and/or (ii) the first dielectric layer or magnetic tunnel barrier of the MTJ stack/structure, or vice versa.

For example, in one embodiment, the third encapsulation layer may have a thickness of less than 35 Angstrom. In a preferred embodiment, the thickness of the third encapsulation layer is between 10 and 25 Angstrom.

Notably, additional encapsulation layers may be provided to, among other things, further protect the partially formed MTJ stack/structure via, for example, reducing likelihood of defects or pinholes in the multilayer encapsulation structure and/or define or establish a relative width or diameter of a free magnetic layer relative to the (i) fixed magnetic region and/or (ii) the first dielectric layer or magnetic tunnel barrier of the MTJ stack/structure, or vice versa.

Figure 2H:
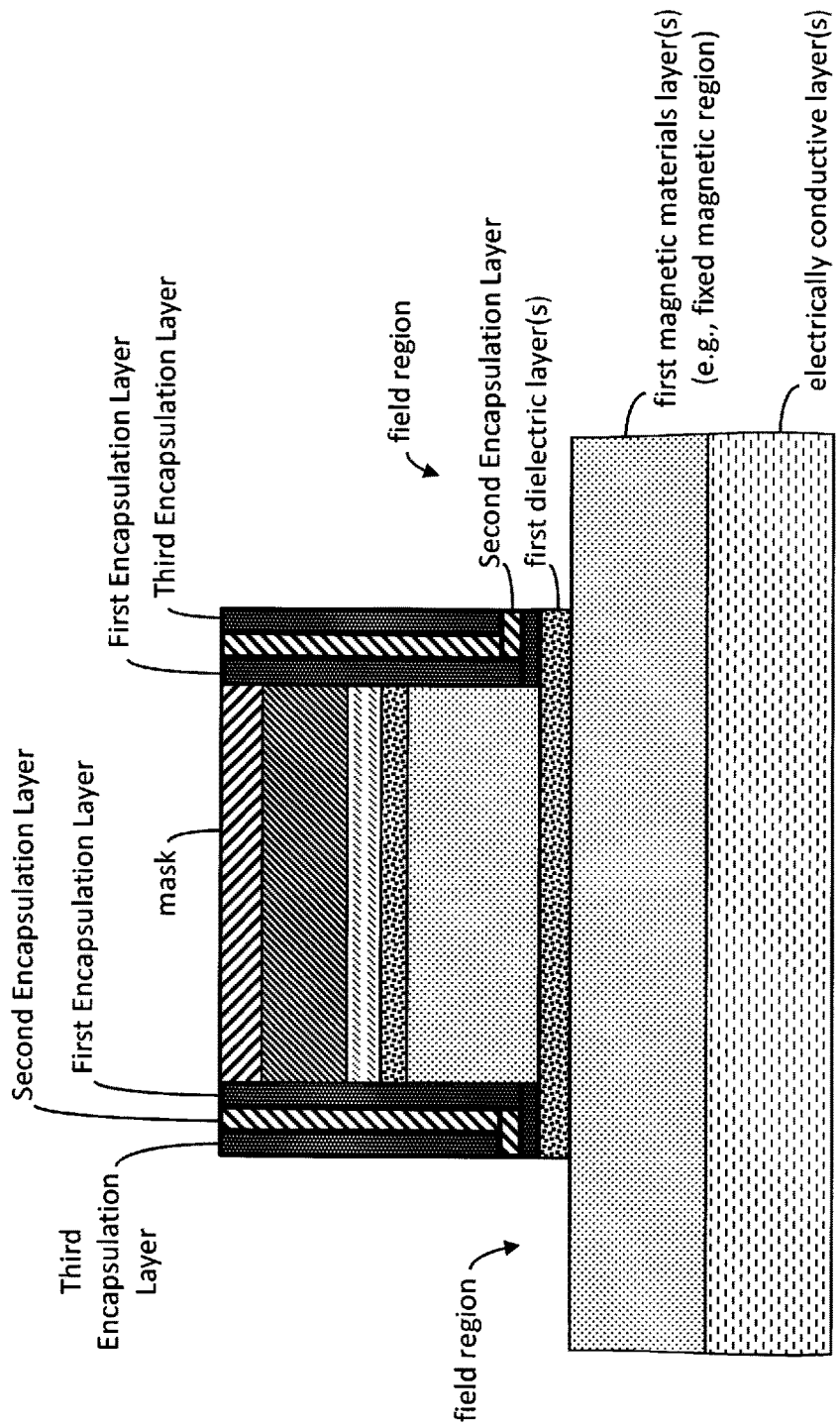

With reference to FIG. 2H, the first dielectric layer(s) is then etched (together with the encapsulation layers of the multilayer encapsulation structure disposed in the field areas) to form or define a magnetic tunnel barrier of the MTJ stack/structure. The first dielectric layer(s) (for example, AlOx or MgO) may be etched and/or patterned using any etchants and/or technique now known or later developed—for example, using physical etchants and etching techniques (for example, sputter etching techniques). It should be noted that the present inventions may employ any suitable etchants and techniques, whether now known or later developed, to etch the one or more layers of electrically conductive materials and thereby form, define and/or provide the tunnel barrier. With continued reference to FIG. 2H, a portion of the materials of the encapsulation layers may remain on the partially formed stack/structure, for example, on sidewalls of the partially formed stack/structure—including the magnetic materials.

Figure 3B:
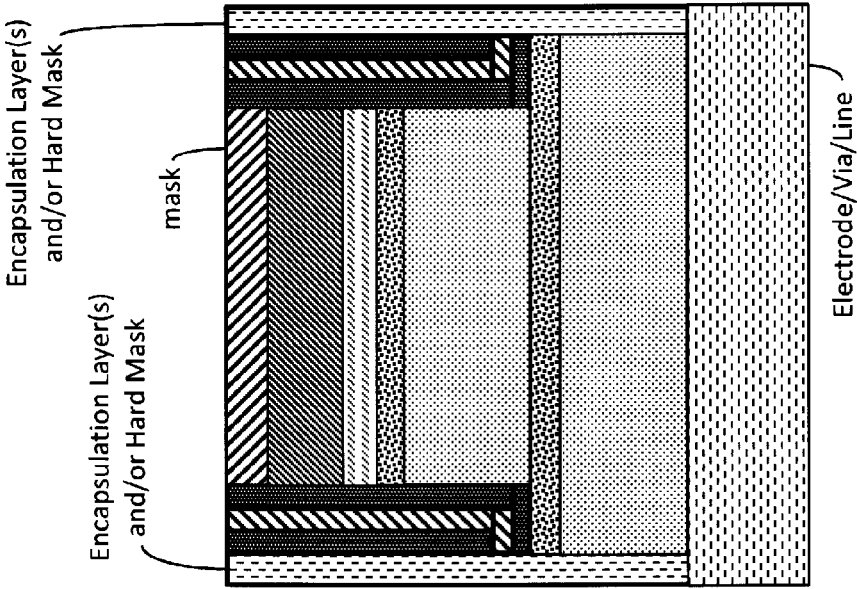
FIGS. 3A-3F illustrate cross-sectional views of different embodiments of a more fully formed MTJ stack/structure according to at least certain aspects of certain embodiments of the present inventions wherein certain of the embodiments include additional encapsulation layer(s) and/or hard mask(s) that is/are employed in the manufacture of the MTJ stack/structure after etching a dielectric layer to provide a magnetic tunnel barrier of the MTJ stack/structure as illustrated in FIG. 2H; for example, in FIG. 3B, after etching the first dielectric layer(s) (which forms the magnetic tunnel barrier) and the first magnetic materials layer(s) (for example, the fixed magnetic region or the free magnetic region), an encapsulation layer and/or hard mask is deposited or formed on the partially formed stack/structure, wherein thereafter, the electrically conductive layer(s) is etched to form a bottom electrode of the MTJ stack/structure.
Figure 3A:
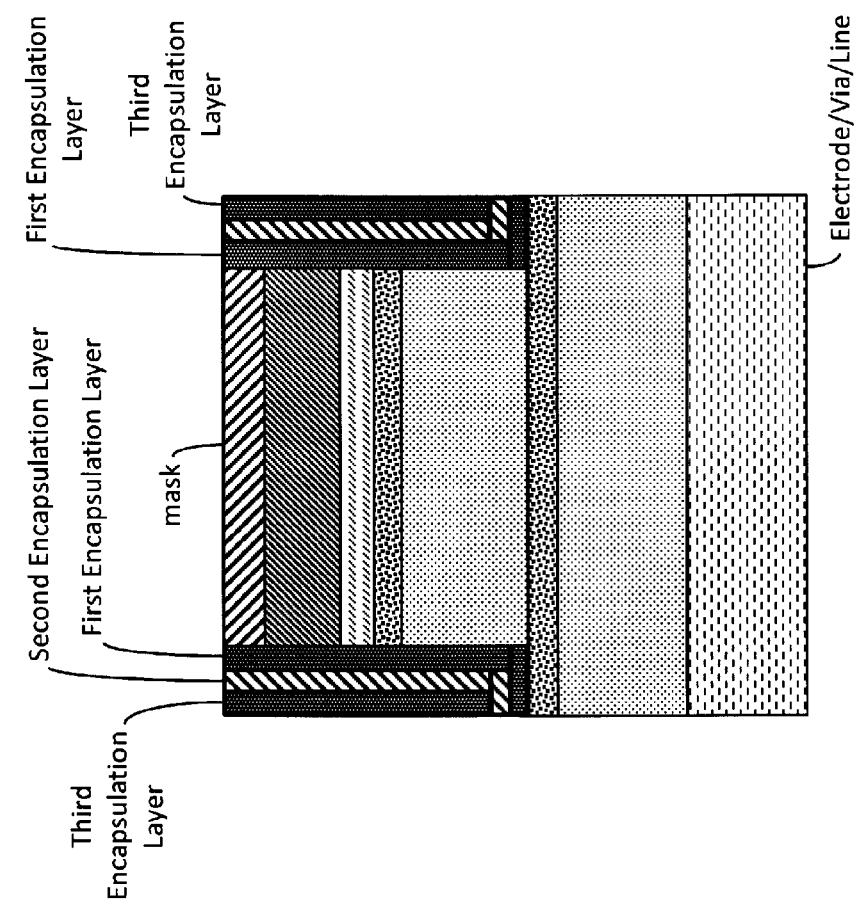
Figure 3C:
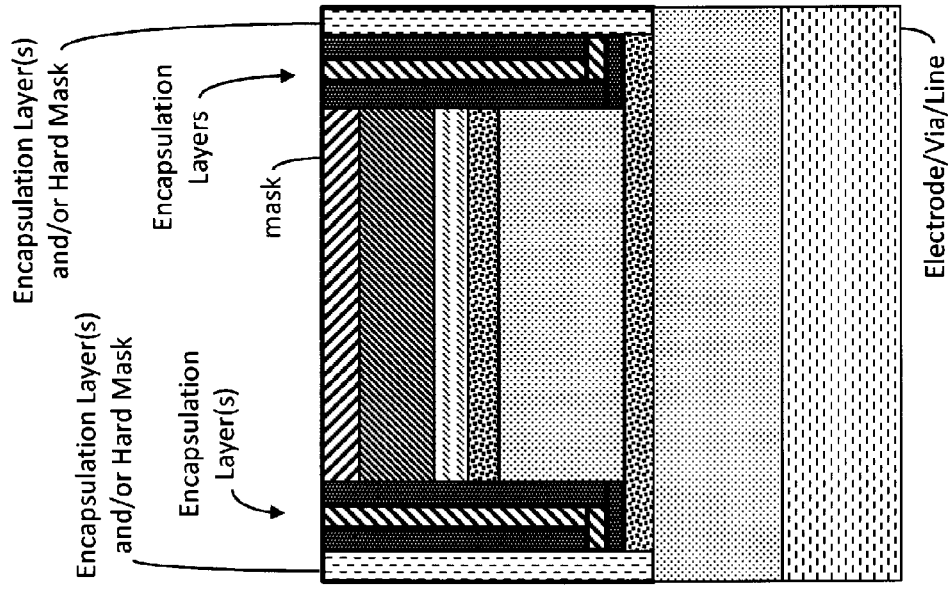
Figure 3D:
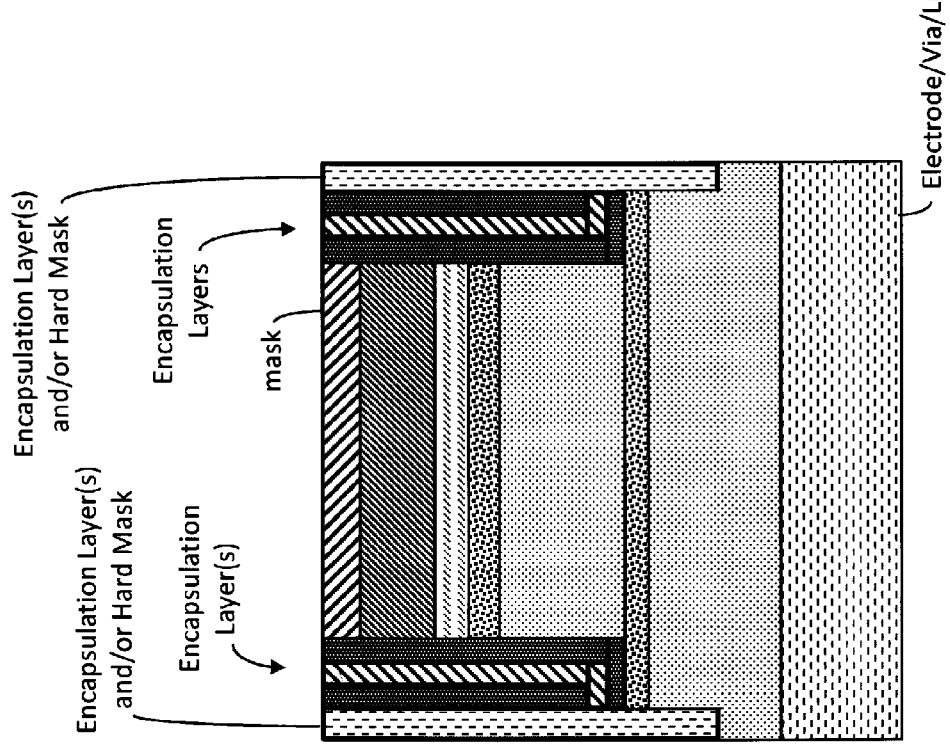
Figure 3F:
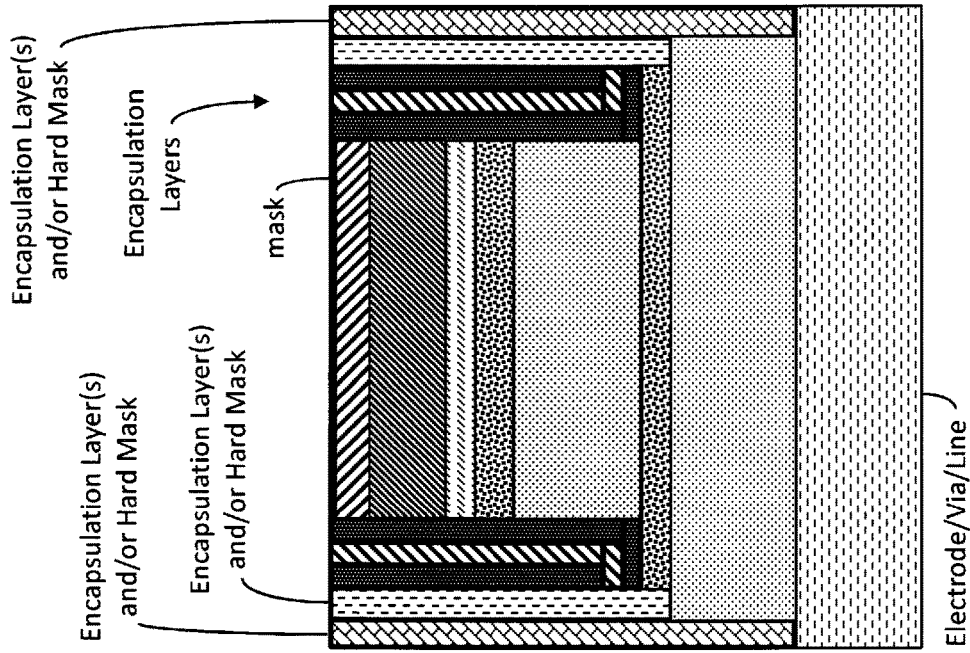
Figure 3E:
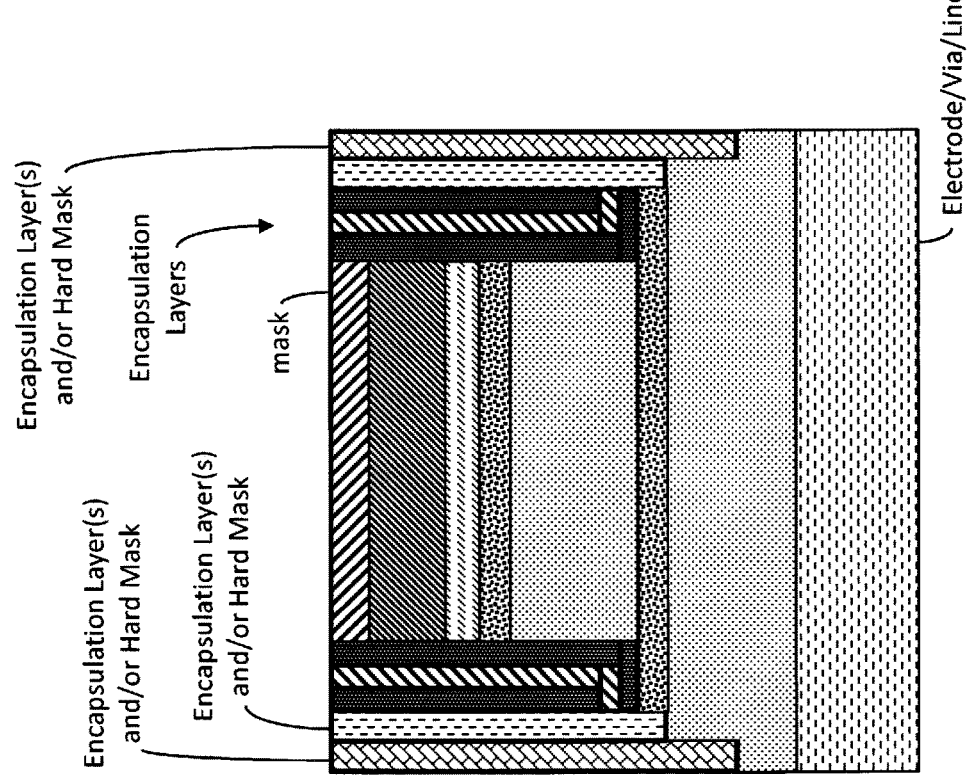

Thereafter, the remaining layers or regions of the MTJ stack/structure are processed and completed. (See, for example, FIGS. 3A-3F). During such processing, one or more additional encapsulation layers and/or hard masks may be deposited and/or formed. (See, for example, FIGS. 3B-3F). For example, in one embodiment, after etching the first dielectric layer (which may be comprised of or formed by deposition of multiple layers) and at least a portion of the first magnetic layers (which is disposed beneath the first dielectric layer), an encapsulation layer and/or hard mask may be deposited or formed over the partially formed structure (including the sidewalls of the magnetic tunnel barrier and first magnetic layers) and thereafter the bottom electrode is etched. (See, for example, FIGS. 3B and 3C). In another embodiment, after etching the first dielectric an encapsulation layer and/or hard mask may be deposited or formed over the partially formed structure, including the sidewalls of the magnetic tunnel barrier, and thereafter the first magnetic layers and the bottom electrode are etched. (See, for example, FIG. 3D). Notably, in yet another embodiment the first magnetic layers may be partially etched before deposition or formation of another encapsulation layer and/or hard mask (see, FIG. 3E) or fully etched (see, FIG. 3F).

Notably, one or more encapsulation layers employed to further process or complete the MTJ stack/structure (see FIGS. 3A-3F) may each consist of multiple layers wherein each layer may include a conductive material and/or an insulative material (as described herein in relation to formation of other portions of the MTJ stack/structure (see, for example, FIG. 2). Such encapsulation layers may be formed using any of the techniques described herein. In addition, all permutations of etching and encapsulation are intended to fall within the scope of the present inventions. Moreover, all techniques suitable may be employed to process and complete the MTJ stack/structure; such techniques are intended to fall within the scope of the present inventions.

Figure 4A:
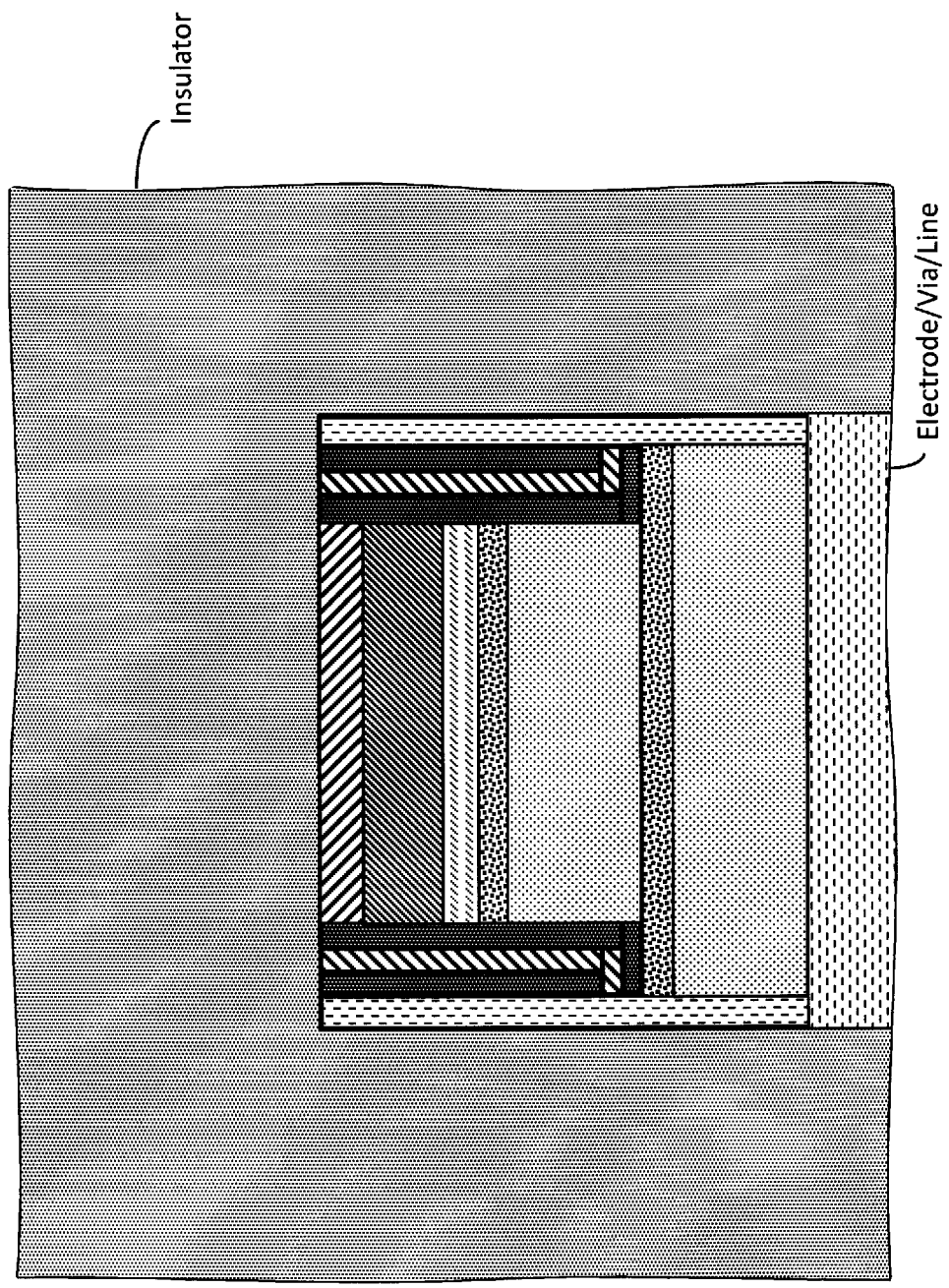
Figure 5A:
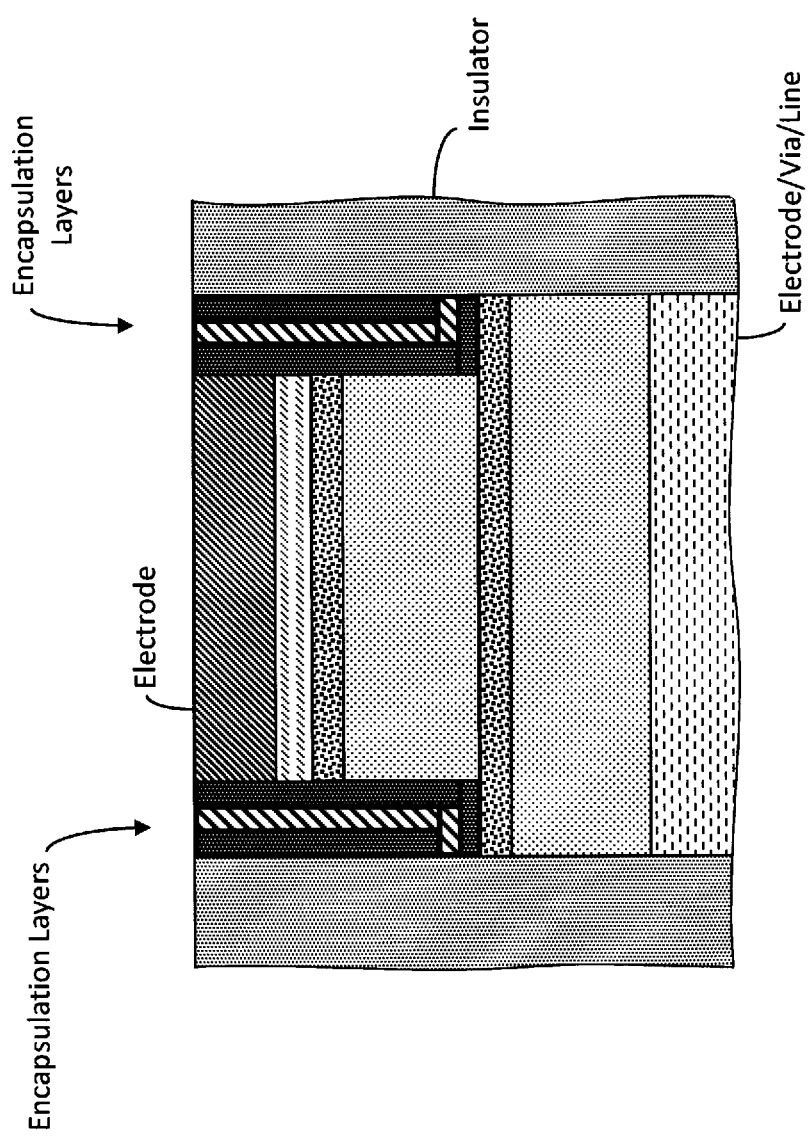
FIGS. 5A-5E illustrate cross-sectional views of a MTJ stack/structure of the various embodiments of FIGS. 3A and 3C-3F, respectively, after removal of the mask using the technique generally illustrated in FIGS. 4A and 4B.
Figure 5B:
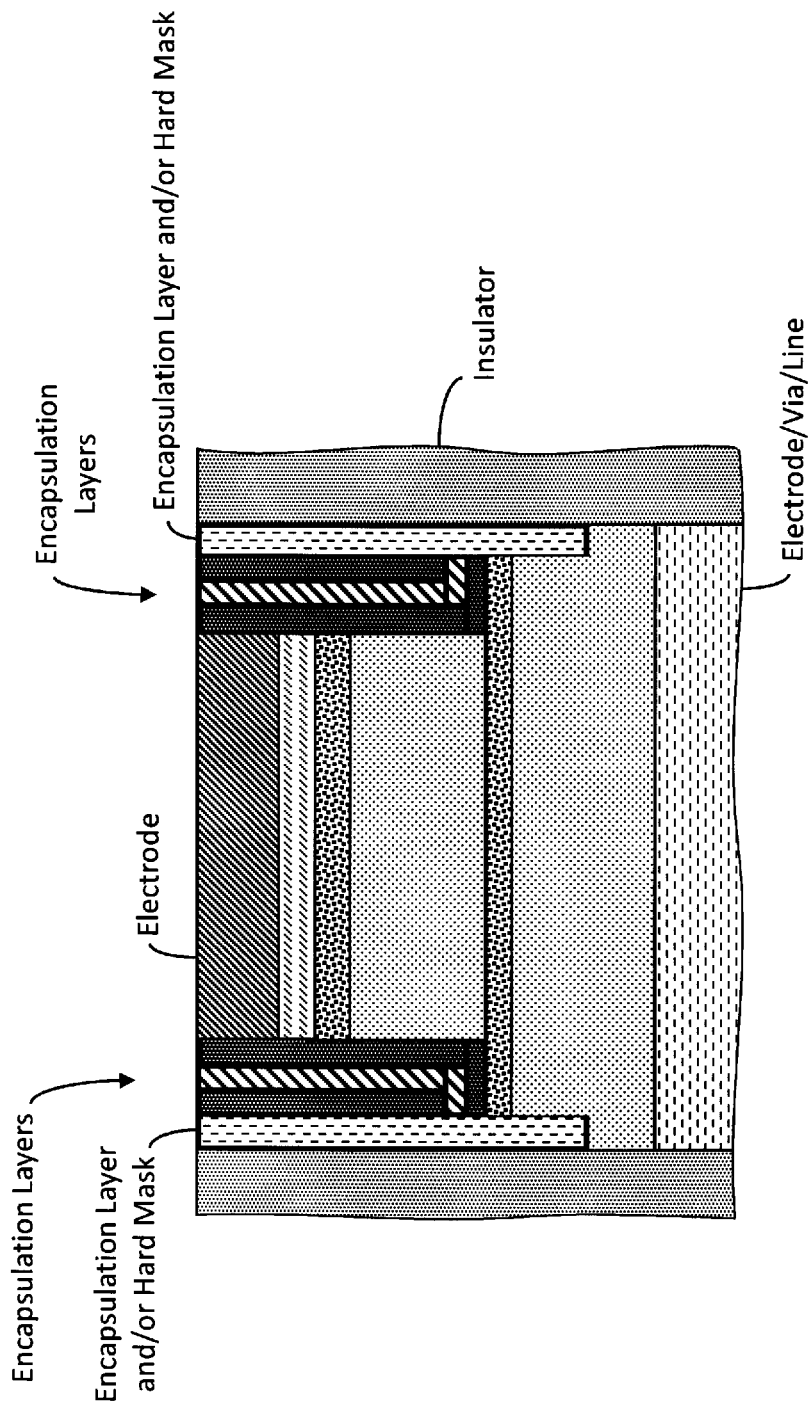
Figure 5C:
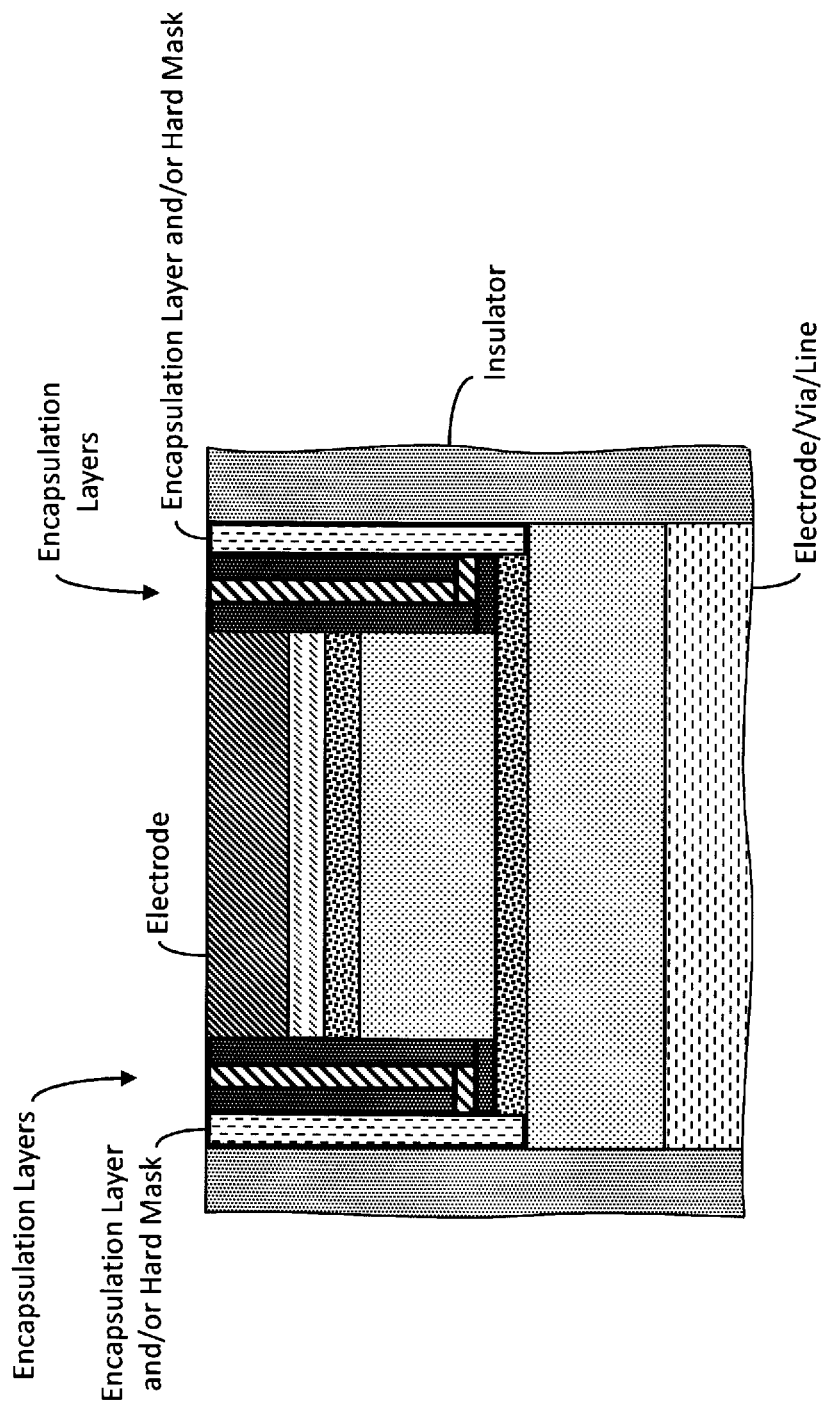
Figure 5D:
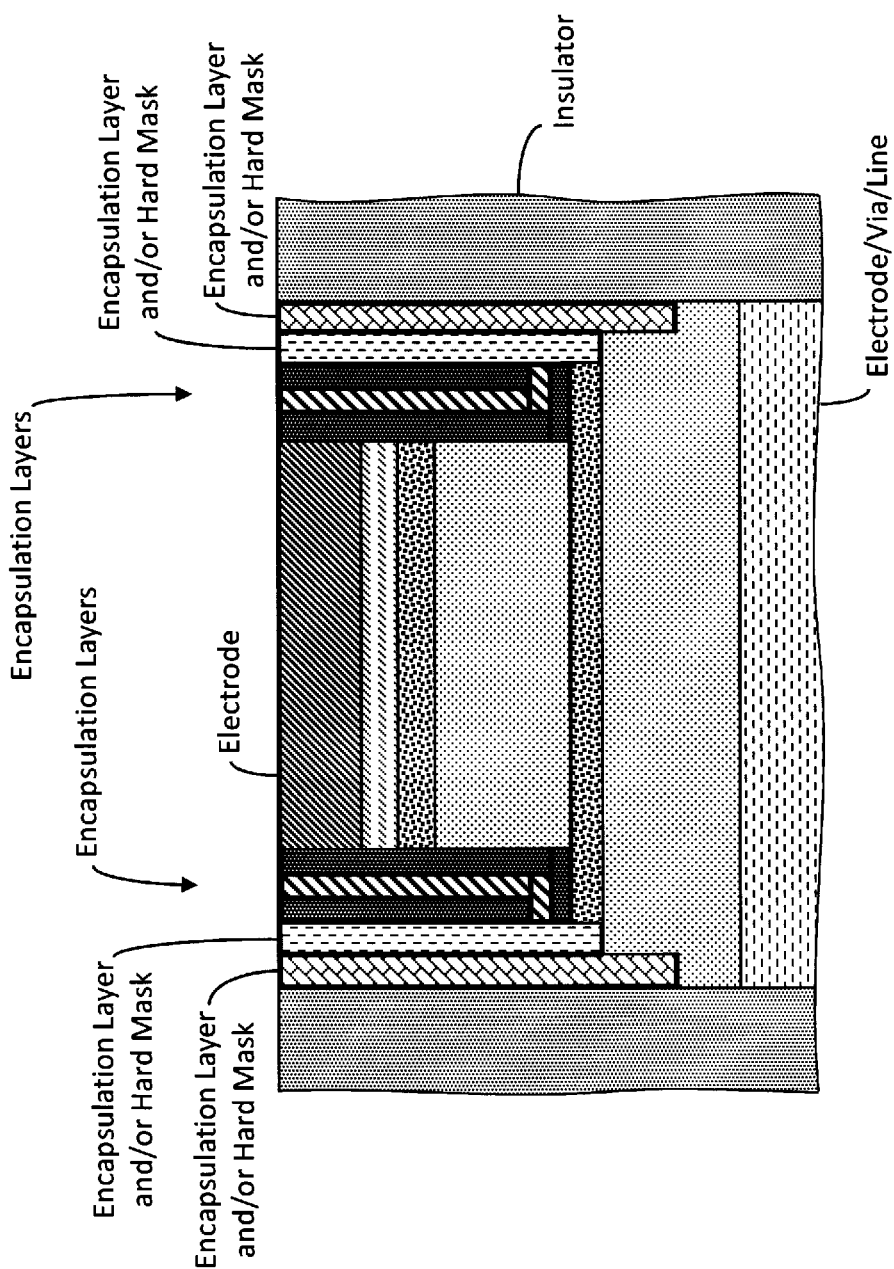
Figure 5E:
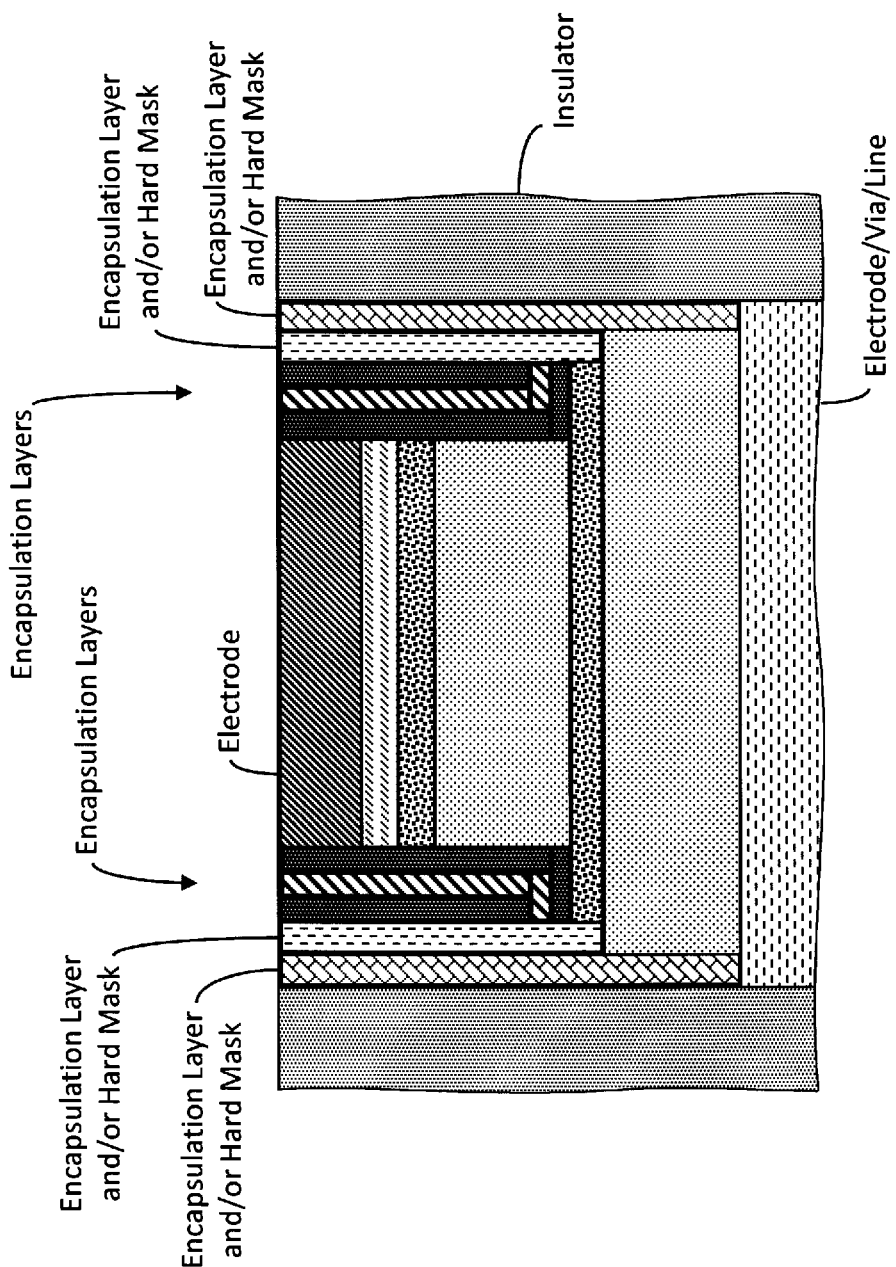

In those embodiments where the mask is removed to facilitate access (for example, electrical contact) to the MTJ stack/structure, an insulator/dielectric may be deposited over the entire stack/structure and field region (see FIG. 4A) and thereafter removed (e.g., via CMP) together with the mask which exposes the top electrode of the MTJ stack/structure (see FIG. 4B). This technique may be employed in connection with any of the techniques used to process and complete the MTJ stack/structure. (See, FIG. 5A-5E). Notably, in those embodiments where the mask is electrically conductive and employed as the top electrode, or a portion thereof, (see, for example, U.S. Pat. No. 9,023,219) the same process as illustrated in FIG. 4A may be implemented, however, removal of a portion of the insulator/dielectric terminates on or substantially on the mask.

Figure 6A:
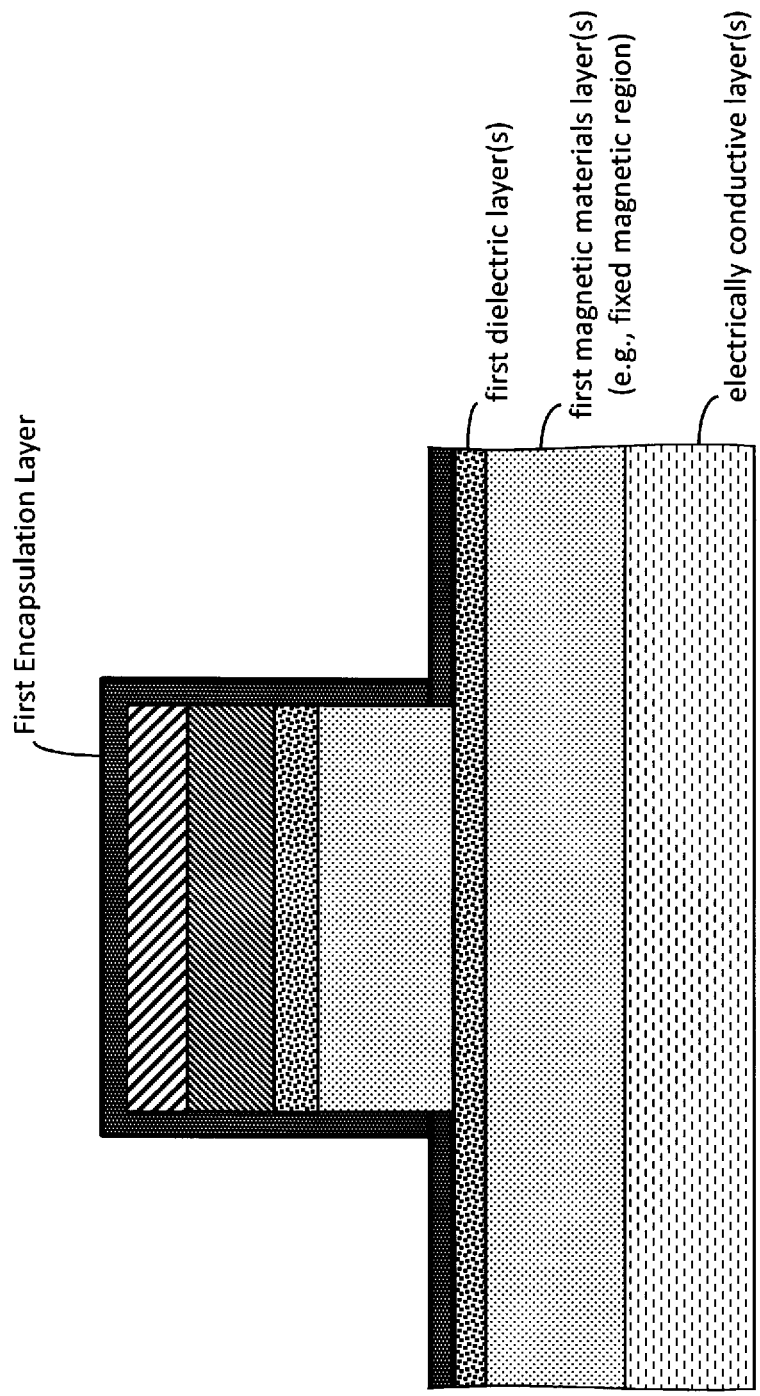
FIGS. 6A-6E illustrate cross-sectional views of a MTJ stack/structure at selected stages of manufacturing in accordance with another embodiment of the present inventions wherein at least three encapsulation layers are employed in connection with protecting a magnetic tunnel junction of the partially formed MTJ stack/structure during the manufacture of the MTJ stack/structure; wherein, the first encapsulation layer is an insulative material (for example, a metal that is at least partially oxidized or nitridized), the second encapsulation layer is an insulative material, and the third encapsulation layer is a conductive material; notably, the partially formed MTJ stack/structure of FIG. 6E may be further fabricated via techniques generally illustrated in FIGS. 3A-3F, 4A, 4B and/or 5A-5E to more fully manufacture/form an embodiment of the MTJ stack/structure according to one or more aspects of the present inventions.
Figure 6B:
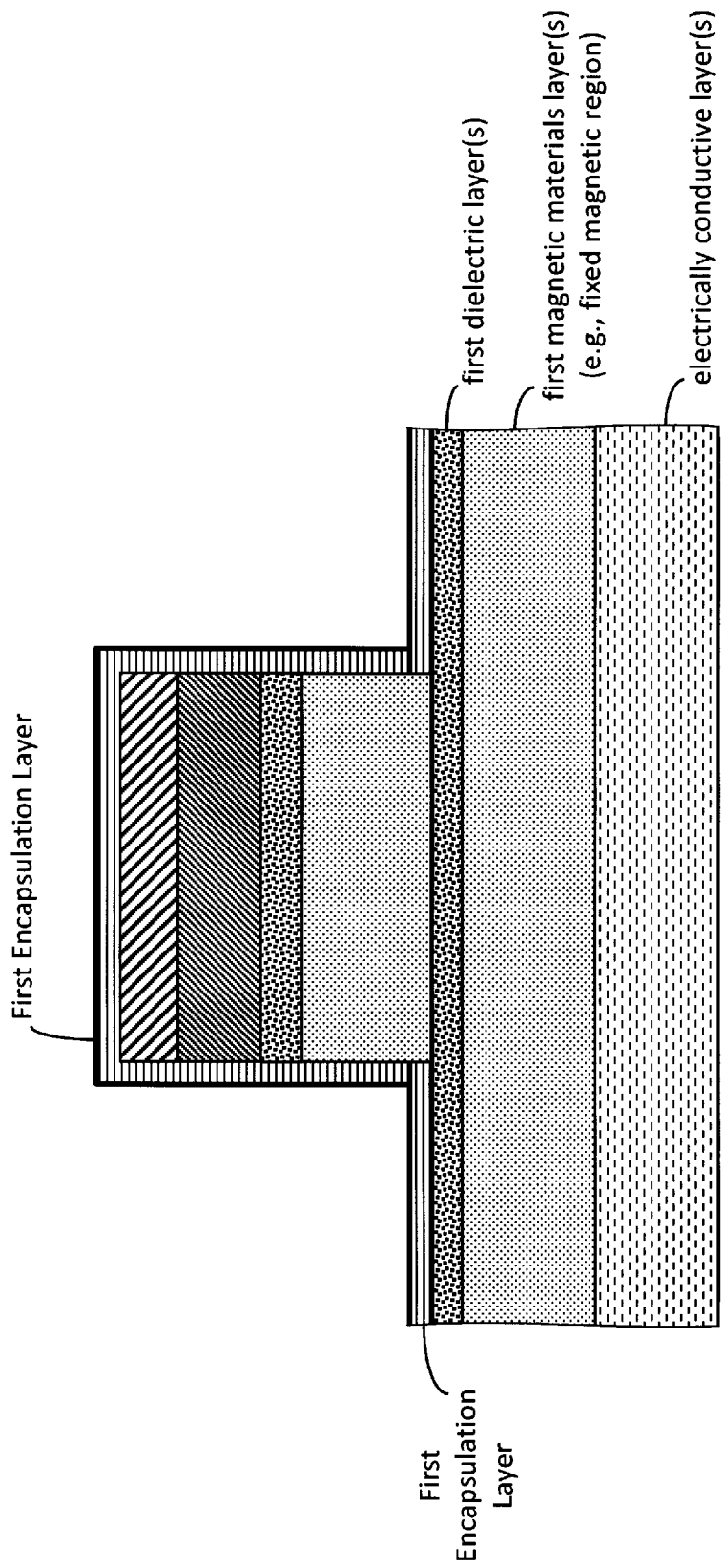

With reference to FIG. 6A, in another embodiment, the first encapsulation layer consists of a conductive material (for example, a metal or metal alloy such as, example, aluminum or magnesium). The first encapsulation layer may be deposited using any technique or process now known or later developed. Thereafter, and prior to deposition of a second encapsulation layer, a portion of the conductive material of the first encapsulation layer is transformed to an insulative material (i.e., the electrical conductivity of the material is changed to be more insulative than conductive). For example, the first encapsulation layer may be exposed to an oxygen or nitrogen atmosphere. The exposure may be sufficient to transform a portion of the first encapsulation layer from a conductor to an insulator. That is, in this embodiment, the first encapsulation layer is partially oxidized or nitridized (see FIG. 6B). Notably, changing at least a portion of the material of the first encapsulation layer to an insulative material may be performed using technique or process now known or later developed; all of which are intended to fall within the scope of the present inventions.

Figure 6C:
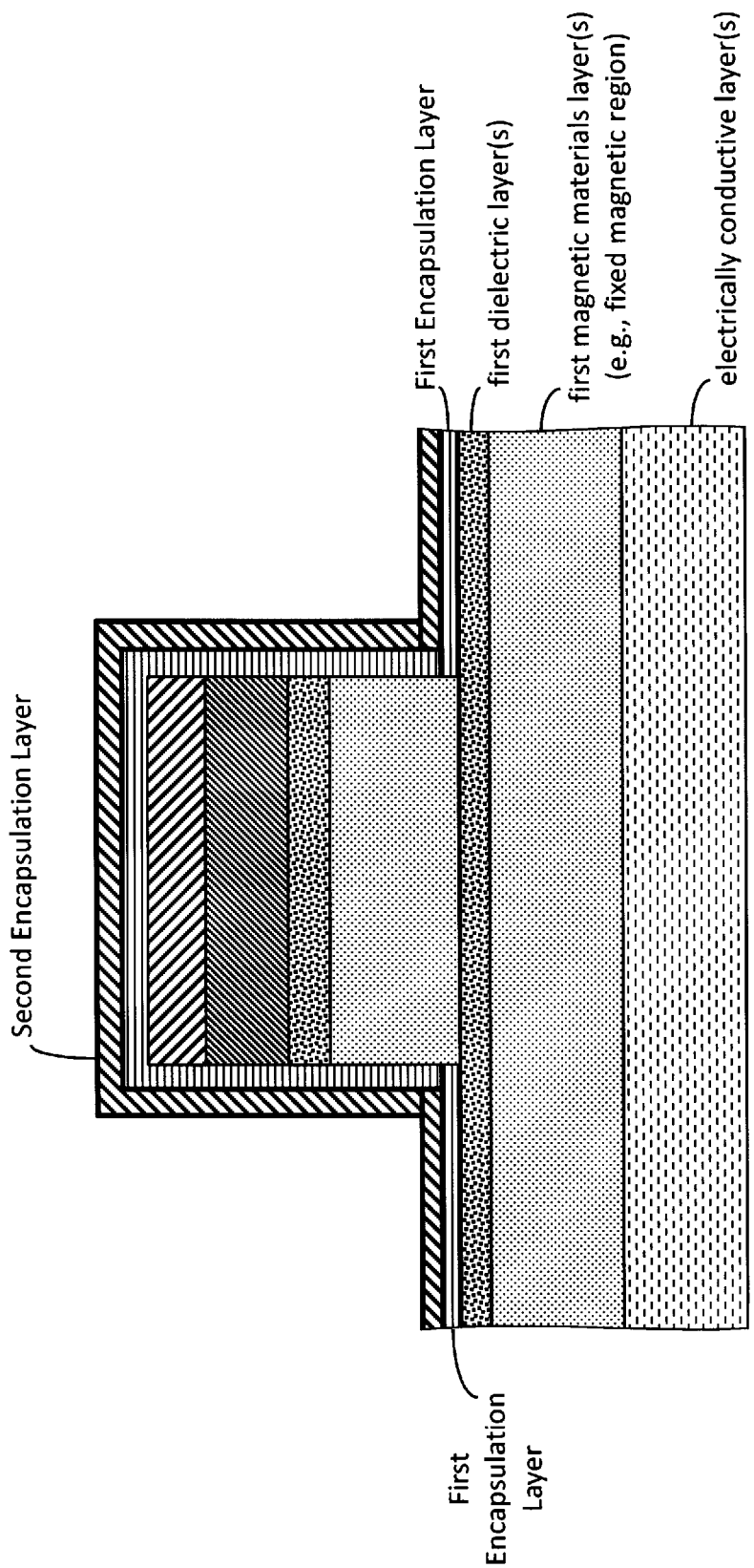

Thereafter, a second encapsulation layer is deposited on the first encapsulation layer. (See, FIG. 6C). The second encapsulation layer may be a conductive or an insulative material (for example, an aluminum and/or magnesium (or an alloy thereof), or an aluminum oxide (such as $Al_2O_3$), a silicon oxide (such as $SiO_2$), a silicon nitride (such as $Si_3N_4$), a magnesium oxide (such as MgO), a TEOS, an aluminum nitride (such as AlN), and/or one or more combinations thereof).

Figure 6D:
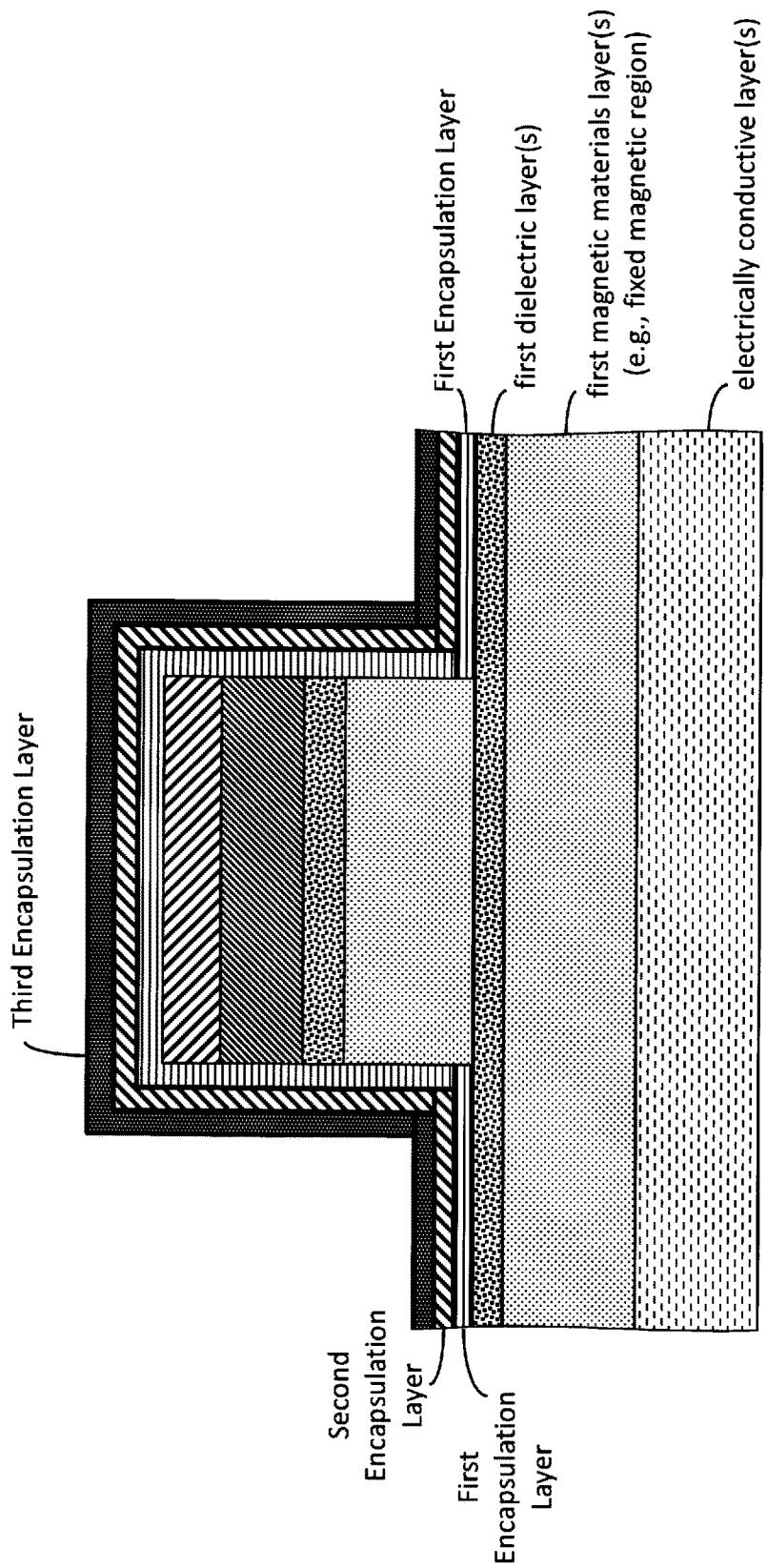

After deposition or formation of the second encapsulation layer, with reference to FIG. 6D, a third encapsulation layer is deposited on or over the second encapsulation layer. The third encapsulation layer may be a conductive material (for example, an aluminum and/or magnesium (or one or more alloys thereof). In one embodiment, the third encapsulation layer includes a thickness that, in the aggregate of the thicknesses of the first, second and third encapsulation layers provides, defines or establishes a desired or suitable relative width or diameter of a free magnetic layer to (i) fixed magnetic layer and/or (ii) first dielectric layer or magnetic tunnel barrier of the MTJ stack/structure. Moreover, employing a third encapsulation layer, having a certain thickness that reduces the likelihood of defects or pinholes in the three layer encapsulation structure, may increase the effectiveness of the multilayer encapsulation structure and the stack and improve the reliability and/or thermal endurance of the MTJ stack/structure by reducing the likelihood of unwanted/excessive contamination of, for example, the magnetic tunnel barrier of the MTJ stack/structure.

The thicknesses of encapsulation layers of the embodiment illustrated in FIGS. 6A-6D may be the same as, relative to and/or similar to the thicknesses of the encapsulation layers described and/or illustrated in FIGS. 2A-2G. Indeed, the thicknesses of such layers may be based on the same considerations as those considerations discussed herein in connection with other embodiment of the present inventions.

In one embodiment, the first encapsulation layer has a thickness of less than 35 Angstrom; and, in a preferred embodiment, the thickness of the first encapsulation layer is between 10 and 25 Angstrom. The second encapsulation layer may have a thickness of less than 50 Angstrom; and, in a preferred embodiment, the thickness of the second encapsulation layer is between 10 and 40 Angstrom. In one embodiment, the thickness of the second encapsulation layer is a function of the oxidation or nitridation dose and the depth of absorption of the oxygen or nitrogen by the material of the second encapsulation layer during formation. Further, the third encapsulation layer may have a thickness of less than 35 Angstrom; and in a preferred embodiment, the thickness of the third encapsulation layer is between 10 and 25 Angstrom.

Notably, additional encapsulation layers may be provided to, among other things, further protect the partially formed MTJ stack/structure (for example, via further reducing the likelihood of defects or pinholes in the encapsulation structure) and/or further define or establish a relative width or diameter of a free magnetic layer relative to fixed magnetic layer, or vice versa. Such additional encapsulation layer(s) may consist of conductive and/or insulative materials.

Figure 6E:
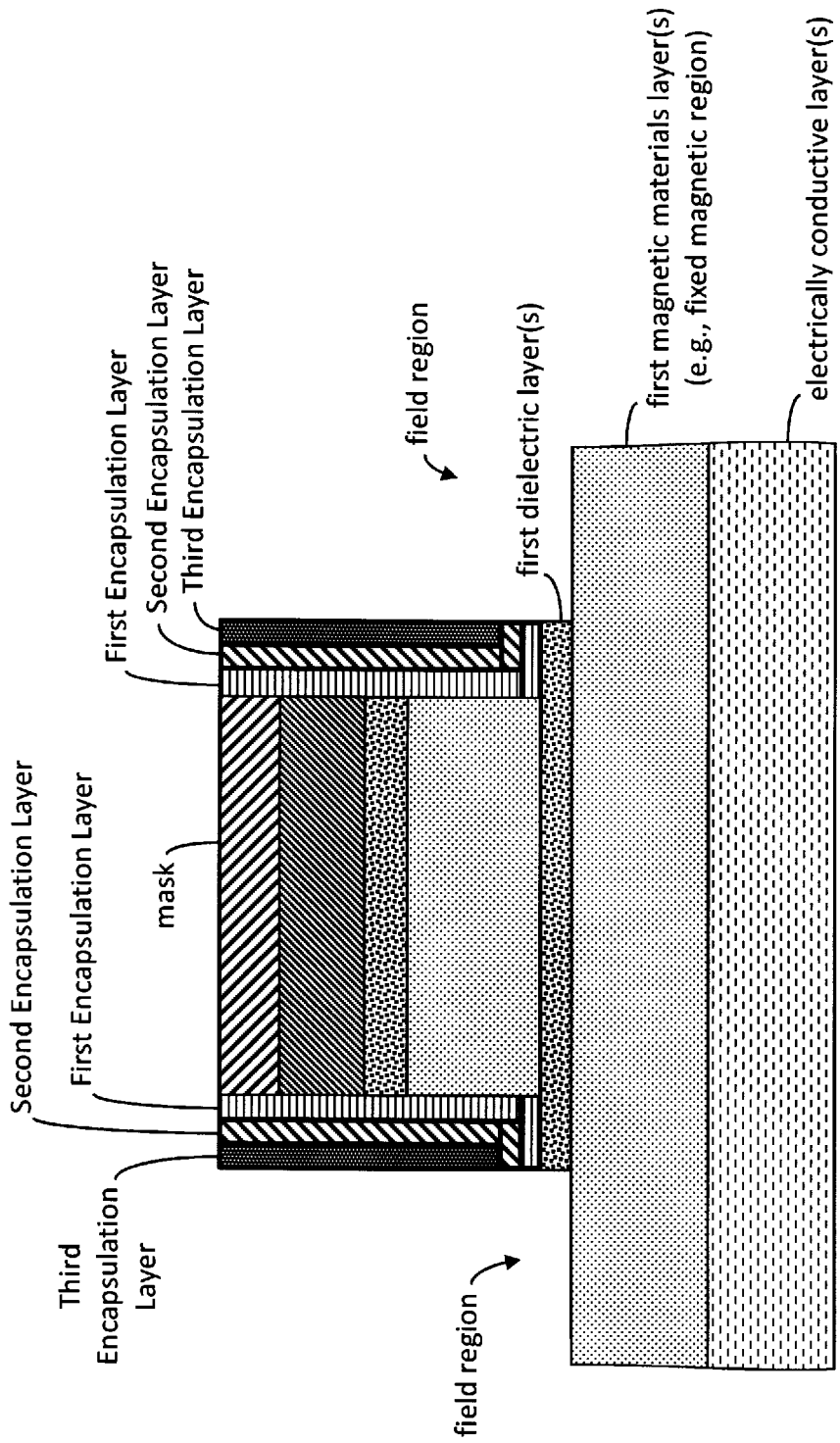

With reference to FIG. 6E, the first dielectric layer(s) is then etched (together with the encapsulation layers in the field areas) to form or define a magnetic tunnel barrier. As noted above, the first dielectric layer(s) (for example, an MgO and/or AlOx) may be etched and/or patterned using any etchants and/or technique now known or later developed—for example, using physical etchants and etching techniques (for example, sputter etching techniques). It should be noted that the present inventions may employ any suitable etchants and techniques, whether now known or later developed, to etch the one or more layers of electrically conductive materials and thereby form, define and/or provide the tunnel barrier. With continued reference to FIG. 6E, a portion of the materials of the encapsulation layers remain on the partially formed stack/structure, for example, on sidewalls of the partially formed stack/structure—including the magnetic materials.

The MTJ stack/structure of FIGS. 6A-6E may be completed in the manner described and/or illustrated above. Indeed, all suitable techniques to complete the formation of the MTJ stack/structure, whether now known or later developed, may be employed to process and complete the MTJ stack/structure; such techniques are intended to fall within the scope of the present inventions.

Figure 7A:
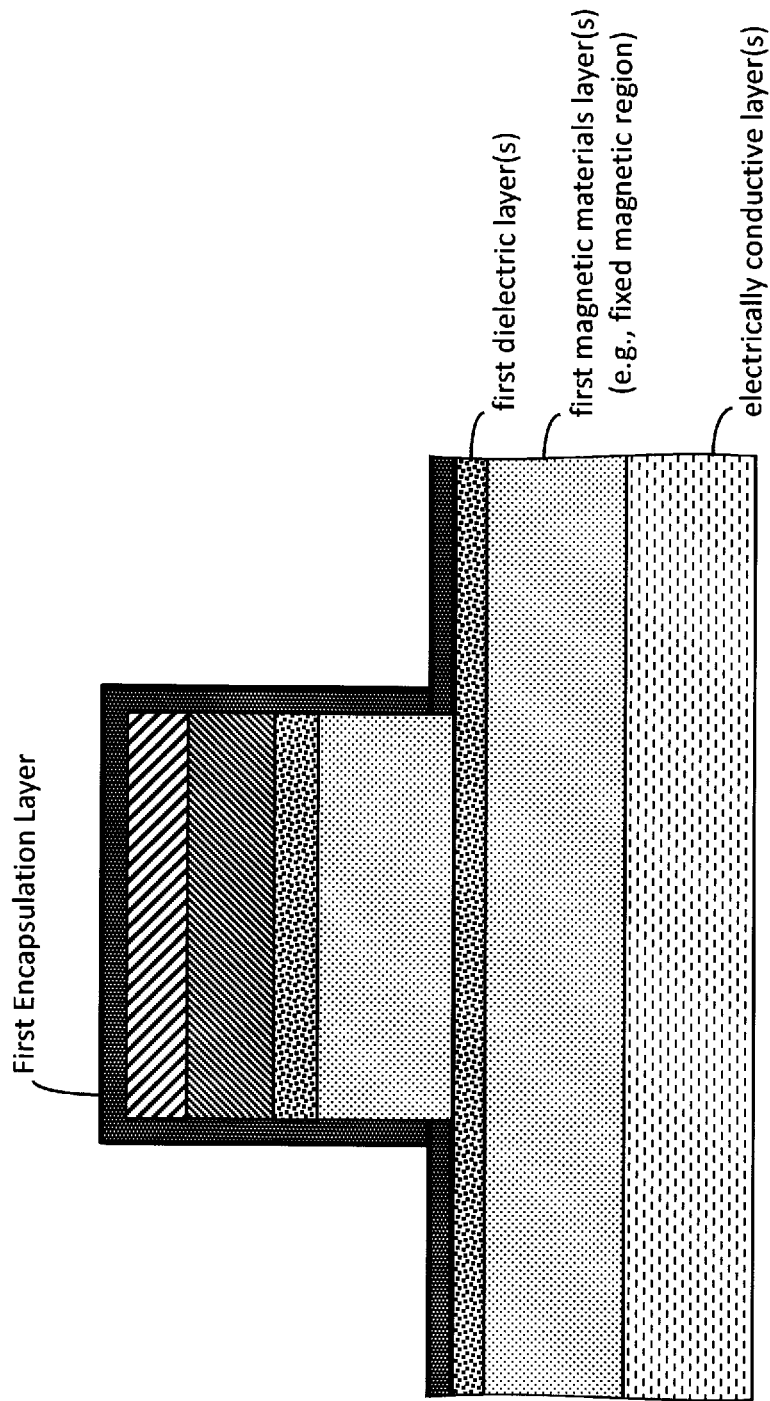
FIGS. 7A-7E illustrate cross-sectional views of a MTJ stack/structure at selected stages of manufacturing in accordance with another embodiment of the present inventions wherein at least three encapsulation layers are employed in connection with protecting a magnetic tunnel junction of the partially formed MTJ stack/structure during the manufacture of the MTJ stack/structure; wherein, the first encapsulation layer consists of at least a partially insulative material (for example, a metal that is at least partially oxidized or nitridized), the second encapsulation layer is a conductive material, and the third encapsulation layer consists of at least a partially insulative material; notably, the partially formed MTJ stack/structure of FIG. 7E may be further fabricated via techniques generally illustrated in FIGS. 3A-3F, 4A, 4B and/or 5A-5E to more fully manufacture/form an embodiment of the MTJ stack/structure according to one or more aspects of the present inventions.
Figure 7B:
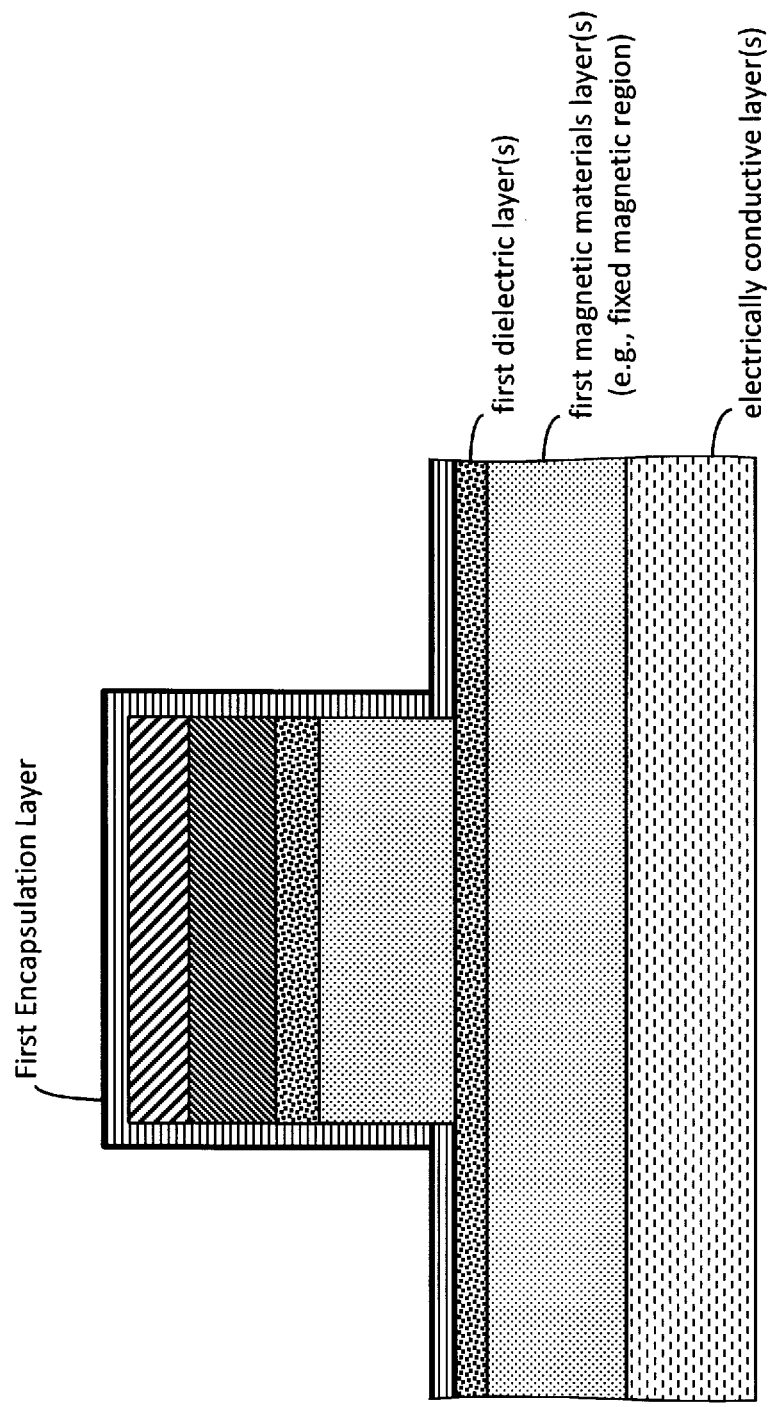

With reference to FIG. 7A, in another embodiment, the first encapsulation layer again consists of a conductive material (for example, a metal or metal alloy such as, example, aluminum or magnesium) and thereafter, at least a portion of the conductive material is transformed to an insulative material (i.e., the electrical conductivity of the material is changed to be more insulative than conductive). For example, the first encapsulation layer may be exposed to an oxygen or nitrogen atmosphere. The exposure is sufficient to partially change or transform at least a portion of the first encapsulation layer from a conductor to an insulator. That is, in this embodiment, the first encapsulation layer is at least partially oxidized or nitridized (see FIG. 7B). Notably, the first encapsulation layer may be deposited using any technique or process now known or later developed. Moreover, changing at least a portion of the material of the first encapsulation layer to an insulative material may be performed using technique or process now known or later developed; all of which are intended to fall within the scope of the present inventions.

Figure 7C:
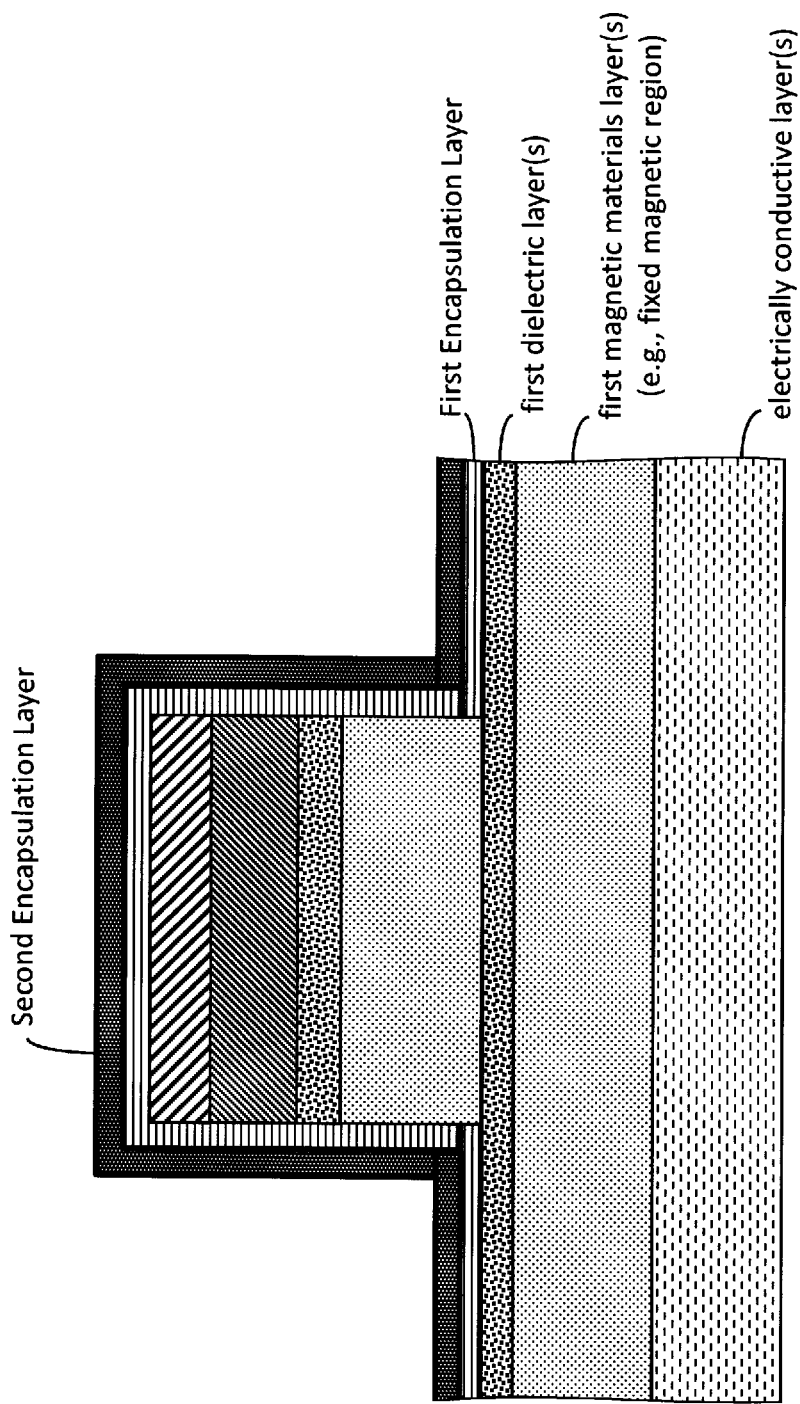

Thereafter, a second encapsulation layer is deposited on the first encapsulation layer. (See, FIG. 7C). The second encapsulation layer, in this embodiment, is a conductive material (for example, an aluminum and/or magnesium (or an alloy thereof)).

Figure 7D:
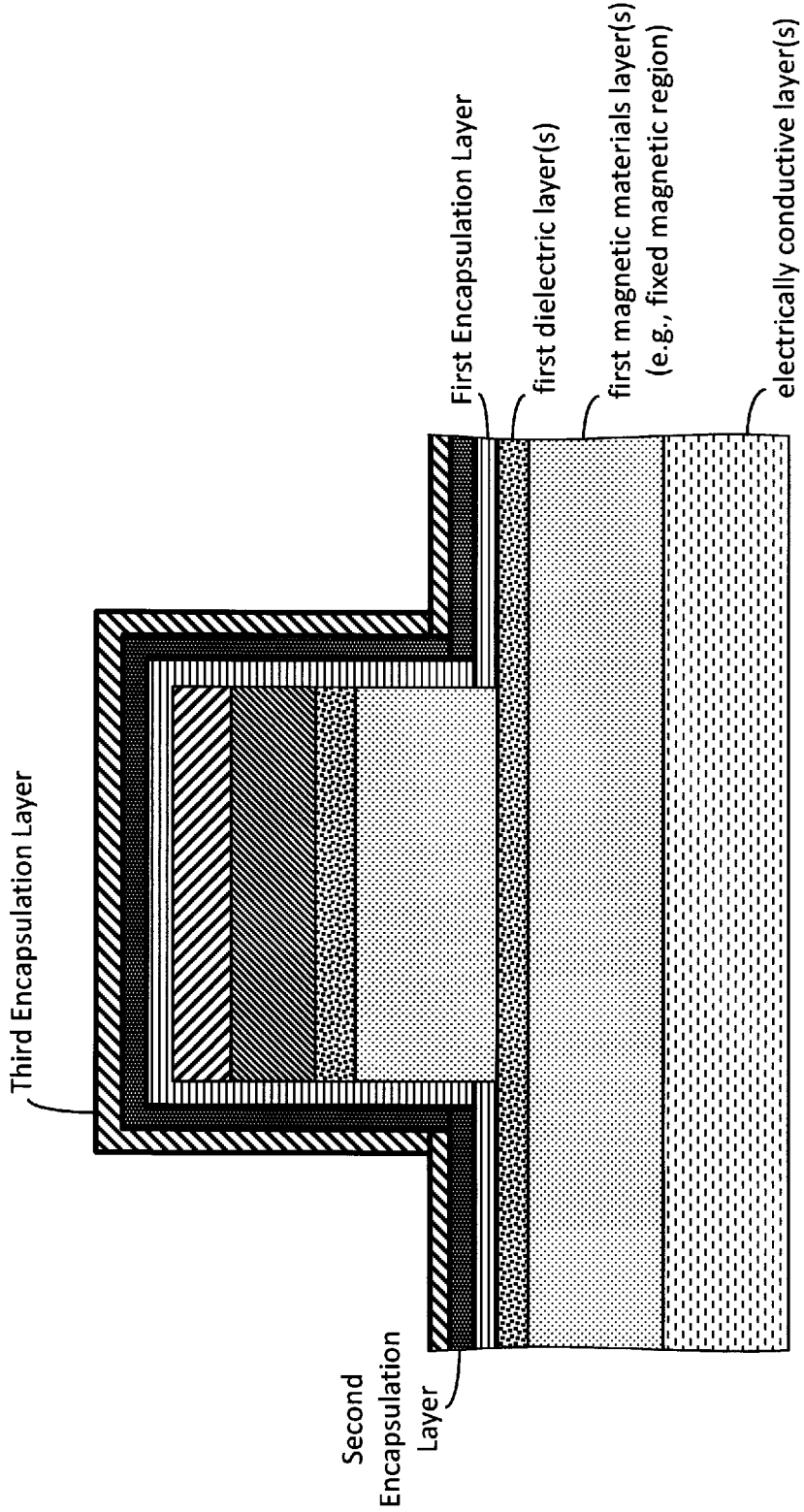

With reference to FIG. 7D, a third encapsulation layer is deposited on or over the second encapsulation layer. The third encapsulation layer may be a conductive material (for example, an aluminum and/or a magnesium, or one or more alloys thereof) which is subsequently transformed to an insulative material. Alternatively, the third encapsulation layer is an insulative material (for example, an aluminum oxide (such as $Al_2O_3$), a silicon oxide (such as $SiO_2$), a silicon nitride (such as $Si_3N_4$), a magnesium oxide (such as MgO), a TEOS, an aluminum nitride (such as AlN), and/or one or more combinations thereof). In one embodiment, the third encapsulation layer includes a thickness such that the aggregate thickness of the first, second and third encapsulation layers that provides, defines or establishes a desired or suitable relative width or diameter of a free magnetic layer to (i) fixed magnetic layer and/or (ii) first dielectric layer or magnetic tunnel barrier. Indeed, employing a third encapsulation layer, having a certain thickness that reduces the likelihood of defects or pinholes in the three layer encapsulation structure, may increase the effectiveness of the multilayer encapsulation structure and the stack and improve the reliability and/or thermal endurance of the MTJ stack/structure by reducing the likelihood of unwanted/excessive contamination of, for example, the magnetic tunnel barrier of the MTJ stack/structure (for example, during fabrication or thereafter, including during normal operation of the magnetoresistive device).

The thicknesses of encapsulation layers of the embodiment illustrated in FIGS. 7A-7D may be the same as, relative to and/or similar to the thicknesses of the encapsulation layers described and/or illustrated herein. Indeed, the thicknesses of such layers may be based on the same considerations as those considerations discussed herein in connection with other embodiment of the present inventions.

In one embodiment, the first encapsulation layer has a thickness of less than 35 Angstrom; and, in a preferred embodiment, the thickness of the first encapsulation layer is between 10 and 25 Angstrom. The second encapsulation layer may have a thickness of less than 25 Angstrom; and, in a preferred embodiment, the thickness of the second encapsulation layer is between 5 and 15 Angstrom. Further, the third encapsulation layer may have a thickness of less than 50 Angstrom; and in a preferred embodiment, the thickness of the third encapsulation layer is between 10 and 25 Angstrom.

Notably, additional encapsulation layers may be provided to, among other things, further protect the partially formed MTJ stack/structure (for example, via further reducing the likelihood of defects or pinholes in the encapsulation structure) and/or further define or establish a relative width or diameter of a free magnetic layer relative to fixed magnetic layer, or vice versa. Such additional encapsulation layer(s) may consist of conductive and/or insulative materials.

Figure 7E:
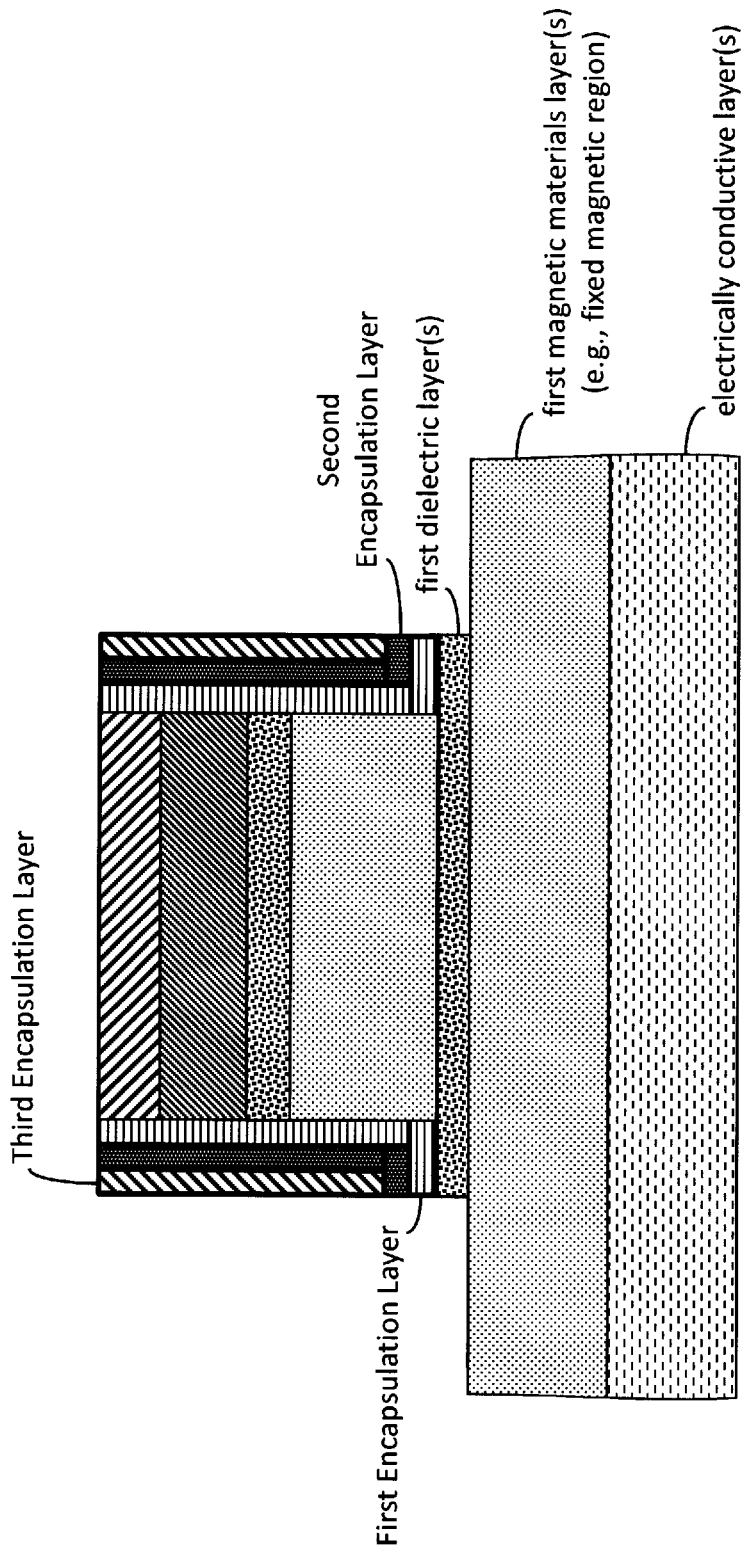
Figure 8A:
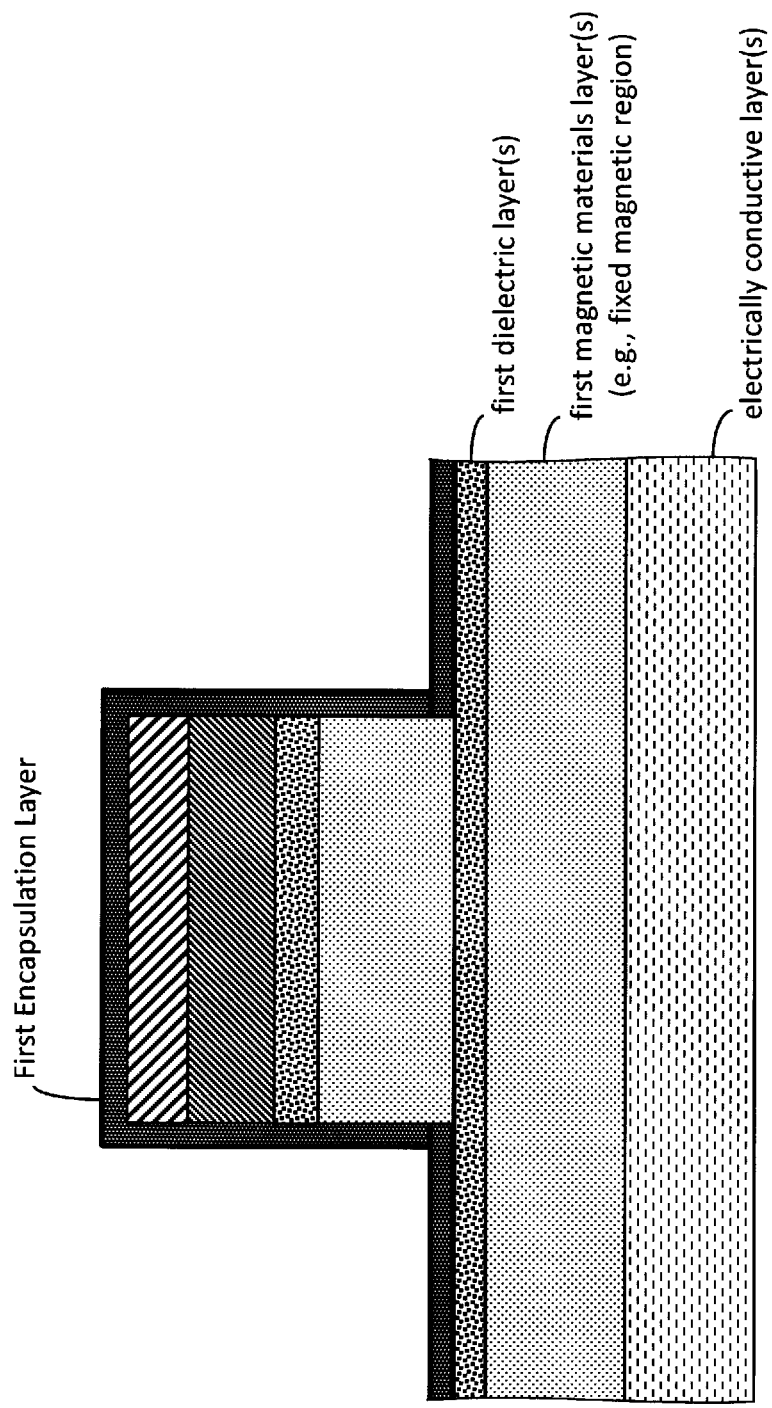
FIGS. 8A-8D illustrate cross-sectional views of a MTJ stack/structure at selected stages of manufacturing in accordance with another embodiment of the present inventions wherein at least three encapsulation layers are employed in connection with protecting a magnetic tunnel junction of the partially formed MTJ stack/structure during the manufacture of the MTJ stack/structure; wherein, the first encapsulation layer is a conductive material (for example, a metal), the second encapsulation layer is a conductive material, and the third encapsulation layer is an insulative material; in one embodiment, the insulative material of the first and/or second encapsulation layers, may be at least transformed to a partially insulative material (i.e., the electrical conductivity of the material is changed to be more insulative); notably, the partially formed MTJ stack/structure of FIG. 8D may be further fabricated via techniques generally illustrated in FIGS. 3A-3F, 4A, 4B and/or 5A-5E to more fully manufacture/form an embodiment of the MTJ stack/structure according to one or more aspects of the present inventions.
Figure 8B:
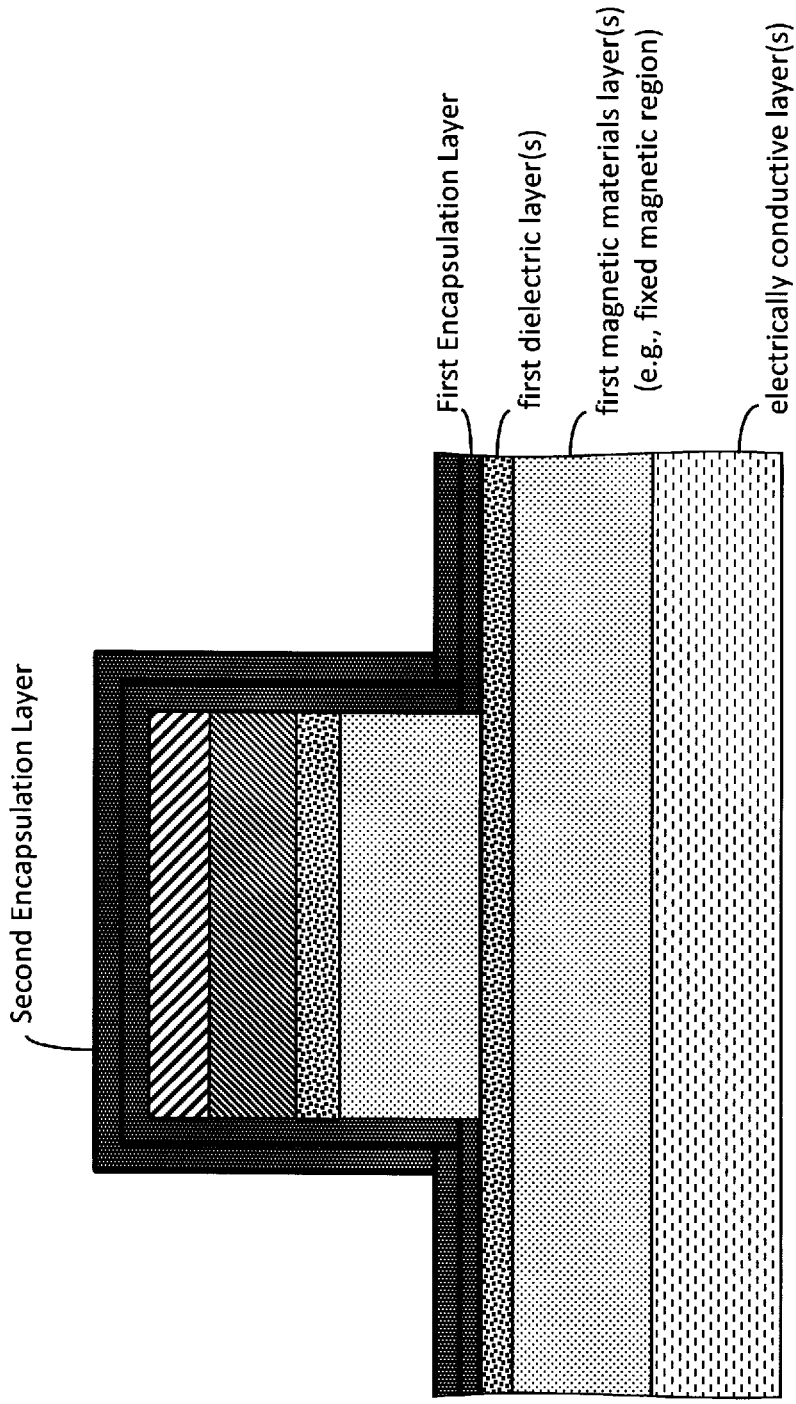
Figure 8C:
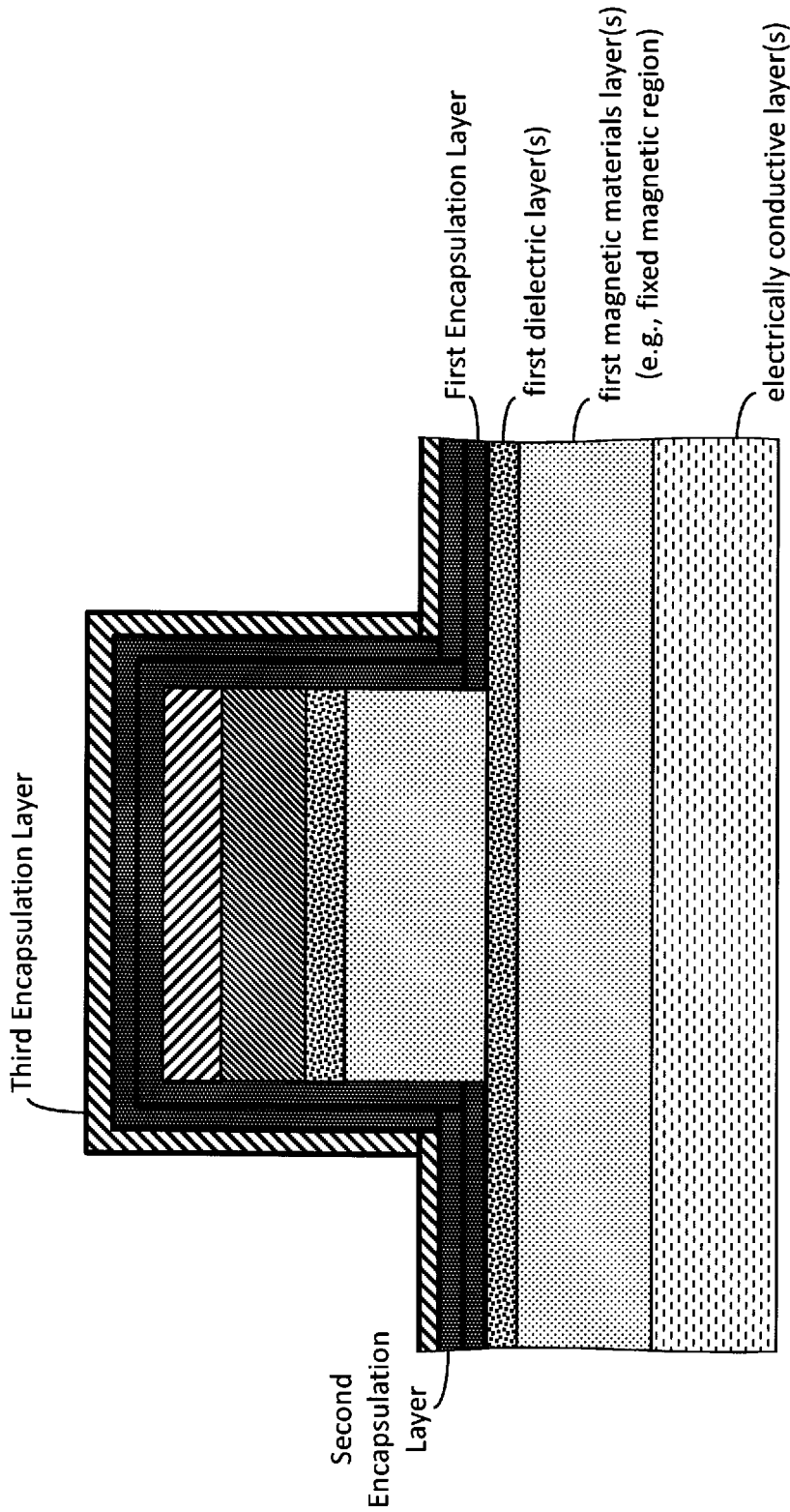
Figure 8D:
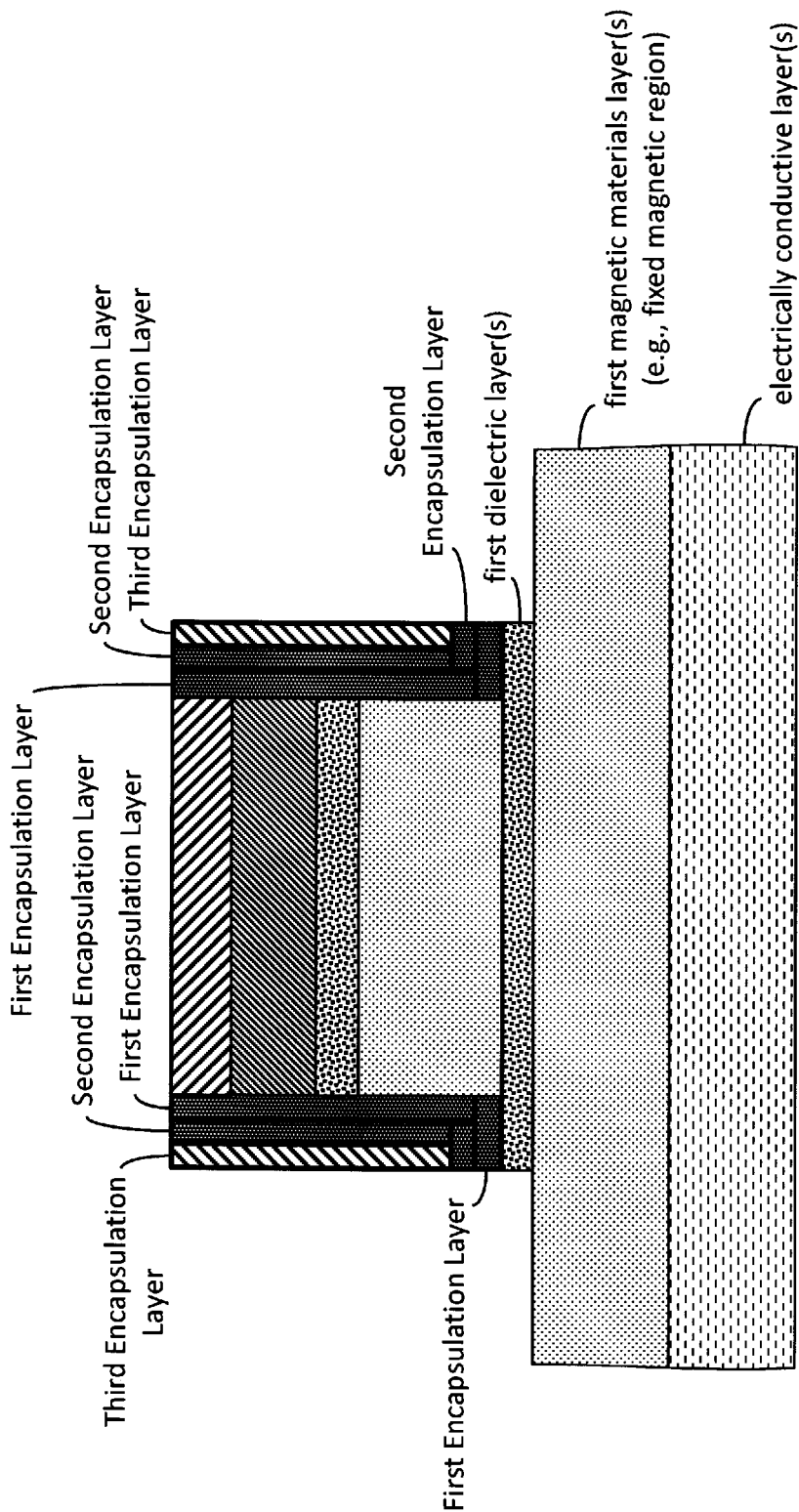

With reference to FIG. 7E, the first dielectric layer(s) is then etched (together with the encapsulation layers in the field areas) to form or define a magnetic tunnel barrier. As noted above, the first dielectric layer(s) (for example, Mg or MgO) may be etched and/or patterned using any etchants and/or technique now known or later developed—for example, using physical etchants and etching techniques (for example, sputter etching techniques). It should be noted that the present inventions may employ any suitable etchants and techniques, whether now known or later developed, to etch the one or more layers of electrically conductive materials and thereby form, define and/or provide the tunnel barrier. With continued reference to FIG. 7E, a portion of the materials of the encapsulation layers remain on the partially formed stack/structure, for example, on sidewalls of the partially formed stack/structure—including the magnetic materials.

The MTJ stack/structure of FIGS. 7A-7E may be completed in the manner described and/or illustrated above. (See, for example, FIGS. 3A-5E). Indeed, all suitable techniques to complete the formation of the MTJ stack/structure, whether now known or later developed, may be employed to process and complete the MTJ stack/structure; such techniques are intended to fall within the scope of the present inventions.

In another embodiment, the first and second encapsulation layers consist of one or more conductive materials and the third encapsulation layer consists of insulative material. (See, for example, FIGS. 8A-8D). Here, it may be advantageous that the deposition or formation of the insulative material of the third encapsulation layer also change or modify the electrical conductivity of at least a portion of the material of the first encapsulation layer which is in contact with the sidewalls of the partially formed MTJ stack/structure to be more insulative than conductive. In this way, portions of the partially formed MTJ stack/structure would not be susceptible to electrical shorting based on one or more encapsulation layers of the encapsulation structure.

Notably, the MTJ stack/structure of FIGS. 8A-8D may be completed in the manner described and/or illustrated above. (See, for example, FIGS. 3A-5E). Indeed, all suitable techniques to complete the formation of the MTJ stack/structure, whether now known or later developed, may be employed to process and complete the MTJ stack/structure; such techniques are intended to fall within the scope of the present inventions. Moreover, the thicknesses of the encapsulation layers of the embodiment illustrated in FIGS. 8A-8D may be the same as, relative to and/or similar to the thicknesses of the encapsulation layers previously described and/or illustrated herein. Indeed, the thicknesses of such layers may be based on the same considerations as those considerations discussed herein in connection with other embodiments of the present inventions.

Figure 9A:
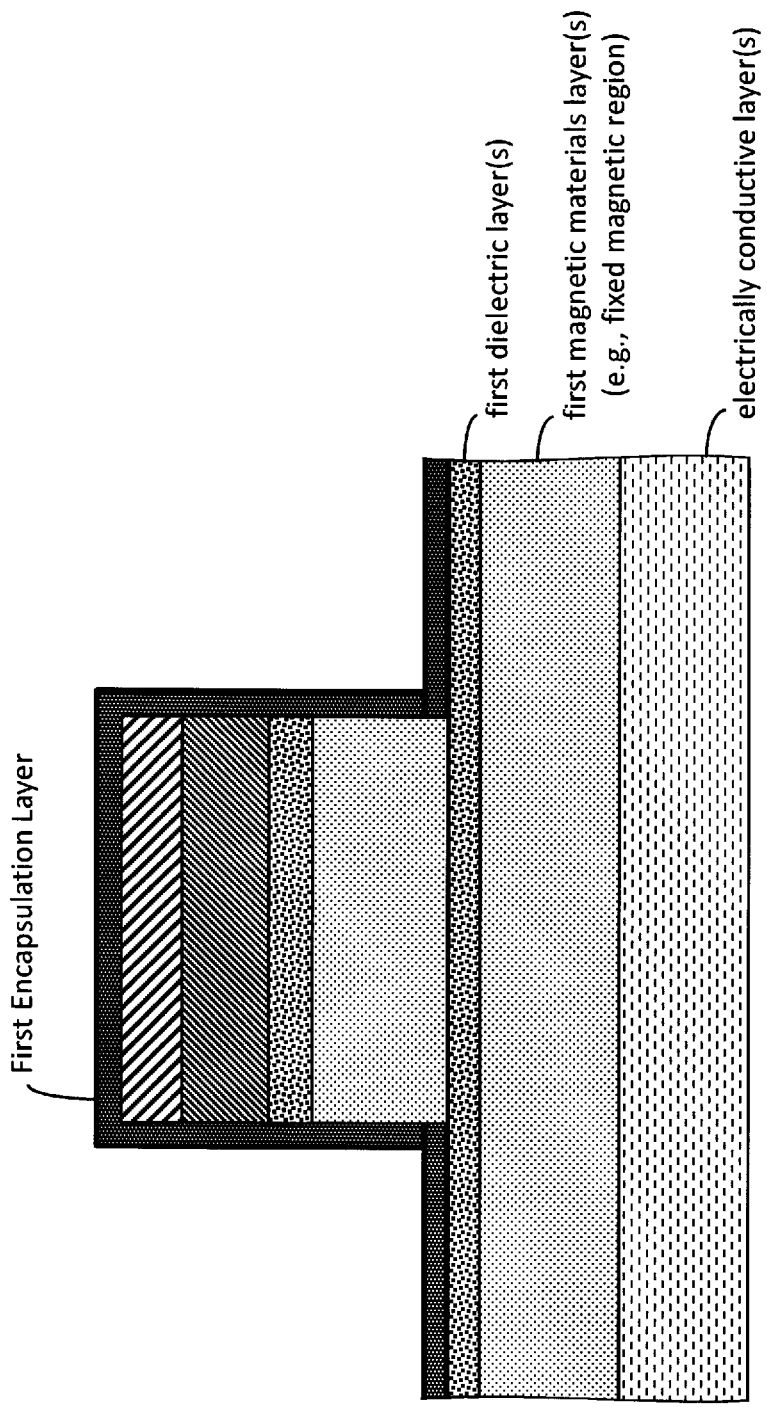
FIGS. 9A-9D illustrate cross-sectional views of a MTJ stack/structure at selected stages of manufacturing in accordance with another embodiment of the present inventions wherein at least three encapsulation layers are employed in connection with protecting a magnetic tunnel junction of the partially formed MTJ stack/structure during the manufacture of the MTJ stack/structure; wherein, the first encapsulation layer is a conductive material (for example, a metal), the second encapsulation layer is an insulative material, and the third encapsulation layer is an insulative material; notably, the partially formed MTJ stack/structure of FIG. 9D may be further fabricated via techniques generally illustrated in FIGS. 3A-3F, 4A, 4B and/or 5A-5E to more fully manufacture/form an embodiment of the MTJ stack/structure according to one or more aspects of the present inventions.
Figure 9B:
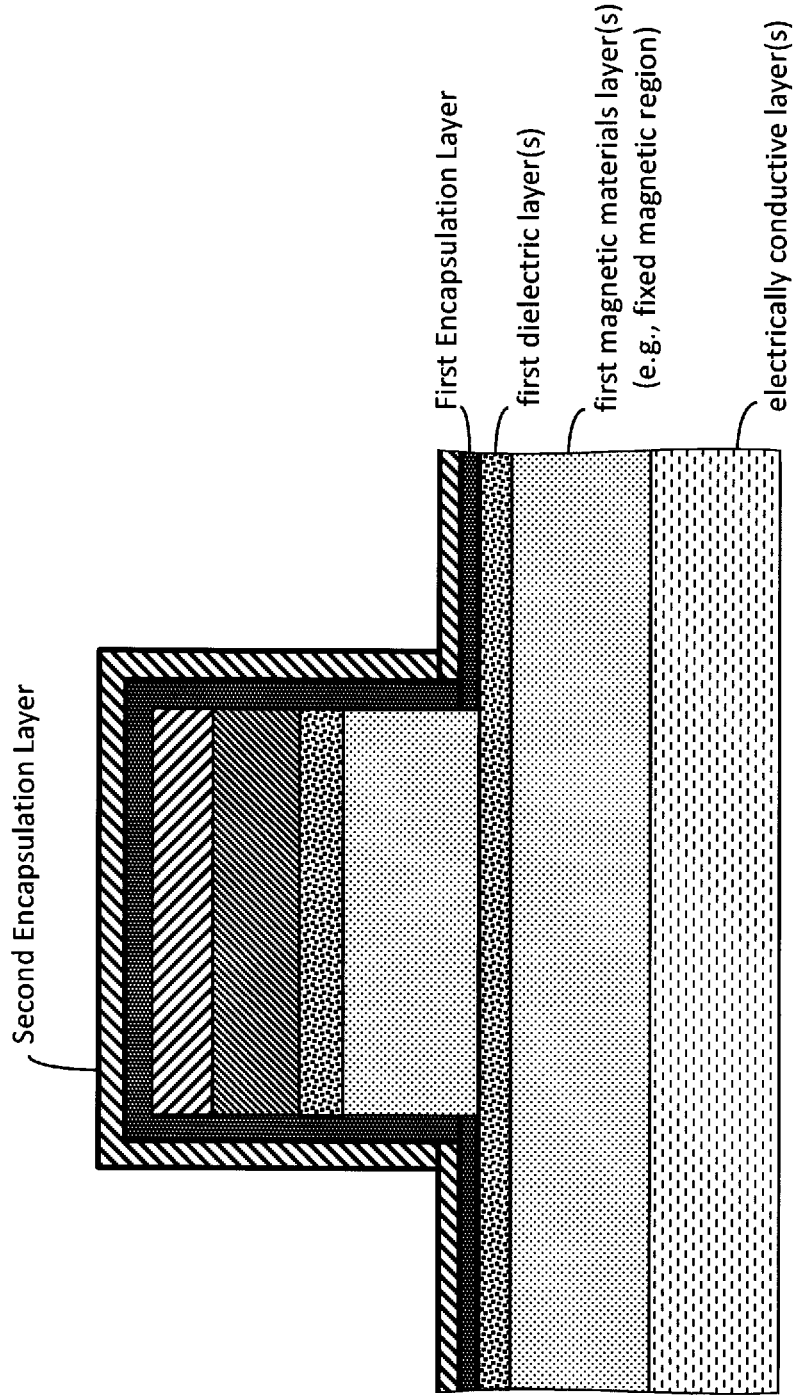

In yet another embodiment, with reference to FIG. 9A, a first encapsulation layer is deposited on the partially formed MTJ stack/structure (for example, on all or substantially all of the exposed portions of the partially formed stack/structure—including the sidewalls thereof). In this embodiment, the first encapsulation layer is a conductive material (for example, a metal or metal alloy such as, example, aluminum or magnesium). The first encapsulation layer, in one embodiment, has a thickness of less than 35 Angstrom. In a preferred embodiment, the thickness of the first encapsulation layer is between 10 and 25 Angstrom.

After deposition of the first encapsulation layer, a second encapsulation layer is deposited on or above the first encapsulation layer. (See, FIG. 9B). The second encapsulation layer may be an insulator material such as an aluminum oxide (such as $Al_2O_3$), a silicon oxide (such as $SiO_2$), a silicon nitride (such as $Si_3N_4$), a magnesium oxide (such as MgO), a TEOS, an aluminum nitride (such as AlN), and/or one or more combinations thereof). In one embodiment, the second encapsulation layer is initially deposited as a metal or other conductive material (for example, a metal such as aluminum or magnesium) and thereafter oxidized or nitridized to change or transform at least a portion of the material of the second encapsulation layer to an insulative material (i.e., thereby decreasing the electrical conductivity of the material of the second encapsulation layer).

The second encapsulation layer may have a thickness of less than 50 Angstrom. In a preferred embodiment, the thickness of the second encapsulation layer is between 10 and 40 Angstrom. And, in a more preferred embodiment, the thickness of the second encapsulation layer is between 10 and 20 Angstrom.

Notably, during the deposition or formation of the second encapsulation layer, the first encapsulation layer may be at least partially changed or transformed from a conductive material to an insulative material. That is, the electrical conductivity of at least a portion of the material of the first encapsulation layer is changed or modified to be more insulative than conductive. For example, in one embodiment, during deposition or formation of the second encapsulation layer and/or after such deposition or formation (for example, after the MTJ stack/structure is subjected to various anneal process during formation of the magnetoresistive device and/or during operation of the magnetoresistive device), oxygen or nitrogen (for example, oxygen or nitrogen employed in the formation of the second encapsulation layer) may be "absorbed" by the material of the first encapsulation layer thereby modifying the electrical conductivity of the first encapsulation layer such that at least a portion of material of the first encapsulation layer is more insulative than conductive (for example, material of the first encapsulation layer which is in contact with the sidewalls of the partially formed MTJ stack/structure).

Notably, in one embodiment, the thickness of the second encapsulation layer may also be a function of the thickness of the first encapsulation layer, the oxidation or nitridation dose and the depth of absorption of the oxygen or nitrogen by the material of the second encapsulation layer and the material of the first encapsulation layer (during deposition or formation of the second encapsulation layer and/or after such deposition or formation (for example, after the MTJ stack/structure is subjected to various anneal process during formation of the magnetoresistive device and/or during operation of the magnetoresistive device).

Figure 9C:
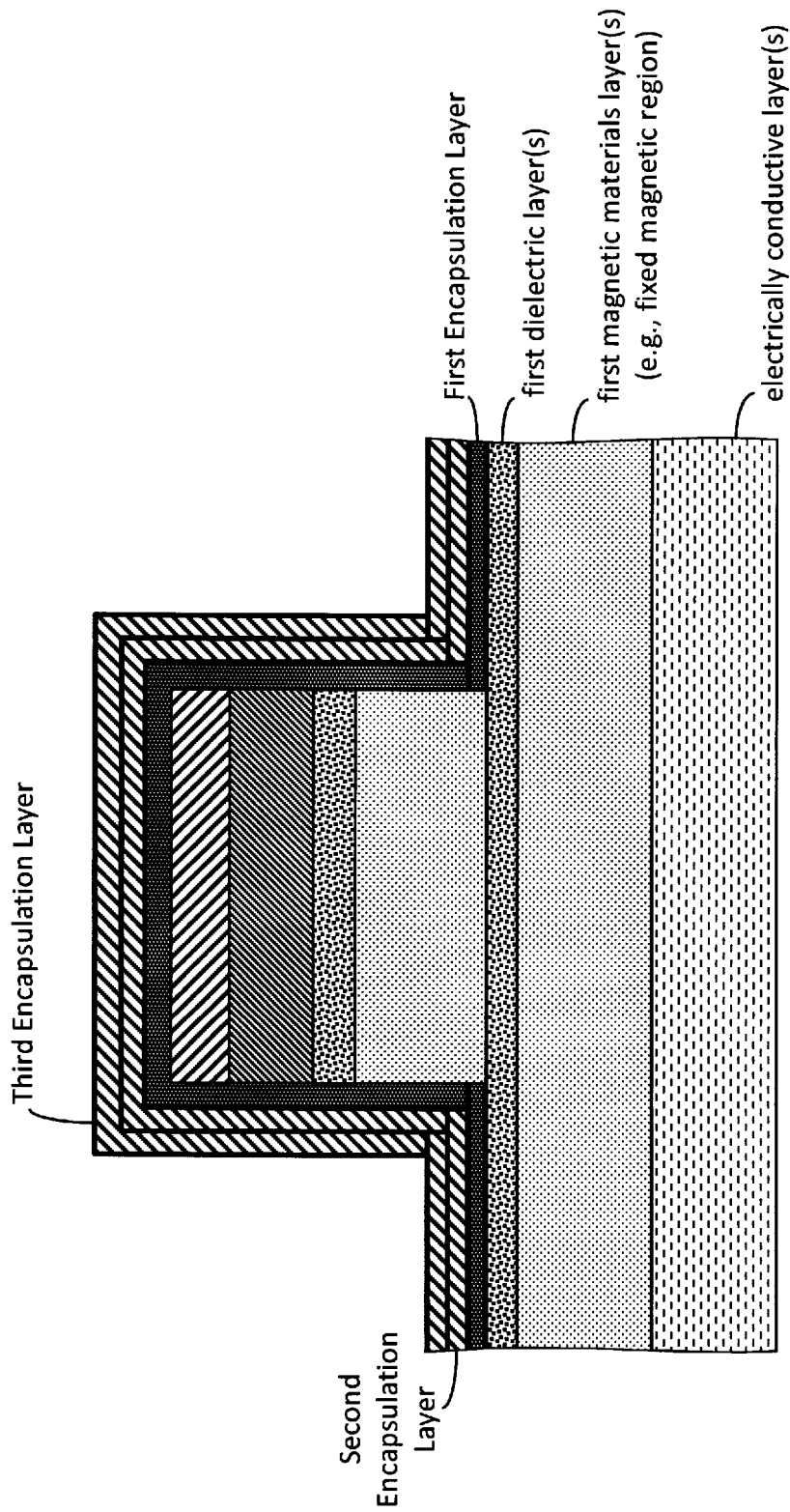

With reference to FIG. 9C, a third encapsulation layer is deposited or formed after deposition or formation of the second encapsulation layer. The third encapsulation layer may be a conductive or insulative material. The third encapsulation layer may be deposited as a metal or other conductive material and thereafter at least a portion thereof may be modified to an insulative material (for example, via oxidation or nitridation of the conductive material. In one embodiment, the third encapsulation layer includes a thickness to reduce the likelihood of defects or pin holes in the three encapsulation layer structure as well as provide an aggregate thickness of the first, second and third encapsulation layers that provides, defines and/or establishes a relative width or diameter of a free magnetic layer to the (i) fixed magnetic region and/or (ii) the first dielectric layer or magnetic tunnel barrier of the MTJ stack/structure, or vice versa.

For example, in one embodiment, the third encapsulation layer may have a thickness of less than 35 Angstrom. In a preferred embodiment, the thickness of the third encapsulation layer is between 10 and 25 Angstrom.

Notably, additional encapsulation layers may be provided to, among other things, further protect the partially formed MTJ stack/structure via, for example, reducing likelihood of defects or pinholes in the multilayer encapsulation structure and/or define or establish a relative width or diameter of a free magnetic layer relative to the (i) fixed magnetic region and/or (ii) the first dielectric layer or magnetic tunnel barrier of the MTJ stack/structure, or vice versa.

Figure 9D:
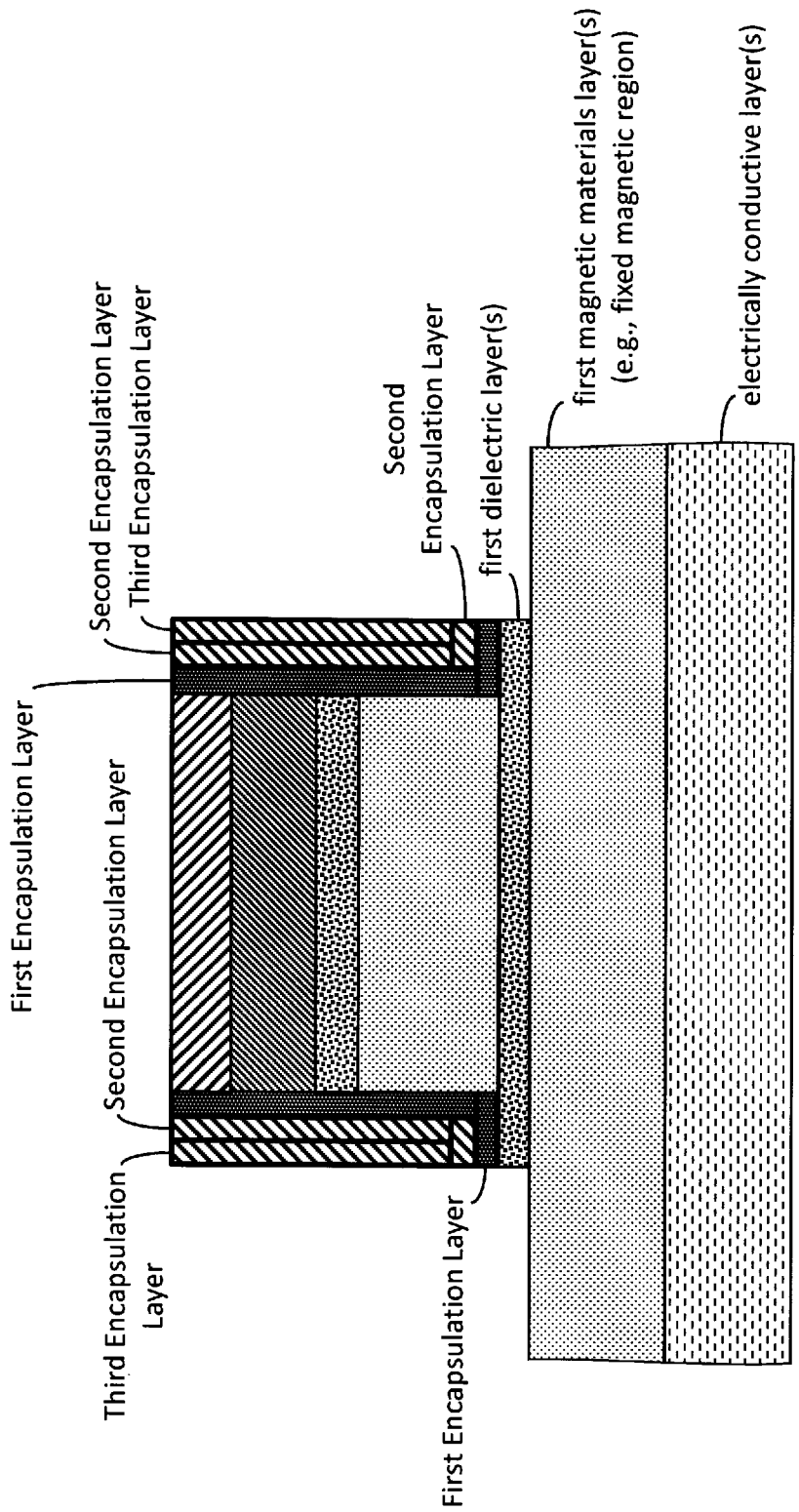

With reference to FIG. 9D, the first dielectric layer(s) is then etched (together with the encapsulation layers of the multilayer encapsulation structure disposed in the field areas) to form or define a magnetic tunnel barrier of the MTJ stack/structure. The first dielectric layer(s) (for example, AlOx or MgO) may be etched and/or patterned using any etchants and/or technique now known or later developed—for example, using physical etchants and etching techniques (for example, sputter etching techniques). It should be noted that the present inventions may employ any suitable etchants and techniques, whether now known or later developed, to etch the one or more layers of electrically conductive materials and thereby form, define and/or provide the tunnel barrier. With continued reference to FIG. 9D, a portion of the materials of the encapsulation layers may remain on the partially formed stack/structure, for example, on sidewalls of the partially formed stack/structure—including the magnetic materials.

Figure 10A:
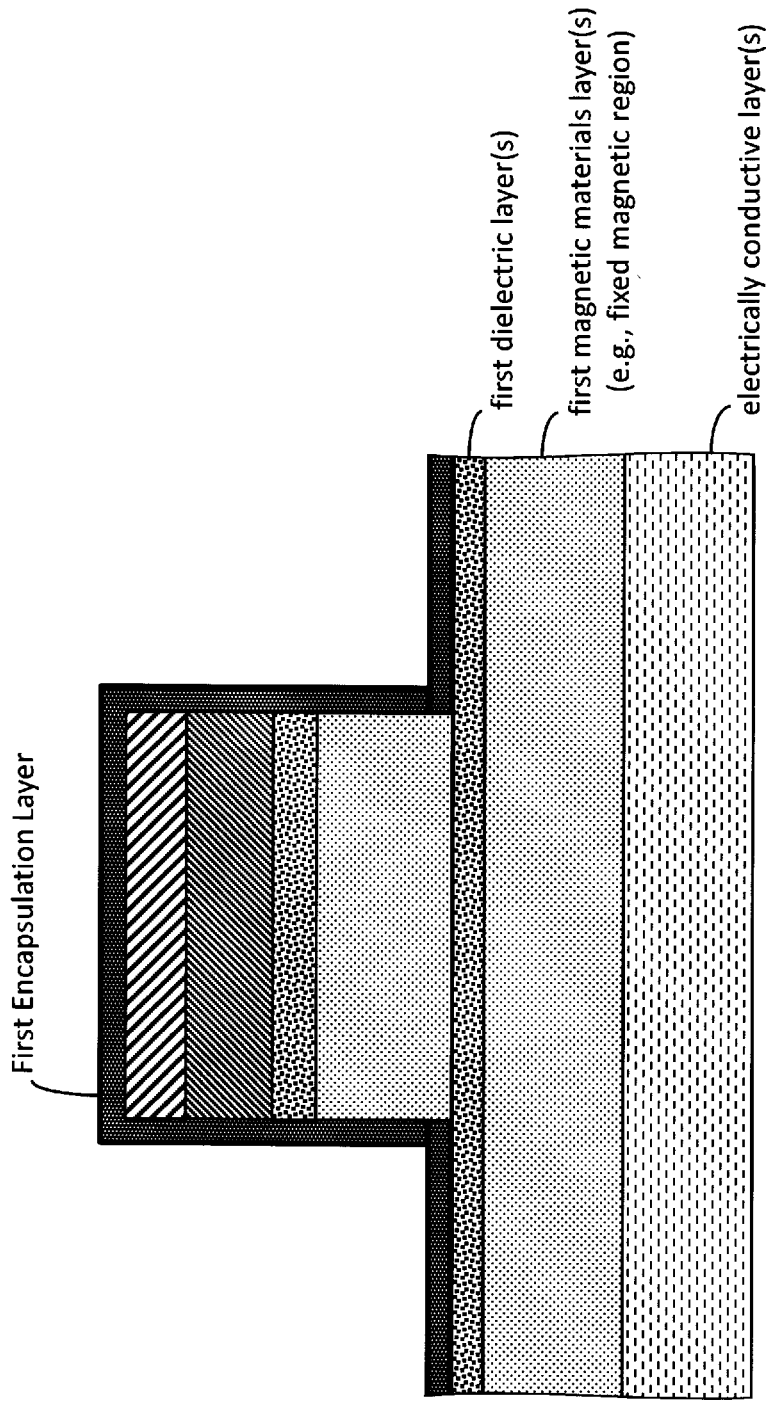
FIGS. 10A-10E illustrate cross-sectional views of a MTJ stack/structure at selected stages of manufacturing in accordance with another embodiment of the present inventions wherein at least three encapsulation layers are employed in connection with protecting a magnetic tunnel junction of the partially formed MTJ stack/structure during the manufacture of the MTJ stack/structure; wherein, the first encapsulation layer is an insulative material (for example, a metal that is at least partially oxidized or nitridized), the second encapsulation layer is an insulative material, and the third encapsulation layer is an insulative material; notably, the partially formed MTJ stack/structure of FIG. 10D may be further fabricated via techniques generally illustrated in FIGS.
Figure 10B:
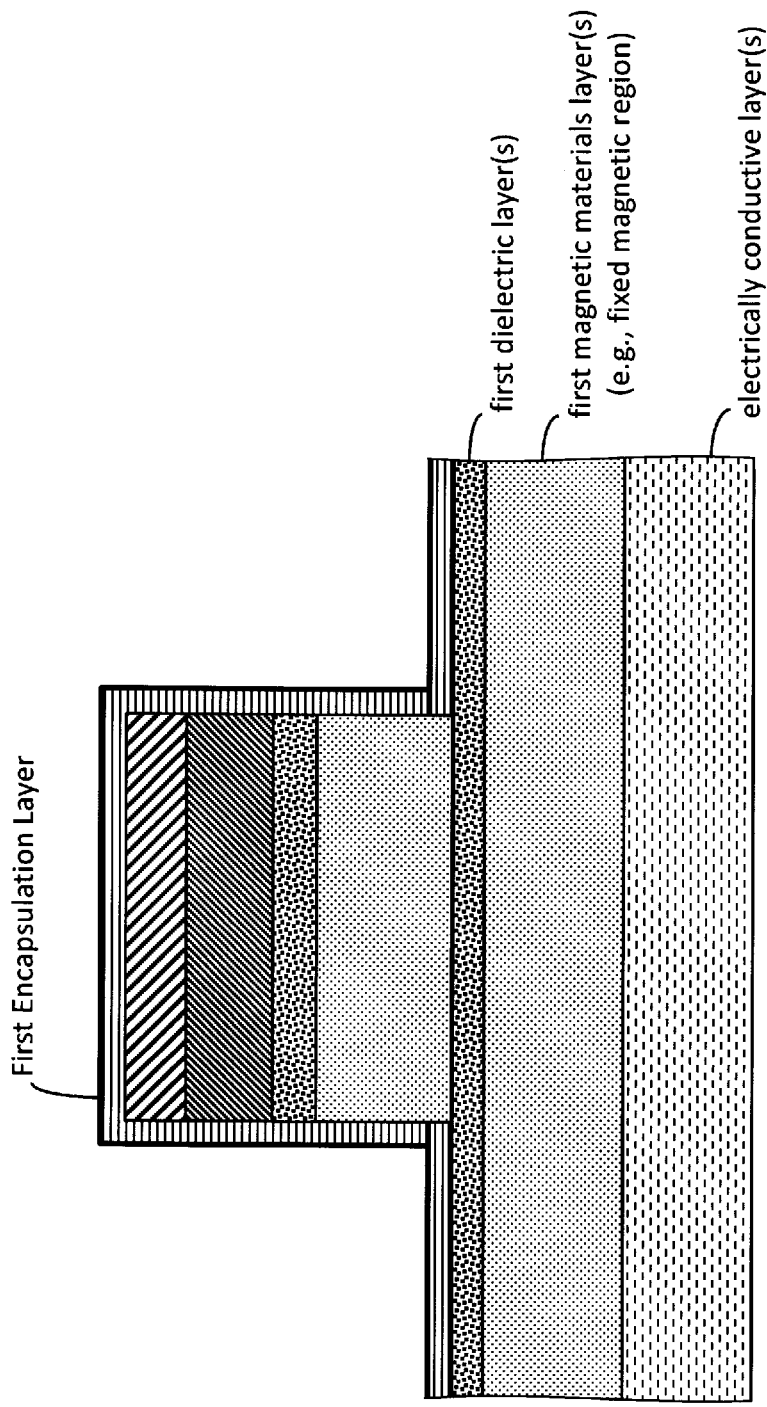
Figure 10C:
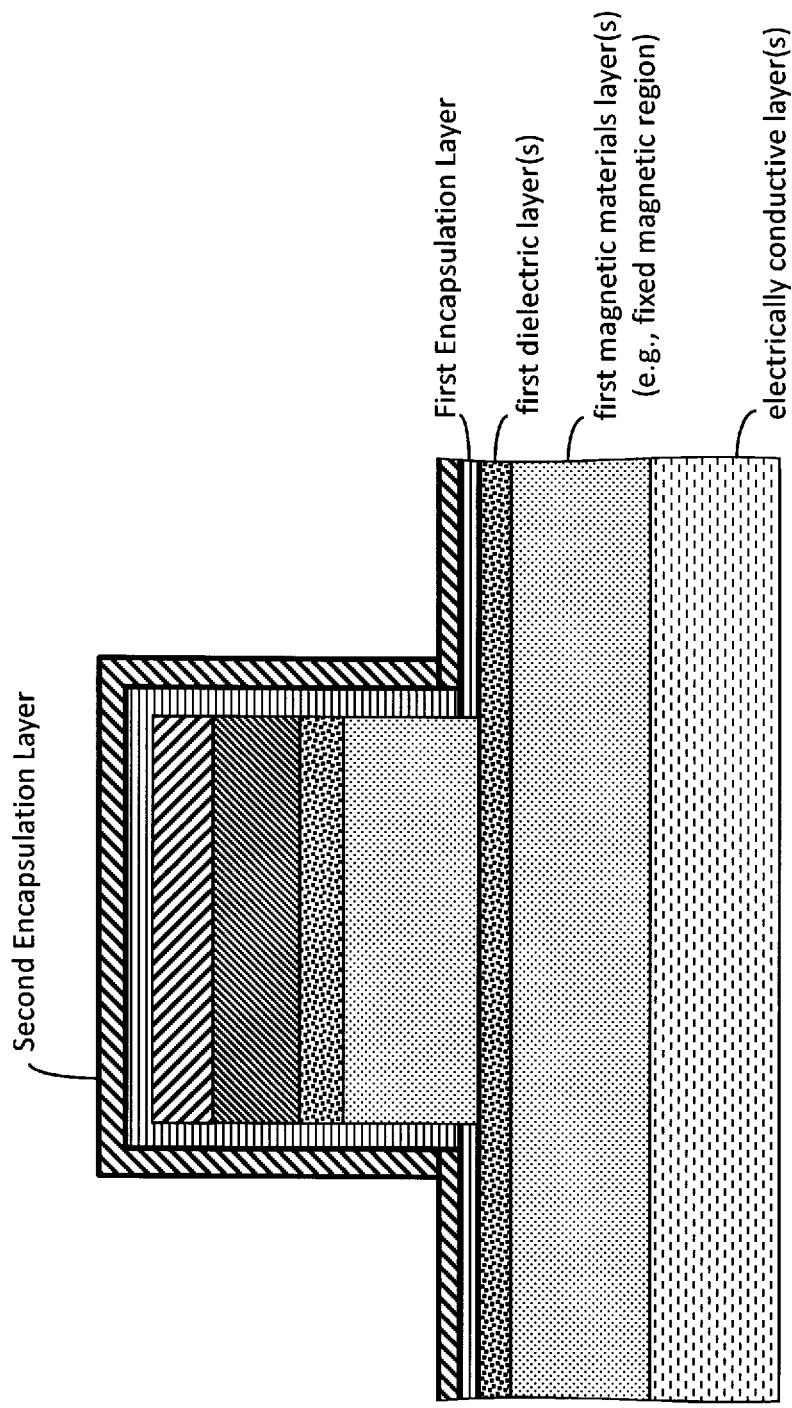
Figure 10D:
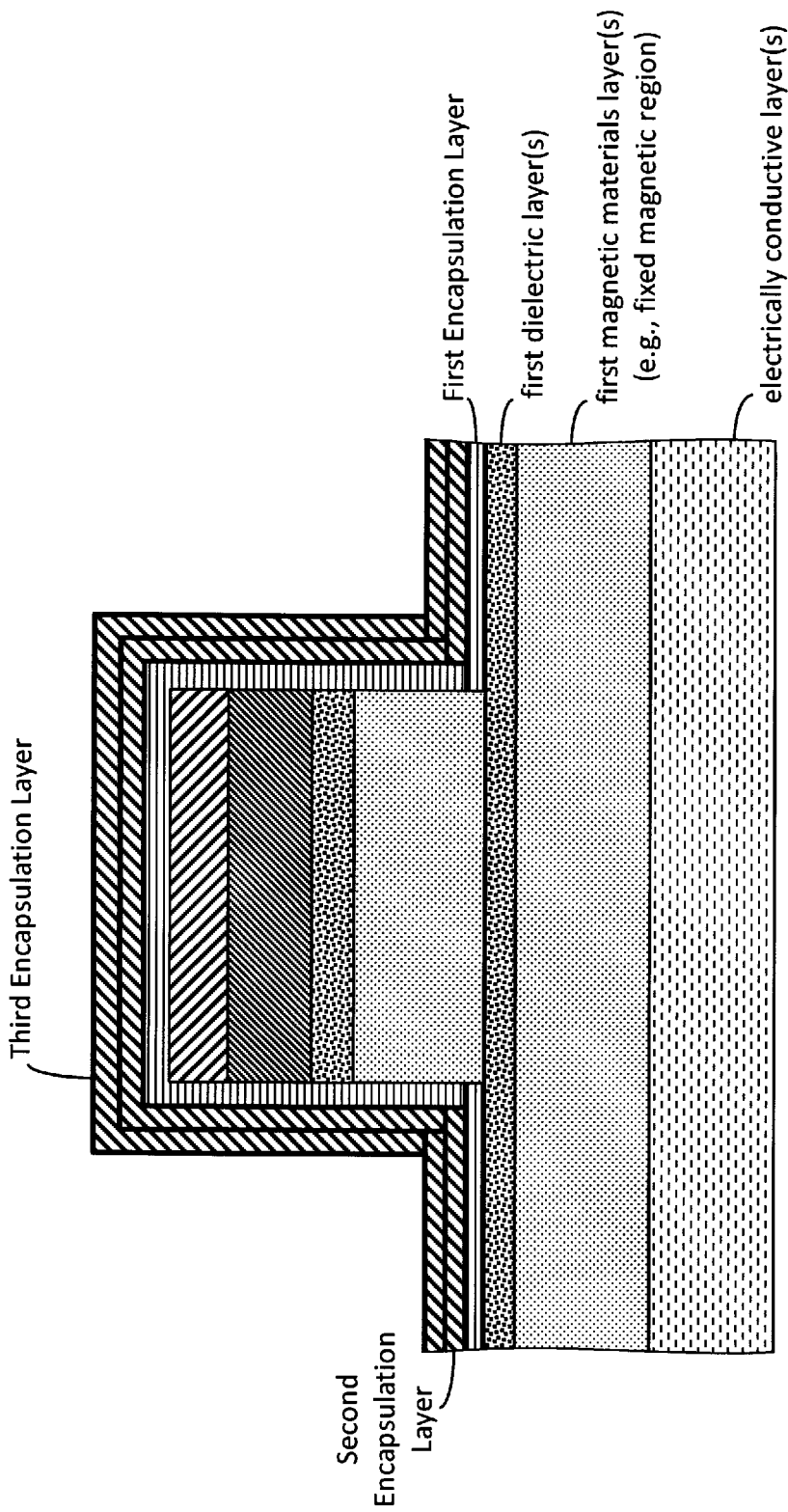
Figure 10E:
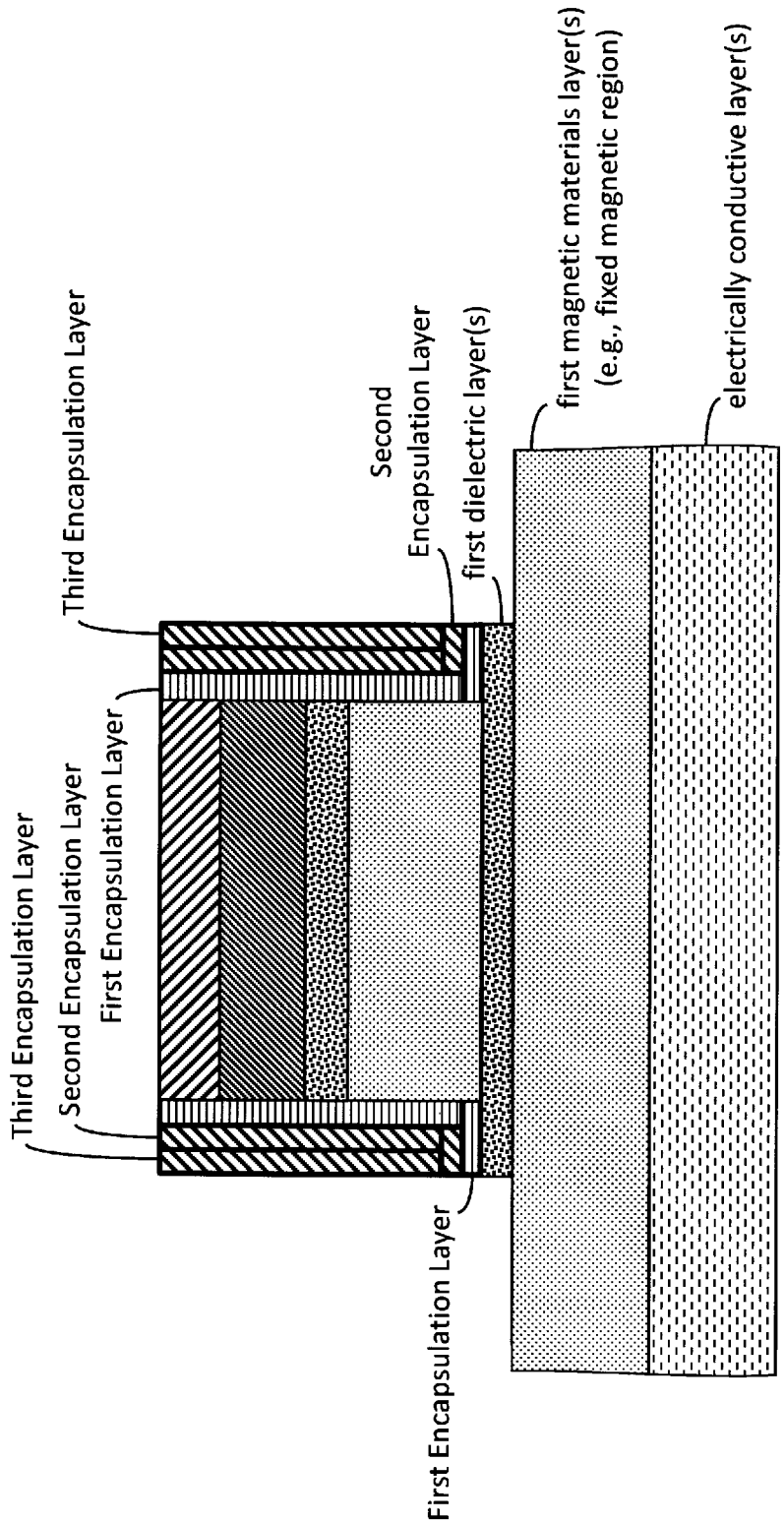

Notably, with reference to FIG. 9A, the material of the first encapsulation, in one embodiment, may be deposited as a metal or other conductive material and thereafter at least a portion thereof may be modified to an insulative material (for example, via oxidation or nitridation of the conductive material). (See, FIGS. 10A and 10B). The second and third encapsulation layers of this embodiment may be substantially the same as those of the embodiment illustrated in FIGS. 9B and 9C and thereafter similarly etched. (See, FIG. 10C-10E). For the sake of brevity, that discussion will not be repeated.

Notably, the MTJ stack/structure of FIGS. 9A-9D and 10A-10E may be completed in any manner described and/or illustrated herein or later developed. (See, for example, FIGS. 3A-5E). Indeed, all suitable techniques to complete the formation of the MTJ stack/structure, whether now known or later developed, may be employed to process and complete the MTJ stack/structure; such techniques are intended to fall within the scope of the present inventions. Moreover, the thicknesses of the encapsulation layers of the embodiment illustrated in FIGS. 9A-9D and 10A-10E may be the same as, relative to and/or similar to the thicknesses of the encapsulation layers previously described and/or illustrated herein. Indeed, the thicknesses of such layers may be based on the same considerations as those considerations discussed herein in connection with other embodiments of the present inventions.

In another embodiment, the present inventions include physical etching (for example, sputter etching, ion etching or milling, and/or ion-beam etching or milling) to remove re-deposited material (for example, ferromagnetic material) in the field region and/or on the partially formed stack/structure prior to formation of the entire encapsulation structure. For example, after etching of the magnetic material layer(s), re-deposited material forms on the exposed surfaces—and, in particular, on or in the field regions— during one or more of the initial processes (for example, after etching the magnetic materials layer(s)). (See, for example, FIGS. 11A-11E; see also, U.S. Provisional Patent Application No. 62/111,976 and U.S. patent application Ser. No. 15/013,950, which are incorporated herein by reference in their entirety; notably, all of the inventions/embodiments described and/or illustrated herein may be implemented or employed in conjunction with the inventions/embodiments of the '976 and '950 applications). Notably, any of the embodiments described and/or illustrated herein may include a physical etch to remove re-deposited material (for example, ferromagnetic material) in the field region and/or on the partially formed stack/structure. As mentioned above, the re-deposited material may be material that resides and/or re-deposits in the field region and/or on the partially formed stack/structure as a result of or resulting from processing of the partially formed stack/structure.

In one embodiment, such physical etching of the re-deposited material may be preceded (for example, immediately preceded) by an encapsulation process whereby an encapsulation material (for example, a metal or metal alloy, an aluminum oxide, silicon oxide, silicon nitride, TEOS, an aluminum nitride (such as AlN), or one or more combinations thereof)) which is deposited or formed on (i) the re-deposited material disposed in the field regions and (ii) the partially formed stack/structure (for example, on all or substantially all of the exposed portions of the partially formed stack/structure—including the sidewalls thereof). (See, FIG. 11F). The first encapsulation layer may a conductive material (for example, aluminum or magnesium). In one embodiment, the first encapsulation layer includes a thickness of less than 100 Angstrom, preferably a thickness of between 5 and 50 Angstrom or 1 and 25 Angstrom, and more preferably a thickness of less than 25 Angstrom. It may be advantageous that the amount of first encapsulation layer on the exposed surfaces of magnetic materials (in the illustrative embodiment, the sidewalls of the magnetic materials) be sufficiently thick to protect the magnetic materials from damage or contamination during removal of the re-deposited materials via subsequent processing (for example, "protect" the sidewalls of the magnetic materials to the processes of removing the re-deposited materials in the field regions). Notably, such magnetic materials may eventually operate or function as the free layer/region or the fixed layer/region of the MTJ stack/structure—albeit in a preferred embodiment, such magnetic materials form the free layer/region.

With reference to FIG. 11G, after deposition of the first encapsulation layer, one or more etch processes are employed to remove the re-deposited material (for example, ferromagnetic material) in the field region. For example, in one embodiment, the etch processes includes a physical etching (for example, sputter etching, ion etching or milling, and/or ion-beam etching or milling). Here, an Argon or Xenon sputter etch may be employed to remove the encapsulation material and the re-deposited material in the field regions and thereby "clear" or substantially "clear" the field of the re-deposited material. With continued reference to FIG. 11G, a portion of the material of the first encapsulation layer remains on the sidewalls of at least a portion of the partially formed stack/structure—including, for example, the second magnetic materials layer.

As intimated above, the methods of the present inventions may employ one or more etch processes (which may be, for example, different etch recipes and/or mechanisms) to remove the re-deposited material. For example, a first reactive ion etch may be employed to remove at least (or all) of the encapsulation material overlying the re-deposited materials portions and thereafter a sputter or ion milling etch may be employed to remove all or the remaining portions of the re-deposited materials.

With reference to FIG. 11H, after removal of all or substantially all of the re-deposited materials, a second encapsulation layer is deposited on the partially formed stack/structure (for example, on all or substantially all of the exposed portions of the partially formed stack/structure—including the sidewalls of the magnetic materials (i.e., free magnetic region or fixed magnetic region) and the material of the first encapsulation layer which is disposed on the sidewalls. The material of the second encapsulation may be, for example, conductive (magnesium, aluminum or alloys thereof) or insulative (for example, an aluminum oxide, silicon oxide, silicon nitride, TEOS, aluminum nitride or one or more combinations thereof). In this embodiment, where the material of the second encapsulation layer is conductive, such material is subsequently transformed to an insulative material.

Notably, in this embodiment, the first encapsulation layer, during the deposition or formation of the second encapsulation layer, may be at least partially transformed from a conductive material to an insulative material. (See, FIG. 11I). That is, the electrical conductivity of at least a portion of the material of the first encapsulation layer is modified to be more insulative than conductive. For example, in one embodiment, during deposition or formation of the second encapsulation layer and/or after such deposition or formation (for example, after the MTJ stack/structure is subjected to various anneal process during formation of the magnetoresistive device and/or during operation of the magnetoresistive device), oxygen or nitrogen (for example, oxygen or nitrogen employed in the formation of the second encapsulation layer) may be "absorbed" by the material of the first encapsulation layer thereby modifying the electrical conductivity of the first encapsulation layer such that at least a portion of material of the first encapsulation layer is more insulative than conductive (for example, the material of the first encapsulation layer which is in contact with the sidewalls of the partially formed MTJ stack/structure).

The second encapsulation layer may have a thickness of less than 50 Angstrom. In a preferred embodiment, the thickness of the second encapsulation layer is between 10 and 40 Angstrom. And, in a more preferred embodiment, the thickness of the second encapsulation layer is between 10 and 20 Angstrom.

The thickness of the second encapsulation layer may be a function of the thickness of the first encapsulation layer, the oxidation or nitridation dose and the depth of absorption of the oxygen or nitrogen by the material of the second encapsulation layer and the material of the first encapsulation layer (during deposition or formation of the second encapsulation layer and/or after such deposition or formation (for example, after the MTJ stack/structure is subjected to various anneal process during formation of the magnetoresistive device and/or during operation of the magnetoresistive device). In addition, in another embodiment, the second encapsulation layer includes a thickness such that the aggregate thickness of the first and second encapsulation layers provides, defines or establishes a desired or suitable relative width or diameter of a free magnetic layer to (i) fixed magnetic layer and/or (ii) first dielectric layer or magnetic tunnel barrier.

After deposition of the second encapsulation material, one or more etch processes may be employed to etch the first dielectric layer to form a magnetic tunnel barrier of the MTJ stack/structure (see FIG. 11J). Such etching may also be via conventional techniques. Notably, the encapsulation layers disposed on the sidewalls of the partially formed stack/structure may be employed in a self-aligned etch process when forming other portions of the stack/structure. As intimated above, where the second magnetic layer is free magnetic region and the first magnetic layer is fixed magnetic region, it may be advantageous to provide first and second encapsulation layers having thicknesses that, in total, facilitate differentiation of the magnetic edges of the free layer and fixed layer.

Thereafter, the remaining layers or regions of the MTJ stack/structure are processed and completed. (See, for example, FIGS. 12A-12F). During such processing, one or more additional encapsulation layers or hard masks may be deposited and/or formed. (See, for example, FIGS. 12B-12F). For example, in one embodiment, after etching the first dielectric layer (which may be comprised of or formed by deposition of multiple layers) and at least a portion of the first magnetic layers (which is disposed beneath the first dielectric layer), an encapsulation layer and/or hard mask may be deposited or formed over the partially formed structure (including the sidewalls of the magnetic tunnel barrier and first magnetic layers) and thereafter the bottom electrode is etched. (See, for example, FIGS. 12B and 12C). In another embodiment, after etching the first dielectric an encapsulation layer and/or hard mask may be deposited or formed over the partially formed structure, including the sidewalls of the magnetic tunnel barrier, and thereafter the first magnetic layers and the bottom electrode are etched. (See, for example, FIG. 12D). Notably, in yet another embodiment the first magnetic layers may be partially etched before deposition or formation of another encapsulation layer and/or hard mask (see, FIG. 12E) or fully etched (see, FIG. 12F). All permutations of etching and encapsulation are intended to fall within the scope of the present inventions. Moreover, all techniques suitable may be employed to process and complete the MTJ stack/structure; such techniques are intended to fall within the scope of the present inventions.

In those embodiments where the mask is removed to facilitate access to the MTJ stack/structure, an insulator/dielectric may be deposited over the entire stack/structure and field region (see FIG. 13A) and thereafter removed (e.g., via CMP) together with the mask which exposes the top electrode of the MTJ stack/structure (see FIG. 13B). This technique may be employed in connection with any of the techniques used to process and complete the MTJ stack/structure. Notably, in those embodiments where the mask is electrically conductive and employed as the top electrode, or a portion thereof, (see, for example, U.S. Pat. No. 9,023,219) the same process as illustrated in FIG. 13A may be implemented, however, removal of a portion of the insulator/dielectric terminates on or substantially on the mask.

With reference to FIG. 14A, in another embodiment, a first encapsulation layer (for example, an aluminum oxide (such as $Al_2O_3$), a silicon oxide (such as $SiO_2$), a silicon nitride (such as $Si_3N_4$), a magnesium oxide (such as MgO), a TEOS, an aluminum nitride (such as AlN), or one or more combinations thereof) is deposited on (i) the re-deposited material disposed in the field regions and (ii) the partially formed stack/structure (for example, on all or substantially all of the exposed portions of the partially formed stack/structure—including the sidewalls thereof). Alternatively, the material of the first encapsulation layer may initially be a conductive material which is thereafter at least partially changed or converted to an insulative material (for example, the electrical conductivity of at least a portion of the material of the first encapsulation layer which is in contact with the sidewalls of the partially formed MTJ stack/structure to be more insulative than conductive).

With reference to FIG. 14B, after deposition or formation of the first encapsulation layer, as described above, one or more etch processes are employed to remove the re-deposited material and first encapsulation layer in the field regions. For example, in one embodiment, the etch processes includes a physical etching (for example, sputter etching, ion etching or milling, and/or ion-beam etching or milling). Here, an Argon or Xenon sputter etch may be employed to remove the encapsulation material and the re-deposited material in the field regions and thereby "clear" or substantially "clear" the field of the re-deposited material. With continued reference to FIG. 14B, a portion of the material of the first encapsulation layer remains on the sidewalls of at least a portion of the partially formed stack/structure—including, for example, the second magnetic materials layer.

With reference to FIG. 14C, after removal of all or substantially all of the re-deposited materials, a second encapsulation layer is deposited on the partially formed stack/structure—i.e., on all or substantially all of the exposed portions of the partially formed stack/structure including on or above the first encapsulation layer which is disposed on the sidewalls of the second magnetic materials layer (i.e., free magnetic region or fixed magnetic region). The material of the second encapsulation may be, for example, conductive (magnesium, aluminum or alloys thereof) or insulative (for example, an aluminum oxide, silicon oxide, silicon nitride, TEOS, aluminum nitride or one or more combinations thereof).

The second encapsulation layer may have a thickness of less than 50 Angstrom. In a preferred embodiment, the thickness of the second encapsulation layer is between 10 and 40 Angstrom. And, in a more preferred embodiment, the thickness of the second encapsulation layer is between 10 and 20 Angstrom.

The thickness of the second encapsulation layer may be a function of the thickness of the first encapsulation layer. That is, the second encapsulation layer may include a thickness such that the aggregate thickness of the first and second encapsulation layers provides, defines or establishes a desired or suitable relative width or diameter of a free magnetic layer to (i) fixed magnetic layer and/or (ii) first dielectric layer or magnetic tunnel barrier.

After deposition of the second encapsulation layer, one or more etch processes may be employed to etch the first dielectric layer to form a magnetic tunnel barrier of the MTJ stack/structure (see FIG. 14D). Such etching may also be via conventional techniques. Notably, the encapsulation layers disposed on the sidewalls of the partially formed stack/ structure may be employed in a self-aligned etch process when forming other portions of the stack/structure. Notably, as intimated above, where the second magnetic layer is free magnetic region and the first magnetic layer is fixed magnetic region, it may be advantageous to provide first and second encapsulation layers having thicknesses that, in total, facilitate differentiation of the magnetic edges of the free layer and fixed layer.

The MTJ stack/structure of FIG. 14D may be completed in the manner described and/or illustrated above. (See, for example, FIGS. 12A-13B). Indeed, all suitable techniques to complete the formation of the MTJ stack/structure, whether now known or later developed, may be employed to process and complete the MTJ stack/structure; such techniques are intended to fall within the scope of the present inventions. In another embodiment of this aspect of the inventions, the encapsulation structure includes more than two encapsulation layers. For example, with reference to FIGS. 15A and 15B, a first encapsulation layer consists of a conductive material (for example, a metal or metal alloy such as, example, aluminum or magnesium). Thereafter, one or more etch processes are employed to remove the encapsulation material and the re-deposited material in the field regions. For example, in one embodiment, the etch processes includes a physical etching (for example, sputter etching, ion etching or milling, and/or ion-beam etching or milling). In is way, the re-deposited material is "cleared" or substantially "cleared" from the field regions. In addition, a portion of the material of the first encapsulation layer remains on the sidewalls of at least a portion of the partially formed stack/structure—including, for example, the second magnetic materials layer.

With reference to FIG. 15D, a second encapsulation layer is then deposited on the partially formed stack/structure (for example, on all or substantially all of the exposed portions of the partially formed stack/structure—including on or above the first encapsulation layer which is disposed on the sidewalls of the magnetic materials (i.e., free magnetic region or fixed magnetic region) and the material of the first encapsulation layer which is disposed on the sidewalls. The material of the second encapsulation may be, for example, conductive (magnesium, aluminum or alloys thereof) or insulative (for example, an aluminum oxide, silicon oxide, silicon nitride, TEOS, aluminum nitride or one or more combinations thereof).

In this embodiment, where the second encapsulation layer is a conductive material, that material is at least partially changed or transformed from a conductive material to an insulative material. (See, FIG. 15E). That is, the electrical conductivity of at least a portion of the material of the second encapsulation layer is modified to be more insulative than conductive. In addition, at least a portion of the conductive material of the first encapsulation layer is also at least partially changed or transformed from a conductive material to an insulative material. For example, in one embodiment, during deposition or formation of the second encapsulation layer and/or after such deposition or formation (for example, after the MTJ stack/structure is subjected to various anneal process during formation of the magnetoresistive device and/or during operation of the magnetoresistive device), oxygen or nitrogen (for example, oxygen or nitrogen employed in the deposition of the insulative material or in the formation of the second encapsulation layer) may be "absorbed" by the material of the first encapsulation layer thereby modifying the electrical conductivity of the material of the first encapsulation layer such that at least a portion of material of the first encapsulation layer is more insulative than conductive (for example, the material of the first encapsulation layer which is in contact with the sidewalls of the partially formed MTJ stack/structure).

Thereafter, a third encapsulation layer is deposited on or over the second encapsulation layer. (See, FIG. 15F). The third encapsulation layer may be a conductive material (for example, an aluminum and/or magnesium (or alloys thereof)) or an insulative material (for example, an aluminum oxide, a silicon oxide, a silicon nitride, a magnesium oxide, a TEOS, an aluminum nitride, and/or combinations thereof). In one embodiment, the third encapsulation layer includes a thickness that, in the aggregate of the thicknesses of the first, second and third encapsulation layers provides, defines or establishes a desired or suitable relative width or diameter of a free magnetic layer to (i) fixed magnetic layer and/or (ii) first dielectric layer or magnetic tunnel barrier of the MTJ stack/structure. Moreover, employing a third encapsulation layer, having a certain thickness that reduces the likelihood of defects or pinholes in the three layer encapsulation structure, may increase the effectiveness of the multilayer encapsulation structure and the stack and improve the reliability and/or thermal endurance of the MTJ stack/structure by reducing the likelihood of unwanted/ excessive contamination of, for example, the magnetic tunnel barrier of the MTJ stack/structure.

With reference to FIG. 15G, the first dielectric layer(s) is then etched (together with the encapsulation layers in the field areas) to form or define a magnetic tunnel barrier. As noted above, the first dielectric layer(s) (for example, an MgO and/or AlOx) may be etched and/or patterned using any etchants and/or technique now known or later developed—for example, using physical etchants and etching techniques (for example, sputter etching techniques). It should be noted that the present inventions may employ any suitable etchants and techniques, whether now known or later developed, to etch the one or more layers of electrically conductive materials and thereby form, define and/or provide the tunnel barrier. With continued reference to FIG. 15G, a portion of the materials of the encapsulation layers remain on the partially formed stack/structure, for example, on sidewalls of the partially formed stack/structure—including the magnetic materials.

The MTJ stack/structure of FIGS. 15A-15G may be completed in the manner described and/or illustrated herein. Indeed, all suitable techniques to complete the formation of the MTJ stack/structure, whether now known or later developed, may be employed to process and complete the MTJ stack/structure; such techniques are intended to fall within the scope of the present inventions.

The thicknesses of encapsulation layers of the embodiment illustrated in FIGS. 15A-15G may be the same as, relative to and/or similar to the thicknesses of the encapsulation layers described and/or illustrated in any of the embodiments set forth herein. Indeed, the thicknesses of such layers may be based on the same considerations as those considerations discussed herein in connection with other embodiment of the present inventions.

In one embodiment, the first encapsulation layer has a thickness of less than 35 Angstrom; and, in a preferred embodiment, the thickness of the first encapsulation layer is between 10 and 25 Angstrom. The second encapsulation layer may have a thickness of less than 50 Angstrom; and, in a preferred embodiment, the thickness of the second encapsulation layer is between 10 and 40 Angstrom. In one embodiment, the thickness of the second encapsulation layer is a function of the oxidation or nitridation dose and the depth of absorption of the oxygen or nitrogen by the material of the second encapsulation layer during formation. Further, the third encapsulation layer may have a thickness of less than 35 Angstrom; and in a preferred embodiment, the thickness is between 10 and 25 Angstrom.

Notably, additional encapsulation layers may be provided to, among other things, further protect the partially formed MTJ stack/structure (for example, further reducing the likelihood of defects or pinholes in the encapsulation structure) and/or further define or establish a relative width or diameter of a free magnetic layer relative to fixed magnetic layer, or vice versa. Such additional encapsulation layer(s) may consist of conductive and/or insulative materials.

In another embodiment of the present inventions, the first and second encapsulation layers consist of the same materials as the embodiment of FIGS. 15A-15E, however, in is embodiment, the third encapsulation layer consists of insulative material. (See, for example, FIGS. 16A-16F). Here, it may be advantageous to employ an insulative material (e.g., an oxide or nitride) to further reduce the likelihood of defects or pinholes in the encapsulation structure.

With reference to FIG. 16G, the first dielectric layer(s) is then etched (together with the encapsulation layers in the field areas) to form a magnetic tunnel barrier. The inventions may employ any suitable etchants and techniques, whether now known or later developed, to etch the one or more layers of electrically conductive materials and thereby form, define and/or provide the tunnel barrier. With continued reference to FIG. 16G, a portion of the materials of the encapsulation layers remain on the partially formed stack/structure, for example, on sidewalls of the partially formed stack/structure—including the second magnetic materials.

Notably, the MTJ stack/structure of FIGS. 16A-16F may be completed in the manner described and/or illustrated above. Indeed, all suitable techniques to complete the formation of the MTJ stack/structure, whether now known or later developed, may be employed to process and complete the MTJ stack/structure; such techniques are intended to fall within the scope of the present inventions. Moreover, the thicknesses of the encapsulation layers of the embodiment illustrated in FIGS. 16A-16F may be the same as, relative to and/or similar to the thicknesses of the encapsulation layers previously described and/or illustrated herein. Indeed, the thicknesses of such layers may be based on the same considerations as those considerations discussed herein in connection with other embodiments.

In yet another embodiment, with reference to FIGS. 17A and 17B, the first encapsulation layer is at least partially an insulative material (for example, an aluminum oxide, silicon oxide, silicon nitride, TEOS, an aluminum nitride (such as AlN), or one or more combinations thereof). The material of the first encapsulation layer may be deposited as an insulative material or a conductive material which is thereafter at least partially transformed or changed into an insulative material. In one embodiment, the electrical conductivity of at least a portion of the material of the first encapsulation layer which is in contact with the sidewalls of the partially formed MTJ stack/structure is an insulative material.

In one embodiment, the first encapsulation layer includes a thickness of less than 100 Angstrom, preferably a thickness of between 5 and 50 Angstrom or 1 and 25 Angstrom, and more preferably a thickness of less than 25 Angstrom. It may be advantageous that the amount of first encapsulation layer on the exposed surfaces of magnetic materials (in the illustrative embodiment, the sidewalls of the magnetic materials) be sufficiently thick to protect the magnetic materials from damage or contamination during removal of the re-deposited materials via subsequent processing (for example, "protect" the sidewalls of the magnetic materials to the processes of removing the re-deposited materials in the field regions). Notably, such magnetic materials may eventually operate or function as the free layer/region or the fixed layer/region of the MTJ stack/structure—albeit in a preferred embodiment, such magnetic materials form the free layer/region.

With reference to FIG. 17D, after deposition of the first encapsulation layer, one or more etch processes are employed to remove the re-deposited material (for example, ferromagnetic material) in the field region. For example, in one embodiment, the etch processes includes a physical etching (for example, sputter etching, ion etching or milling, and/or ion-beam etching or milling). Here, an Argon or Xenon sputter etch may be employed to remove the encapsulation material and the re-deposited material in the field regions and thereby "clear" or substantially "clear" the field of the re-deposited material. Notably, a portion of the material of the first encapsulation layer remains on the sidewalls of at least a portion of the partially formed stack/structure—including, for example, the second magnetic materials layer.

As intimated above, the methods of the present inventions may employ one or more etch processes (which may be, for example, different etch recipes and/or mechanisms) to remove the re-deposited material. For example, a first reactive ion etch may be employed to remove at least (or all) of the encapsulation material overlying the re-deposited materials portions and thereafter a sputter or ion milling etch may be employed to remove all or the remaining portions of the re-deposited materials.

With reference to FIG. 17E, after removal of all or substantially all of the re-deposited materials, a second encapsulation layer is deposited on the partially formed stack/structure (for example, on all or substantially all of the exposed portions of the partially formed stack/structure—including the sidewalls of the magnetic materials (i.e., free magnetic region or fixed magnetic region) and the material of the first encapsulation layer which is disposed on the sidewalls. The material of the second encapsulation may be, for example, conductive (magnesium, aluminum or alloys thereof). The second encapsulation layer may have a thickness of less than 50 Angstrom. In a preferred embodiment, the thickness of the second encapsulation layer is between 10 and 40 Angstrom. And, in a more preferred embodiment, the thickness of the second encapsulation layer is between 10 and 20 Angstrom.

After deposition of the second encapsulation layer, a third encapsulation layer is deposited or formed on or over the second encapsulation layer. (See, FIG. 17F). The third encapsulation layer may be a conductive material (for example, an aluminum and/or magnesium (or alloy thereof)) or an insulative material (for example, an aluminum oxide, a silicon oxide, a silicon nitride, a magnesium oxide, a TEOS, an aluminum nitride, and/or one or more combinations thereof). In one embodiment, the third encapsulation layer includes a thickness that, in the aggregate of the thicknesses of the first, second and third encapsulation layers provides a desired or suitable relative width or diameter of a free magnetic layer to (i) fixed magnetic layer and/or (ii) first dielectric layer or magnetic tunnel barrier of the MTJ stack/structure.

With reference to FIG. 17G, the first dielectric layer(s) may then be etched (together with the encapsulation layers in the field areas) to form or define a magnetic tunnel barrier of the MTJ stack/structure. As noted above, the first dielectric layer(s) (for example, an MgO and/or AlOx) may be etched and/or patterned using any etchants and/or technique now known or later developed—for example, using physical etchants and etching techniques (for example, sputter etching techniques). Notably, a portion of the materials of the encapsulation layers remain on the partially formed stack/structure, for example, on sidewalls of the partially formed stack/structure—including the magnetic materials.

The MTJ stack/structure of FIGS. 17A-17G may be completed in the manner described and/or illustrated herein. Indeed, all suitable techniques to process and complete the formation of the MTJ stack/structure, including those described herein, whether now known or later developed, may be employed; such techniques are intended to fall within the scope of the inventions.

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the above embodiments of the inventions are merely exemplary. They are not intended to be exhaustive or to limit the inventions to the precise forms, techniques, materials and/or configurations disclosed. Many modifications and variations are possible in light of this disclosure. It is to be understood that other embodiments may be utilized and operational changes may be made without departing from the scope of the present inventions. As such, the scope of the inventions is not limited solely to the description above because the description of the above embodiments has been presented for the purposes of illustration and description.

Indeed, the present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof.

Many modifications, variations, combinations and/or permutations are possible in light of the above teaching. For example, although certain exemplary techniques are described and/or illustrated above in the context of MTJ devices, as noted above, the present inventions may be implemented in GMR stacks of GMR-based magnetoresistive devices (for example, sensor and memory). For the sake of brevity such discussions/illustrations will not be repeated in the context of GMR-based magnetoresistive devices—but it is to be interpreted as entirely applicable to GMR stacks/structures where a conductor (rather than a dielectric material in the case of MTJ stacks/structures) is disposed between magnetic materials.

For example, in one embodiment, the amount of oxidation/nitridation or the oxidation/nitridation dose of the plurality of encapsulation layers may vary between encapsulation layers and/or within each layer. For example, a first encapsulation layer (for example, a conductor) may be deposited and thereafter lightly or not oxidized/nitridized, a second encapsulation layer may then be deposited and thereafter more heavily oxidized/nitridized (relative to the oxidation/nitridation dose of the first encapsulation layer), and a third encapsulation layer may be deposited and either oxidized (for example, the same or more heavily oxidized/nitridized than the first encapsulation layer; that is, the oxidation/nitridation dose of the second encapsulation layer is the same or greater than the oxidation/nitridation dose of the first encapsulation layer; but a lower dose (or the same as) the oxidization/nitridation dose of the second encapsulation layer) or not oxidized/nitridized. The oxidation or nitridation of the encapsulation layer(s) may be, for example, via (i) a process of exposing the encapsulation layer to an oxygen or nitrogen atmosphere, respectively, or (ii) diffusion of oxygen or nitrogen from a preceding or subsequent layer or material in contact therewith. In one embodiment, for example, the oxidization or nitridation is of an encapsulation layer may be by using at least one of natural oxidation/nitridation, exposure to oxygen or nitrogen radicals, and/or an argon and oxygen or nitrogen plasma. In one embodiment, the oxidation/nitridation dose is controlled by the combination of the time of exposure to and the pressure of oxygen or nitrogen gas.

Notably, the immediately aforementioned discussion of the amount of oxidation/nitridation or the oxidation/nitridation dose of the plurality of encapsulation layers is applicable to any or all of the embodiments set forth herein. For the sake of brevity such discussion will not be repeated.

Further, in those embodiments that employ a physical etching (for example, sputter etching, ion etching or milling, and/or ion-beam etching or milling) to, for example, remove re-deposited material (for example, ferromagnetic material) and the first encapsulation layer in a field region (adjacent to the partially formed MTJ stack/structure), the present inventions may vary the isotropy or angle of the physical etch. In this way, such an etch may lead to a more thorough clearing of the re-deposited material. For example, in one embodiment, the wafer may be tilted and rotated; in another embodiment, the mechanism to the etch tool causing or creating the physical etch is angled in order to vary its isotropy. Indeed, any technique now known or later developed to vary the isotropy or angle of the physical etch may be employed.

In addition, the magnetoresistive structures/stacks of the present inventions may be formed on a "bottom" electrode, via and/or conductor. In addition thereto, or in lieu thereof, although the illustrated embodiments depict a "top" electrode being formed in the etch processes, the present inventions may be implemented in an architecture where a via and/or conductor is/are formed on the magnetoresistive structures/stacks of the present inventions. In these embodiments, one or both separate electrodes are omitted and the via/conductor provide electrical connection to the magnetoresistive structure/stack thereby allowing for or facilitating electrical connectivity to circuitry and other elements of the device. Under these circumstances, the via(s)/conductor(s) is/are substitute(s) for electrode(s) formed from separate and distinct electrically conductive layer(s).

Notably, while the magnetic materials layer(s) and magnetic materials of the MTJ stack or structure are illustrated as a single layer, the magnetic materials layer(s) and magnetic materials may include a number of different layers of both magnetic and nonmagnetic material. For example, the layers may include multiple layers of magnetic material, dielectric layers that provide one or more diffusion barriers, coupling layers between layers of magnetic material that provide for ferromagnetic or antiferromagnetic coupling, anti-ferromagnetic material. For example, one of the magnetic material layer(s) may include a set of layers forming a synthetic antiferromagnetic structure (SAF) and an antiferromagnetic layer, seeding layers, diffusion layers as well as non-contiguous layers of magnetic and nonmagnetic material. The other magnetic material layer(s) may include a set of layers corresponding to a SyF, seeding layers, spacing layers, diffusion layers as well as non-contiguous layers of magnetic and nonmagnetic material. Notably, each of the layers shown to be included in the magnetoresistive device may be a composite layer that includes multiple sub-layers. Other embodiments may include multiple SAFs, SyFs, and tunnel barriers in addition to the other layers, where the materials and structures are arranged in various combinations and permutations now known or later developed.

Further, the one or more layers of magnetic materials (for example, Nickel (Ni), Iron (Fe), Cobalt (Co), Palladium (Pd), Magnesium (Mg), Manganese (Mn) and alloys thereof) may be etched, formed and/or patterned using any etchants and/or technique now known or later developed—for example, using mechanical and/or chemical techniques (for example, a low bias power sputter technique or a chemical etch technique such as a conventional fluorine and/or chlorine based etch technique). Where the magnetic material stack includes one or more synthetic SAF or SyF, the one or more layers of magnetic materials layers may also include one or more non-magnetic materials layers (for example, Ru, Cu, Al). Notably, one or more magnetic material stack may include SAF and SyF structures, one or more layers of magnetic materials, and other materials (including magnetic and/or non-magnetic) now known or later developed. Such materials and/or structures may be arranged in any combination or permutation now known or later developed.

In the embodiments described herein, one or more, or all of the materials of the encapsulation layers may consist of or include the same materials or different materials—for example, one of the encapsulation materials may include an aluminum oxide, another encapsulation material includes a silicon nitride or a silicon oxide, and yet another encapsulation material (in those embodiments where more than two encapsulation materials are employed) includes a TEOS, aluminum nitride, an aluminum oxide or a magnesium oxide, or one or more combinations thereof. Moreover, the deposition technique employed in connection with the encapsulation materials on the partially formed MTJ stack/structure and on or in the field region may be the same or different. All combination and permutations of materials and techniques are intended to fall within the scope of the present inventions.

Notably, certain aspects of the manufacturing embodiment of FIGS. 1A-1G, 4A, 4B and 5A-5D are similar to the embodiments described and/or illustrated in U.S. patent application Ser. No. 14/296,153, entitled "Isolation of Magnetic Layers During Etch in a Magnetoresistive Device", filed Nov. 3, 2014. The inventions/embodiments of U.S. patent application Ser. No. 14/296,153 may be employed in conjunction with the inventions/embodiments described and/or illustrated herein. The contents of U.S. patent application Ser. No. 14/296,153 are incorporated herein by reference.

The MTJ stack/structure may have out-of-plane magnetic anisotropy or in-plane magnetic anisotropy. The present inventions are applicable to all forms or types of magnetoresistive devices. Moreover, the free magnetic region may be disposed on the magnetic tunnel barrier or beneath the magnetic tunnel barrier; the fixed magnetic region would be disposed on and interface a side of the magnetic tunnel barrier which is opposite to the side that interfaces the free magnetic region.

The present inventions may be employed in connection with a magnetoresistive stack/structure—for example, one or more magnetoresistive stacks/structures for a sensor/transducer or memory device (for example, a device having one or more MTJ stacks/structures (for example, a plurality of MTJ stacks/structures of a MTJ-based sensor/transducer and/or MTJ-based memory devices that are configured in an array layout (see FIGS. 18, 19A and 19B))) wherein MTJ-based magnetoresistive sensor/transducer or magnetoresistive memory device includes one or more MTJ stacks/structures manufactured (in whole or in part) using any of the manufacturing techniques described and/or illustrated herein. For example, in a memory configuration, the magnetoresistive memory stack/structure may be electrically connected to an access transistor and configured to coupled or connect to various conductors (which carry one or more control signals). (See, FIG. 18). In one embodiment, a plurality of magnetoresistive memory stacks/structures may be fabricated and/or incorporated on an integrated circuit, for example, in an MRAM array. (See, FIGS. 19A and 19B).

As noted above, the encapsulation layer disposed on the sidewalls of the partially formed stack/structure may have a thickness that provides or facilitates a predetermined self-aligned etch process when forming other portions of the stack/structure. Indeed, where the top magnetic layer is the free magnetic region and the bottom magnetic layer is the fixed magnetic region, it may be advantageous to provide an encapsulation layer structure having an aggregate thicknesses that, in total, facilitates or provides differentiation of the magnetic edges of the free magnetic region and fixed magnetic region so that the diameter of the fixed magnetic region is a predetermined amount greater than the diameter of the free magnetic region (for example, in one embodiment, greater than 1.5×, in another embodiment, greater than 1.7× to 1.75×, and in yet another embodiment, greater than 1.5× to 2.0×). Moreover, in those embodiments where more than two encapsulation layers are employed, it may be advantageous to provide a total thickness of the encapsulation layers that provide a predetermined differentiation of the magnetic edges of the free magnetic region and fixed magnetic region so that the diameter of the fixed magnetic region is the predetermined amount greater than the diameter of the free magnetic region.

Although the described exemplary embodiments disclosed herein are directed to various magnetoresistive-based devices and methods for making such devices, the present disclosure is not necessarily limited to the exemplary embodiments, which illustrate inventive aspects that are applicable to a wide variety of semiconductor processes and/or devices. Thus, the particular embodiments disclosed above are illustrative only and should not be taken as limitations, as the embodiments may be modified and practiced in different but equivalent manners apparent to those skilled in the art having the benefit of the teachings herein. Accordingly, the foregoing description is not intended to limit the disclosure to the particular form set forth, but on the contrary, is intended to cover such alternatives, modifications and equivalents as may be included within the spirit and scope of the inventions so that those skilled in the art should understand that they can make various changes, substitutions and alterations without departing from the spirit and scope of the inventions in their broadest form.

Notably, as indicated above, reference herein to "one embodiment" or "an embodiment" means that a particular feature, structure, or characteristic described in connection with the embodiment may be included, employed and/or incorporated in one, some or all of the embodiments of the present inventions. The usages or appearances of the phrase "in one embodiment" or "in another embodiment" in the specification are not referring to the same embodiment, nor are separate or alternative embodiments necessarily mutually exclusive of one or more other embodiments, nor limited to a single exclusive embodiment. The same applies to the term "implementation." The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein.

Further, as indicated above, an embodiment or implementation described herein as exemplary is not to be construed as preferred or advantageous, for example, over other embodiments or implementations; rather, it is intended convey or indicate the embodiment or embodiments are example embodiment(s). Thus, as noted above, the term "exemplary" is used in the sense of an "example," rather than "ideal" or "preferred" or "advantageous".

In the claims, the term "magnetic material" means or includes magnetic and/or ferromagnetic material. Further, the term "deposit" (or various forms thereof (e.g., deposited, deposition or depositing)) in the claims means or includes deposit, grow, sputter, evaporate and/or provide (or various forms thereof).

Moreover, in the claims, the terms "comprise," "include," "have" and any variations thereof (for example, "comprising," "including" and "having") are used synonymously to denote or describe non-exclusive inclusion. As such, a process, method, article and/or apparatus that uses such terms to, for example, describe a recipe, configuration and/or contents, does not include only those steps, structures and/or elements but may include other steps, structures and/or elements not expressly identified, listed or inherent to such process, method, article or apparatus.

Further, in the claims, the terms "first," "second," and the like, herein do not denote any order, quantity, or importance, but rather are used to distinguish one element from another. Moreover, the terms "a" and "an" herein do not denote a limitation of quantity, but rather denote the presence of at least one of the referenced item.

What is claimed is:

1. A method of manufacturing a magnetoresistive stack/structure from: (i) a first magnetic region including one or more layers of magnetic material, (ii) a dielectric layer disposed over the first magnetic region, (iii) a second magnetic region including one or more layers of magnetic material, wherein the second magnetic region is disposed over the dielectric layer, the method comprising:
    (a) etching through the second magnetic region to (i) partially form the magnetoresistive stack/structure and provide sidewalls of the second magnetic region and (ii) expose a surface of the dielectric layer in a field region adjacent to the partially formed magnetoresistive stack/structure;
    (b) depositing a first encapsulation layer on or over the sidewalls of the second magnetic region and on the exposed surface of the dielectric layer, wherein the first encapsulation layer is a first material;
    (c) depositing a second encapsulation layer on the first encapsulation layer disposed (i) on or over the sidewalls of the second magnetic region and (ii) on the exposed surface of the dielectric layer, wherein the second encapsulation layer is a second material;
    (d) after step (c), etching the exposed surface of the dielectric layer together with the first encapsulation layer and the second encapsulation layer disposed on or over the exposed surface of the dielectric layer to form a tunnel barrier, wherein, after the etching in step (d), a portion of the first encapsulation layer and a portion of the second encapsulation layer remain on or over the sidewalls of the second magnetic region; and
    (e) after etching through the exposed surface of dielectric layer in step (d), etching the first magnetic region to provide sidewalls thereof.

2. The method of claim 1, wherein the first material is an insulator, and the second material is a conductor.

3. The method of claim 2, wherein depositing a first encapsulation layer includes (i) depositing a metal and (ii) thereafter converting the metal to an insulator.

4. The method of claim 2, wherein the insulator is a silicon nitride.

5. The method of claim 4, wherein the conductor is an aluminum, a magnesium, or alloys thereof.

6. The method of claim 2, wherein the insulator is an aluminum oxide, a silicon oxide, a TEOS or an aluminum nitride.

7. The method of claim 6, wherein the conductor is an aluminum, a magnesium or alloys thereof.

8. The method of claim 1, further including:
    after depositing the second encapsulation layer in step (c) and before the etching in step (d), depositing a third encapsulation layer on the second encapsulation layer disposed over (i) the sidewalls of the second magnetic region and (ii) the exposed surface of the dielectric layer, wherein the third encapsulation layer is a third material,
    and wherein the etching in step (d) includes etching the exposed surface of the dielectric layer together with the first encapsulation layer, the second encapsulation layer, and the third encapsulation layer disposed on or over the exposed surface of the dielectric layer.

9. The method of claim 1, wherein the first encapsulation layer has a thickness less than 35 Angstroms, and the second encapsulation layer has a thickness less than 50 Angstroms.

10. The method of claim 1, wherein the first encapsulation layer has a thickness between 10 and 25 Angstroms, and the second encapsulation layer has a thickness between 10 and 40 Angstroms.

11. A method of manufacturing a magnetoresistive stack/structure from: (i) a first magnetic region including one or more layers of magnetic material, (ii) a dielectric layer disposed over the first magnetic region, (iii) a second magnetic region including one or more layers of magnetic material, wherein the second magnetic region is disposed over the dielectric layer, the method comprising:
    (a) etching the second magnetic region to expose a portion of the dielectric layer and form sidewalls and a top surface of the second magnetic region;
    (b) depositing a first encapsulation material on (i) the sidewalls and top surface of the second magnetic region and (ii) the exposed portion of the dielectric layer;
    (c) after depositing the first encapsulation material in step (b), depositing a second encapsulation material on the first encapsulation material disposed on (i) the sidewalls and top surface of the second magnetic region and (ii) the exposed portion of the dielectric layer;
    (d) etching the first and second encapsulation materials disposed over the exposed portion of the dielectric layer and the exposed portion of the dielectric layer to form a tunnel barrier, wherein, after the etching in step (d), at least a portion of the first and second encapsulation materials remains on or over the sidewalls of the second magnetic region; and (e) after the etching in step (d), etching the first magnetic region to form sidewalls on the first magnetic region.

12. The method of claim 11, wherein the first encapsulation material is an insulator, and the second encapsulation material is a conductor.

13. The method of claim 12, wherein the insulator is a silicon nitride.

14. The method of claim 11, wherein depositing the first encapsulation material in step (b) includes depositing a conductive metal, and the method further includes converting, at least partially, the deposited conductive metal to an insulative material.

15. The method of claim 14, wherein the conductive material is aluminum, magnesium, or alloys thereof.

16. The method of claim 11, wherein depositing the first encapsulation material in step (b) includes depositing a conductive metal, and wherein depositing the second encapsulation material in step (c) includes converting, at least partially, the deposited conductive metal to an insulative material.

17. The method of claim 11, wherein the first encapsulation material has a thickness less than 35 Angstroms, and the second encapsulation material has a thickness less than 50 Angstroms.

18. The method of claim 11, wherein the first encapsulation material has a thickness between 10 and 25 Angstroms, and the second encapsulation material has a thickness between 10 and 40 Angstroms.

19. The method of claim 11 further including, after depositing the second encapsulation material in step (c) and before the etching in step (d), depositing a third encapsulation material on the second encapsulation material disposed over (i) the sidewalls of the second magnetic region and (ii) the exposed surface of the dielectric layer,
wherein the etching in step (d) includes etching the exposed surface of the dielectric layer together with the first, second, and third encapsulation materials disposed on or over the exposed surface of the dielectric layer.

20. The method of claim 19, wherein the third enacapsulation material has a thickness between 10 and 25 Angstroms.

* * * * *